United States Patent [19]
Oi et al.

[11] Patent Number: 5,538,815
[45] Date of Patent: Jul. 23, 1996

[54] METHOD FOR DESIGNING PHASE-SHIFTING MASKS WITH AUTOMATIZATION CAPABILITY

[75] Inventors: Kazuko Oi, Tokyo; Shigehiro Hara, Kanagawa-ken; Kiyomi Koyama, Kanagawa-ken; Koji Hashimoto, Kanagawa-ken; Shinichi Ito; Katsuya Okumura, Kanagawa-ken, all of Japan

[73] Assignee: Kabushiki Kaisha Toshiba, Kawasaki, Japan

[21] Appl. No.: 120,386

[22] Filed: Sep. 14, 1993

[30] Foreign Application Priority Data

| Sep. 14, 1992 | [JP] | Japan | 4-244978 |
| Jun. 29, 1993 | [JP] | Japan | 5-159318 |
| Jun. 30, 1993 | [JP] | Japan | 5-162920 |

[51] Int. Cl.$^6$ ........................................ G03F 9/00
[52] U.S. Cl. ........................................ 430/5; 430/30
[58] Field of Search ........................... 430/5, 30, 394

[56] References Cited

PUBLICATIONS

Modeling Phase Shifting Maska (Andrew.R. Neureuther) BACUS Symposium Paper.
Levenson "What IS a Phase–Shifting Mask?", IBM Research Division, K32/802D.
Hirai et al., "Computer Aided Design for Automatic Phase Shifting Patterns (1)", Ext. Abst. 38th Spring Meeting, of the Japan Society of Applied Physics and Related Societies, 29p–ZC–16, p. 540 (Mar. 1991).
Hirai et al., "Automatic Pattern Generation System for Phase Shifting Mask", (Symposium on VLSI Technology Digest of Technical Papers), pp. 95–96 (May 1991).
Wong et al., "Investigating Phase–Shifting Mask Layout Issues Using a Cad Toolkit", Intl. Electron. Devies Meeting, pp. 705–708 (Dec. 1991).

*Primary Examiner*—S. Rosasco
*Attorney, Agent, or Firm*—Foley & Lardner

[57] ABSTRACT

A method for designing a phase-shifting mask in a manner that a phase shifter of the mask is arranged so that a phase difference between light transmitted through clear areas with the phase shifter and light transmitted through clear areas without the phase shifter is set to 180° or further different combination of phase differences being such as 0°, 90° and 270°. The method includes the steps of: defining a threshold value in a manner that the threshold value falls within a range which is possible to resolve using the phase-shifting masks; measuring a distance between neighboring shapes of the clear area; storing adjacent relationship of the neighboring shapes whose distance is less than the threshold; and automatically placing the phase shifter on one of the neighboring shapes of the clear areas in a manner that mutually neighboring clear area have an opposite phase to each other.

10 Claims, 50 Drawing Sheets

PHASE SHIFTED BY 180°
51
52  53  54  PHASE SHIFTER 55

PHASE-SHIFTING MASK
(LEVENSON TYPE)

```
EXECUTION REPORT
        1992. 2. 21   17 : 30 : 24

TOTAL NUMBER OF GROUPS              10
NO-CONTRADICTION GROUP              7
GROUP NUMBER OF NO-CONTRADICTION    1, 2, 3, 5, 6, 9, 10
CONTRADICTORY GROUP                 3
GROUP NUMBER OF CONTRADICTORY ONES  4, 7, 8
```

| | |
|---|---|
| EXECUTION REPORT | |
| 1992. 2. 21  17 : 30 : 24 | |
| TOTAL NUMBER OF GROUPS | 10 |
| NO-CONTRADICTION GROUP | 7 |
| NO-CONTRADICTION, ARRANGEMENT POSITIVE (NUMBER OF GROUPS) | 3 |
| NO-CONTRADICTION, ARRANGEMENT POSITIVE (NUMBER) | 1, 3, 5 |
| NO-CONTRADICTION, ARRANGEMENT ERROR GROUP NO. | 4 |
| NO-CONTRADICTION, ARRANGEMENT ERROR (NUMBER) | 4, 6, 8, 9 |
| CONTRADICTORY GROUP | 3 |
| GROUP NUMBER OF CONTRADICTORY ONES | 2, 7, 10 |

* CELL WITH SHIFTER-ARRANGE-COMPLETED FLAG

FIG. 27A

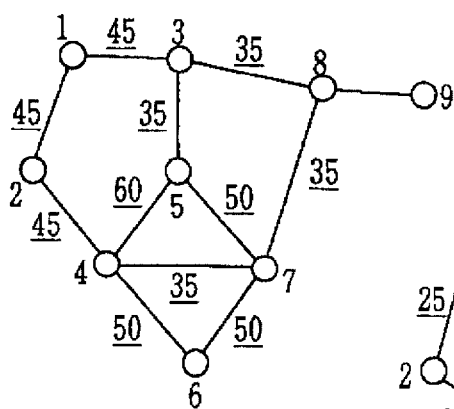

FIG. 27B

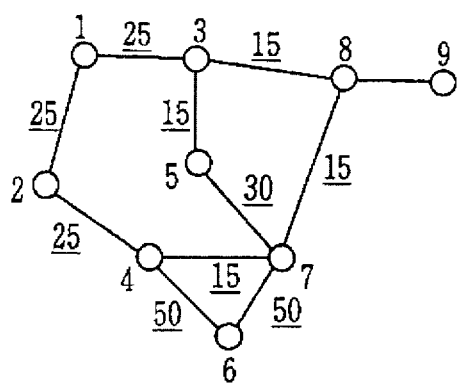

FIG. 28

| CONDITION | LEVEL | WEIGHT |
|---|---|---|
| 1. HOW MANY ARE INCLUDED IN ODD-NUMBERED LOOP | INCLUDEN IN ONE CYCLE | 10 |
| 2. INTER-PATTERN MINIMUM DISTANCE | ~0.25 $\mu$m<br>0.25 $\mu$m ~ 0.3 $\mu$m<br>0.3 $\mu$m ~ 0.35 $\mu$m<br>0.35 $\mu$m ~ 0.4 $\mu$m | 0<br>0　(NOT<br>0　USED)<br>0 |
| 3. LENGTH OF SIDE WHICH IS ADJACENT LESS THAN THRESHOLD (TOTAL) | 0.4 $\mu$m ~<br>0.2 $\mu$m ~ 0.4 $\mu$m<br>0.05 $\mu$m ~ 0.2 $\mu$m<br>~ 0.05 $\mu$m | 5<br>10<br>15<br>20 |
| 4. TOTAL REGION AREA IN A PATTERN LESS THAN THRESHOLD | 0.2 $\mu$m$^2$ ~<br>0.1 $\mu$m$^2$ ~ 0.2 $\mu$m$^2$<br>0.05 $\mu$m$^2$ ~ 0.1 $\mu$m$^2$<br>~ 0.05 $\mu$m$^2$ | 0<br>0　(NOT<br>0　USED)<br>0 |

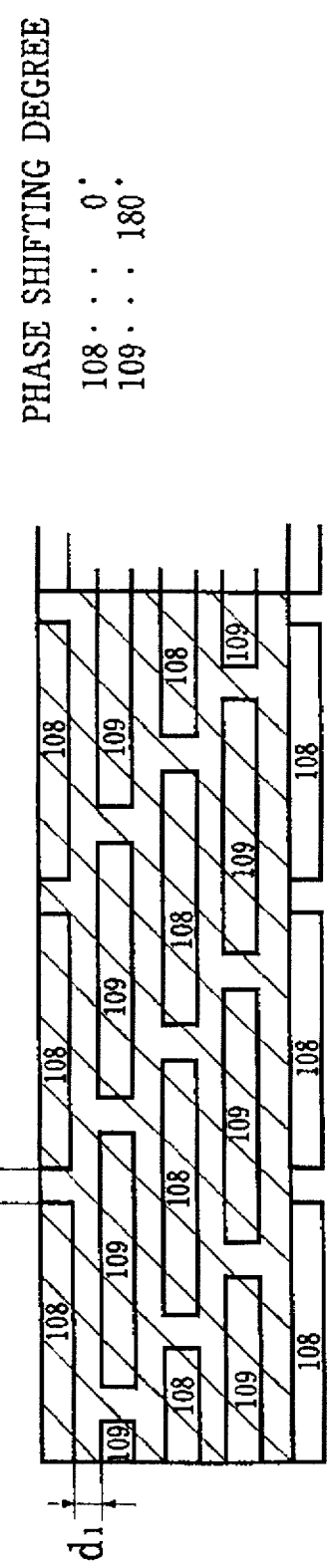
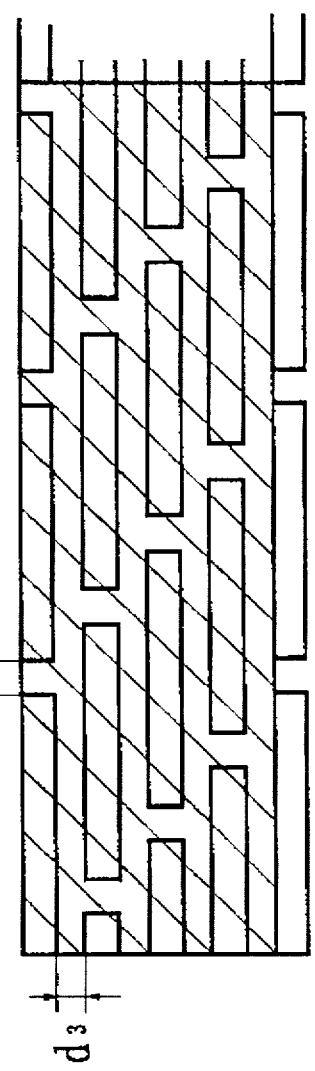
FIG.38A
FIG.38B
PHASE SHIFTING DEGREE
108 · · · · 0°
109 · · · 180°

PHASE SHIFTING DEGREE 0°

0°  180°  0°  180°

PHASE SHIFTING DEGREE 0°

120°  240°  120°  240°

PHASE SHIFTING DEGREE 90°

0°  180°  0°  180°

UNIT A UNIT B

ULTRAVIOLET RADIATION

MASK

PHASE SHIFTERS   THICKNESS = $\dfrac{\lambda}{2(n_c - 1)}$

PHASE-SHIFT MASK
(LEVENSON TYPE)

METHOD FOR DESIGNING PHASE-SHIFTING MASKS WITH AUTOMATIZATION CAPABILITY

BACKGROUND OF THE INVENTION

1. Technical Field

The present Invention relates to an apparatus and method for designing a photomask for use with production of a semiconductor device, and it particular relates to the apparatus and method for designing a phase-shifting masks to improve the resolution of microlithography for a miniaturized pattern for semiconductor device production.

2. Background Art

A photomask on which an original mask pattern of a VLSI is drawn is irradiated by an incident ray which is partially coherent. For convenience, tile photomask will be simply referred to as a mask hereinafter. Then, the pattern on the mask is transcribed on to a semiconductor wafer so as to execute photo lithography. For a projection lithography system realizing the photo lithography, there is required a further miniaturized pattern to be copied on to the wafer.

How much miniaturized the pattern can be fabricated is expressed by a degree of resolution therefor. The resolution is evaluated by how accurately two adjacent portions constituted by light and shade portions on a semiconductor substrate can be separated by utilizing, say, a mask pattern whose light and shade are periodically changed. In order to improve the resolution, there is known a method where a phase difference is given to the incident ray which passes a pair of adjacent clear regions on the mask.

As for the method where the phase difference is given to the incident ray which passes a pair of adjacent clear regions on the mask, such a method is conventionally known and discussed in a paper entitled "Improving Resolution in Photolithography with a Phase-Shifting Mask" written by Mark D. Levenson et al. (IEEE Transaction Electron Devices, Vol ED-29 No. 12, 1982, page 1828).

FIG. 1 shows a Levenson type phase shift mask suggested by the above paper. In the same figure, on mask substrate 1 there are formed a plurality of light-shielding portions (opaque regions) 2 serving as the original images for tile pattern and clear region 1, and there is provided phase shifter 3 which supplies a phase difference to the incident ray passing through the clear region; phase shifter is made of transparent material. Phase shifter 3 is arranged to be disposed on either side of a pair of the adjacent clear regions. The phase shifter 3 may be simply referred to as a shifter hereinafter.

The shifter need satisfy a condition of $$d=\lambda/\{2(n-1)\},$$

where d is a film thickness, n an index of refraction and $\lambda$ a wavelength of the incident ray. The ray which passes through the shifter differs from other transmission rays that didn't pass through the shifter, so that the light intensity of the ray in a pattern boundary on the semiconductor substrate becomes zero. As a result thereof, adjacent bright regions are separated, thus improving the resolution therefor.

In connection with the paper discussing the Levenson type phase shifting mask and an automatic designing apparatus therefor, there is a paper entitled "Automatic Pattern Generation System for Phase Shifting Mask" authored by Noboru Nomura et al. (Symposium on VLSI Technology, JSAP CAT No.AP911210, pp. 95–96, Oiso, Japan, May 1991). In the paper written by Nomura et al, there is discussed an automatic designing apparatus for a Levenson-type phase shifting mask. In Nomura et al's method, the shifters are automatically arranged in a unit of a cell constituted by a plurality of opaque and clear regions, as shown in FIG. 1, then, when a portion in which it is impossible to arrange the phase shifter properly is found a system of Nomura gives a warning and aborts.

Moreover, when there is no place where the shifter arrangement is impossible, the verification is done to determine whether or not the arrangement is correct in the vicinity of the boundary for each cell after the shifter arrangement is completed within the cell. If an error is found in the shifter arrangement in the vicinity of the boundary for the adjacent cells, the shifter in all clear regions belonging to one of the pair of cells is reversed.

Besides the above two papers, there is another paper entitled "Investigating Phase-shifting Mask Layout Issues Using a CAD Toolkit" written by Andrew R. Neureuther et al. (IEDM Technical Digest, pp 705–708, 1991). This paper discusses an automatic designing system where a circuit designer determines a shrink factor for a given design pattern, the shifter is automatically assigned against the shrink pattern, and, if there is a portion where the shifter assignment conflicts, such portion is notified.

However, in any of the known automatic designing systems, an automatic verification function for the masks In which the shifter arrangement therefor is already entirely completed is not provided. Thereby, in the case where the shifter arrangement is performed by hand, the shifter arrangement can not be determined whether it is correct or not.

Moreover, automatic verification and automatic assigning functions against a partially arranged mask are not provided. Referring to FIG. 2, when considering to automatically assign the shifter for the mask where there are formed the hatched clear regions lingering between two neighboring regions 18, 19, an inconvenience illustrated below is caused.

Namely, referring to FIG. 2, suppose that, first, the shifter is assigned to the region 18. The phase of the clear region which extends to region 19 is determined. Then, when the automatic shifter arrangement is invoked for region 19, there is already a clear region where the shifter arrangement is partially completed. In that case, ideally speaking, it is necessary to verify automatically the shifter arrangement for the region where the shifter arrangement is completed, and to assign automatically the shifter for the region where the shifter arrangement is not yet performed.

Moreover, the above-mentioned automatic verification and automatic arrangement are also necessary for a case where there is a spot in which the circuit designer wishes to arrange a shifter with a priority therefor, and after the shifter is manually assigned to the spot, the rest of the clear region shall be automatically shifter-assigned.

Accordingly, in the conventional technique, where the shifter is assigned to one of a pair of neighboring clear regions, is improved the resolution according to a principle of the Levenson-type phase shifting mask. However, in this technique, how closely the clear regions on the mask are situated is not verified, so that the shifter is assigned regardless of the distance between the clear regions. Thereby, there causes a drawback where the shifter is assigned to the clear regions in which the phase difference need not be given.

Moreover, since the conventional automatic designing system is not equipped with the automatic verification capability, there is caused a problem where whether or not the arrangement is correct can not be verified against the mask in which the shifter therefor is already assigned. Moreover, in the case where there exists a spot in which the shifter arrangement is impossible, the warning is given so as to abort the system or such an impossible spot is indicated; however, any information regarding how to correct such a deficiency is not indicated in the conventional methods.

Moreover, in the conventional technique represented by Andrew R. Neureuther et al, when a layout data containing hierarchical layers is input, a method where the shifter Is arranged while maintaining the hierarchy is not considered. Therefore, in order to arrange the shifter and verify the arrangement, such the arrangement and the verification therefor are executed only after hierarchy is developed. Thus, the layout data is increased based on an increase in the recursions of the pattern, so that there is caused a problem where a memory therefor overflows or data processing time is undesirably increased.

Moreover, in the conventional technique well represented by Noboru Nomura et al, though there is equipped a function for automatically verifying an intercell phase, it is not at all clear that the shifter arrangement shall be initialized from which particular cell in case there exist a plurality of cells constituting the hierarchy. With reference to FIG. 3, cell A is composed of lower cell B and lower cell C. If a layout for cell B is modified after cell A is shifter-assigned, and the shifter arrangement is executed upon cell A again, the shifter arrangements are executed anew against cells A, B and C since in the conventional technique there is not provided memory means by which cell C is already shifter-assigned. Accordingly, the conventional technique is very inefficient.

In the Noboru Nomura et al's conventional technique, a dynamic random access memory (DRAM) is designed by utilizing the automatic Levenson type phase-shifting mask designing apparatus. In the event the phase of the light passing through a pattern is automatically determined, first of all, an arbitrary pattern is set to be at 0°—shifted (normal transmission). After such an initialization, the original pattern whose phase has not yet been attributed is determined by the phase of a neighboring pattern in a manner that the neighboring pattern is chosen so that its side length facing the original patterns is longer than any other neighboring patterns whose phase have already been determined. Thereafter, the phase of the original pattern is set to be opposite to that of the neighboring pattern then chosen. When plural neighboring patterns with different phases share an identical facing side length, the apparatus aborts and gives warning.

In the above Nomura's technique, a peripheral area for certain patterns is not defined as which particular area is designated, so that a shifter assignment therefor may result in being impossible in spite of the fact that a layout therefor presents possible for the shifter assignment, after all. For example, suppose that there is given a layout data shown in FIG. 4A, where distance r1 is such that the phase of transmitting light is of opposite phase and a resolution therefor is possible, whereas the phase is identical and the resolution therefore is impossible. Suppose that distance r2 is such that the resolution is possible regardless of the phase being identical or opposite. Consider the execution of the shifter arrangement under such a condition, since there is given no particular instruction as to which particular order the phase of patterns is to be determined, patters X, Y, Z are determined the phase therefor in this order. A phase of X is determined, so that the phase of Y can be opposite to that of X determined, however, since side lengths of X facing both X and Y are equal and, worst, X and Y are opposite in phase to each other, an appropriate phase can not be given to Z. Notwithstanding, it is possible to practically determine such a phase as shown in FIG. 4B.

Furthermore, according to Japan Patent Laid Open No. 62-50811 (referred to as document S62 hereinafter), a phase shifter is provided in at least one of neighboring opening portions on the photomask, so that the phase difference is given to illuminating light passing through the two opening portions. Referring to FIGS. 5A through 5D, there is described how the resolution is improved by utilizing the above technique. Opening portion 54 has phase shifter 55 which gives a phase shift by 180°. An at-least partially coherent light that passed through opening portion 53 and opening portion 54, causes an Interference on the wafer where the phase difference therebetween is 180°, as shown in FIG. 5C. On the other hand, absolute values of amplitudes, at an intermediate position of opening patterns on the wafer, for the light that transmitted through opening portion 53 and opening portion 54 are identical to each other. Therefore, intensity of synthesized light becomes 0 at the intermediate position of the opening portion on the wafer. For the reason set forth above, the resolution is improved in the middle portion of pattern.

In document S62, there is described an embodiment illustrated in FIG. 6. The mask has two-dimensional patterns in which there are three neighboring openings, and the phase-shifting member is not provided to the first opening 61, whereas the phase-shifting members are given to the second opening 62 at 90° and the third opening 63 at 180°, so as to hopefully improve the resolution of the entire pattern. In this case, there are utilized 0°, 90° and 180° as phase-shifting degrees.

Besides document S62, in Japan Patent Laid Open No. 4-221954 (referred to as document H4 hereinafter), there is also shown another example dealing with the three neighboring openings. In document H4, referring to FIG. 7, the shifter member is not provided in opening 71 (0°), while the shifter members are provided to the second opening 72 at 120° and the third opening 73 at 240°. Document H4 discusses a method where the phase difference between arbitrary two openings are set to 120°.

Referring again to FIGS. 5A–5D, the Levenson type phase-shifting method is very effective for a simple repetition such as one for line and space. However, in a case where there exists a spot of more than three neighboring opening patterns in a mask having a general two-dimensional pattern, there may be generated a spot where the phases of the light passing through the neighboring portions are identical, so that the resolution performance thereof is approximately same with the conventional lithography technique which does not employ the phase shifters. Hereinafter, the opening region is called a contradictory spot where the phases become identical no matter how the shifter is arranged in the Levenson-type phase-shifting method.

In order to obtain as great a shrink factor as possible, the number of contradictory spots must be minimized. In other words, when the Levenson-type phase-shifting method is applied to electronic devices such as a DRAM, the method is effective to a portion that requires many simply repeated patterns such as a cell array portion; however, in a portion having a sense amplifier or the like which are extended peripherally from the cell array portion, many complicated patterns are arranged. When the Levenson-type phase-shifting method is adopted to the complicated patterns, the patterns need be rewritten in a manner to minimize a portion exhibiting the identical phase, thus creating a very difficult task to perform. These restraints in the course of circuit designing become a serious burden in adopting the Levenson-type phase-shifting method to the electronic devices.

As described in document S62 (see FIG. 6) and document H4 (see FIG. 7), the resolution of the opening patterns that are mutually adjacent to each other are improved by utilizing three different phases; the resolution for transcription patterns are improved in a partial region or an entire region of the wafer including the mutually neighboring three opening portions as the transcription patterns. It is noted here that the Levenson-type phase-shifting mask is best in terms of resolution power where the phase difference is 180°. Now, none of the above documents discuss about a particular method by which the shrink factor for an entire exposure mask is increased in the course of assigning phase shifters of more than three different phases in view of the above-mentioned fact that the Levenson-type phase-shifting mask is best in terms of resolution power with the phase difference being 180°. In particular, in an embodiment shown in document S62, phases assigned are 0°, 180° and 90° in the case where three openings are mutually adjacent. There is not described any particular design rule as to how to assign such phase shifters to each opening, in document S62. Moreover, document S62 does not discuss on a definite phase-shifter assigning method which can cope with the case shown in FIG. 7.

SUMMARY OF THE INVENTION

In view of the foregoing drawbacks, it is therefore an object of tile present invention to provide a method for arranging a phase shifter optimally in view of the distance between the neighboring clear areas (alternatively, referred to as patterns).

Another object of tile present invention is to provide a method for realizing a greater degree of freedom in designing the mask and for producing a high-resolution phase-shifting mask and an apparatus for incorporating such a method.

Another object of the present invention is to provide a phase-shifting mask in which the light intensity for a ray transmitted through a substrate opening portion and the light intensity of ray transmitted through a phase shifter are close to each other and by which resolution patterns at the openings for a phase shifter portion and a clear substrate are uniformly made.

According to one aspect of the present invention, there is provided a method for designing a phase-shifting mask in a manner that a phase shifter of the mask is arranged so that a phase difference is set to 180°, comprising the steps of: defining a threshold value in a manner that the threshold value falls within a range which is possible to resolve using the phase-shifting masks; measuring a distance between neighboring shapes of the clear area; storing adjacent relationship of the neighboring shapes whose distance is less than the threshold; and automatically placing the phase shifter on one of the neighboring shapes of the clear area in a manner that mutually neighboring clear areas have an opposite phase to each other, wherein the automatically placing step includes the step of tracing the stored adjacent relationship.

According to another aspect of tile present invention, there is provided a method for designing a phase-shifting mask from design data, comprising the steps of: measuring a shortest distance between shapes of the clear areas, in the design data; defining a pair of the shapes to be adjacent when the shortest distance therebetween is less than a predetermined threshold, and then storing the defined shapes; classifying all shapes of the clear areas into groups in accordance with the above adjacent relationship; expressing the adjacent relationship in the form of a simplified line-segment-and-node graph and observing whether or not there exists an odd-numbered loop therein; and arranging the phase shifters, by utilizing phase difference of 0°, and 180° and an integral multiple of 360°/m (where m is a positive integer starting from three onward), in a manner to satisfy the following conditions: a first condition where the phase differs in between a pair of given shapes neighboring at a distance less than the threshold, and a second condition where minimum becomes a total sum of length of shape sides facing at the distance less than the threshold and at a phase difference therebetween being other than 180°.

According to another aspect of the present invention, there is provided a method for designing a phase-shifting mask, comprising the steps of: arranging the phase shifter so that a phase difference between neighboring clear areas is set to approximately 180°; setting to approximately 180° a relative phase of opening areas enclosed by a pair of the clear areas defined in the above step, when the opening areas enclosed by the pair of clear areas is parallel to the pair of clear areas, and the number of opening areas enclosed by the pair of clear areas are even numbered in a cross sectional area vertical to the pair of clear areas; setting to approximately 180° the relative phase between the pair of opening areas and the enclosed opening portion; assigning approximately 180° for the enclosed opening areas when the number thereof is odd numbered; and setting to approximately 180° or approximately 90° the relative phase between the pair of clear areas and the enclosed opening area after completing the previous steps.

According to another aspect of the present invention, there is provided a method where a relative phase therebetween includes a set of clear areas having phases assigned for 0°, 90°, 180° and 270°, comprising the steps of: extracting a first set of clear area where a decimal part lies between 0.44 and 0.55 after the relative phase is divided by 180°, so as to be given the relative phase of 90 °; and extracting a second set of clear area where the decimal part is less than 0.94 after the relative phase is divided by 180°, so as to be given the relative phase of 180°.

According to still another aspect of the present invention, there is provided a phase shifting mask automatically attributed to a clear area, wherein a threshold value, in the course of determining to have the phase shifting mask, is defined to eliminate to unnecessarily place a phase shifter in the mask, and wherein the phase shifter is placed on one of mutually neighboring clear area whose inter-distance therebetween is less than the threshold, so that the mutually neighboring clear area have an opposite phase to each other.

According to still another aspect of the present invention, there is provided the phase shifting mask, wherein a film whose constituting material and production therefor are identical to those for a phase shifter, is uniformly formed on to a region including a substrate portion and a phase shifter portion, in that thickness for said film for buffer is expressed by:

$$(\lambda/4n_s) \cdot \{m - n_s/(n_s - 1)\},$$

where $n_s$ is the index of refraction of the phase shifter, X an exposure wavelength and m an integer.

Other features and advantages of the present invention will become apparent from the following description taken in conjunction with the accompanying drawings.

BRIEF DESCRIPTION OF THE DRAWINGS

FIG. 27A is a graph showing the neighboring relationship based on the layout data shown in FIG. 26.

FIG. 27B is another graph of the relationship with weighting is re-arranged after excluding the line segment 4 –5 in FIG. 27A.

FIG. 28 is a table showing how the weighting is placed on each condition.

FIGS. 35A, 35B and 35C show light intensity distribution.

FIG. 38A shows the Levenson-type phase-shifting arrangement.

FIG. 38B is an exemplary arrangement which represents a usual lithography technique without using the phase-shifting method.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Embodiment No. 1

Figure 1:
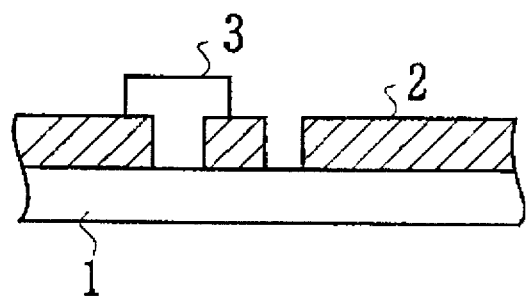
FIG. 1 shows the conventional Levenson type phase shift mask.
Figure 2:
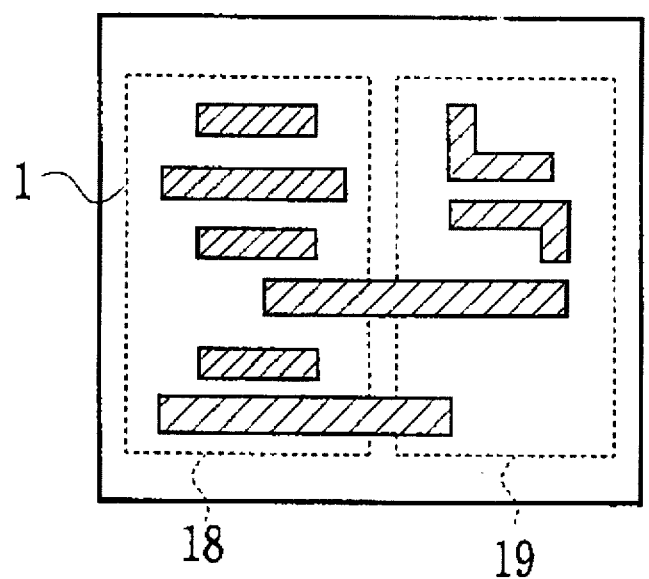
FIG. 2 shows an example of plan view for the masks where there are formed clear regions (hatched portions) lingering between two neighboring regions 18, 19.
Figure 3:
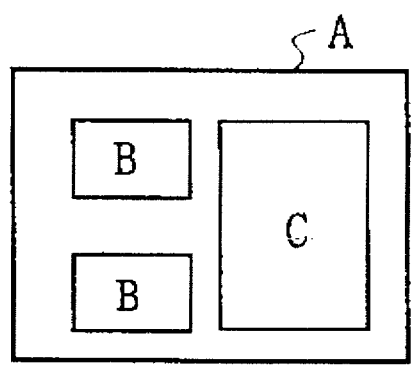
FIG. 3 shows that cell A is composed of lower cell B and lower cell C.
Figure 4A:
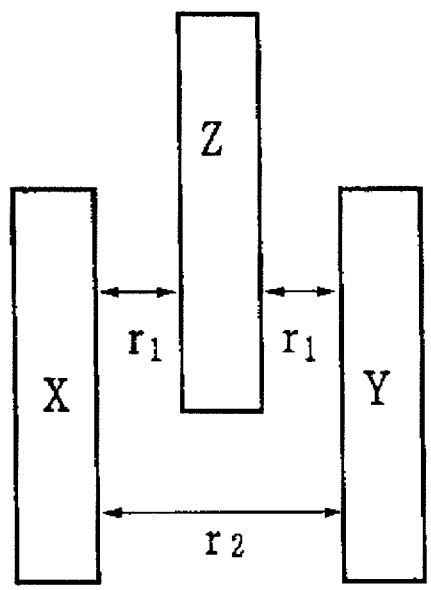
FIGS. 4A and 4B show patterns to explain the conventional practice.
Figure 4B:
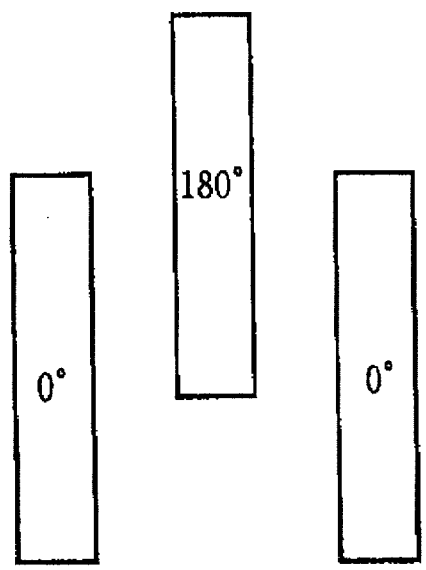
Figure 5A:
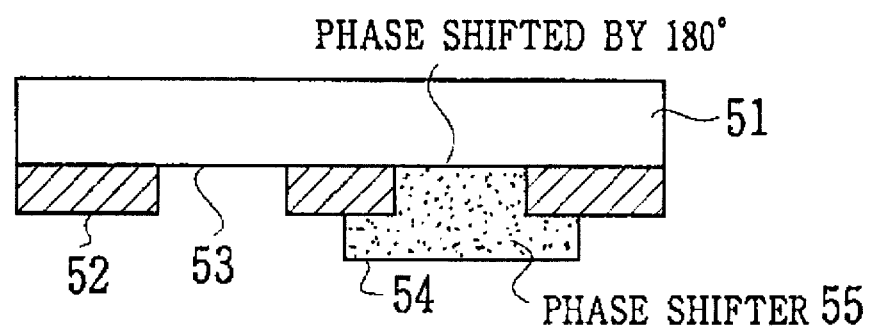
FIGS. 5A through 5D illustrate the principle of the Levenson-type phase-shifting mask.
Figure 5B:
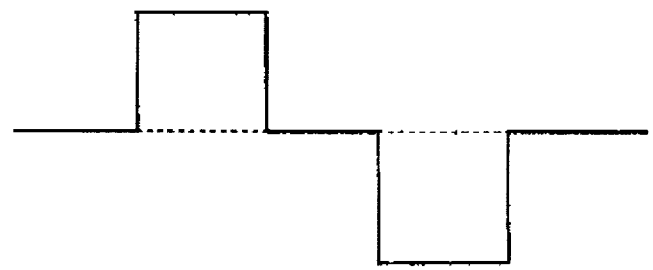
Figure 5C:
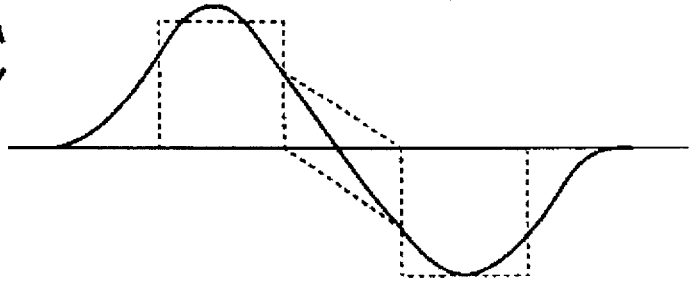
Figure 5D:
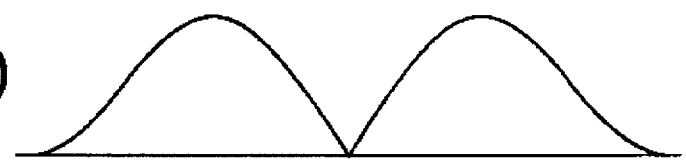
Figure 6:
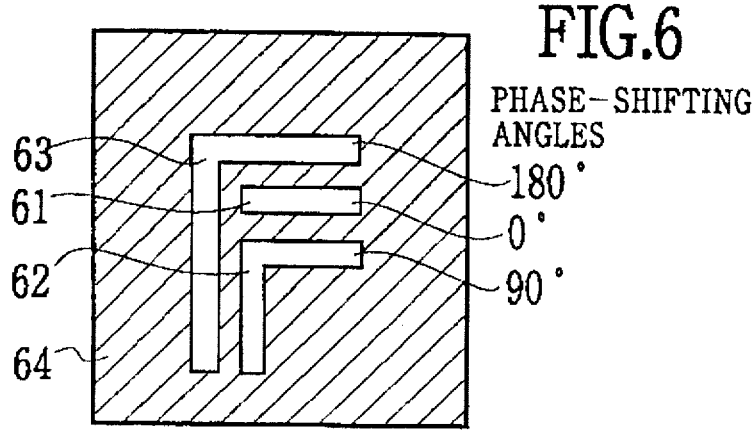
FIG. 6 shows a phase-shifting example described in document S62.
Figure 7:
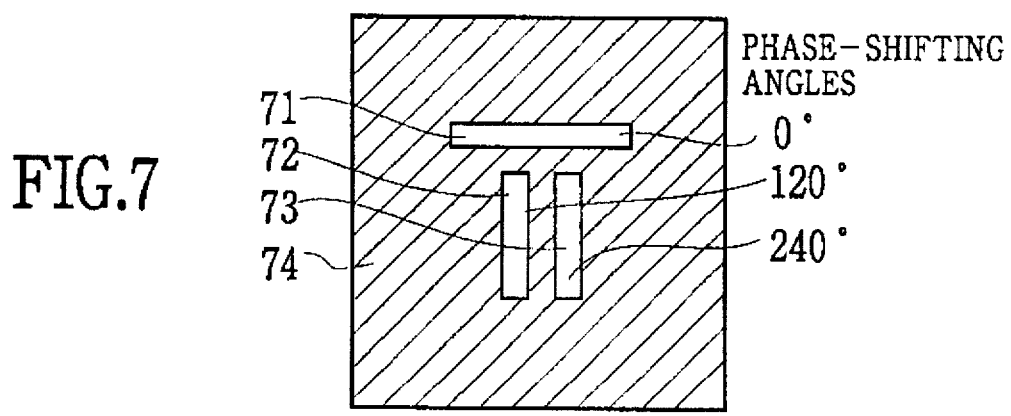
FIG. 7 shows another phase-shifting example described in document H4.
Figure 8:
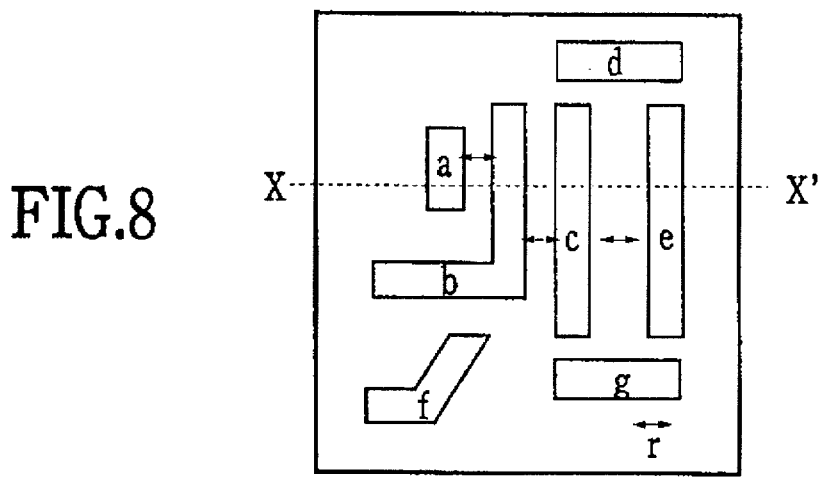
FIG. 8 illustrates masks where clear areas a through g of various shapes and sizes are mixedly existent on the substrate 1.
Figure 9:
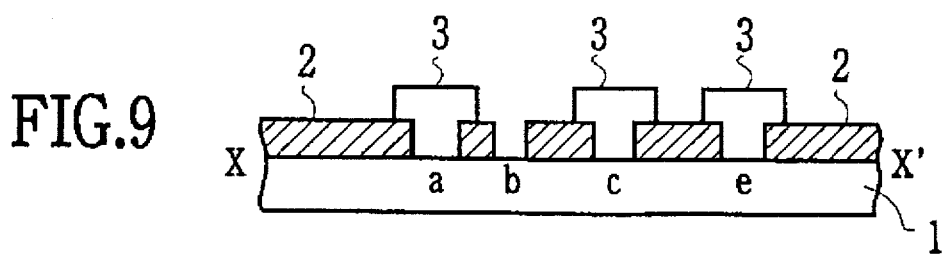
FIG. 9 shows a cross section of the mask in which the shifters are so arranged, taken along with line X—X' of FIG. 8.
Figure 10:
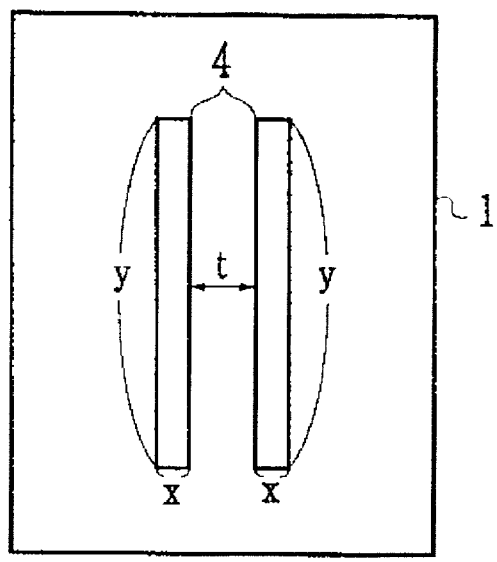
FIG. 10 shows a mask configuration for obtaining threshold according to the present invention.

With reference to FIGS. 8 through 10, the first embodiment for the present invention will be described in detail.

FIG. 8 illustrates masks where clear areas a through G of various shapes and sizes are mixedly existent on substrate 1. Character (r) is defined to be a threshold value. Let us list up possible combinations in which a minimum distance between clear areas is less than threshold r. The possible combination is a-b, b-f, c-d, d-e, e-g and g-c. In such spots mentioned above, a phase shifter is assigned to one of a pair of the clear areas, so that resolution therefor is improved. Thus, the phase shifter that generates a phase difference to a partially coherent incident ray passing through a pair of clear areas, is assigned to one of the pair of clear areas. For example, suppose that shifters are arranged to clear areas designated by a, b, c and e.

FIG. 9 shows a cross section of the mask in which the shifters are so arranged, taken along with line X—X' of FIG. 8. In the same figure, shifter 3 is attributed in clear areas a, c and e.

Threshold r may be arbitrarily set based on experience of a circuit designer or based on a lithographic simulation. However, threshold r is preferably obtained in the following manner.

FIG. 10 shows a mask configuration for obtaining threshold r. In the same figure, x indicates a width of clear area 4 and y a length of clear area 4. Suppose that threshold value is considered only in the direction of x, x is regarded to be less than y (x<<y). Let the distance between two clear areas be denoted by t. Using a fixed x, the two clear areas 4, 4 are made close gradually, then measure $t_{min}$ which is a limited boundary value to the extent that neighboring bright portions on the substrate are separable. Change x so as to measure and obtain several values of $t_{min}$. Among the several measured values of $t_{min}$, select the greatest value or slightly greater value thereof, so as to be threshold r.

In the first embodiment, in the event the mask using the shifters are designed, threshold r is optimally utilized. Then, when the shortest distance between clear areas is less than threshold r, a shifter is to be placed on one of the clear areas on the mask where there mixedly exist clear areas of various shapes and sizes. Thereby, further higher resolution masks can be obtained by sufficiently utilizing a resolution improving effect due to the Levenson-type phase shifting mask.

Moreover, by employing the first embodiment, a circuit designer is given advanced degree of freedom as to whether or not the shifter shall be arranged to the mutually neighboring clear areas having more than threshold value r, thus improving design efficiency of the photomask using the phase shifters.

Embodiment No. 2

With reference to FIGS. 11 through 18, the second embodiment for the present invention will be described in detail.

Figure 11:
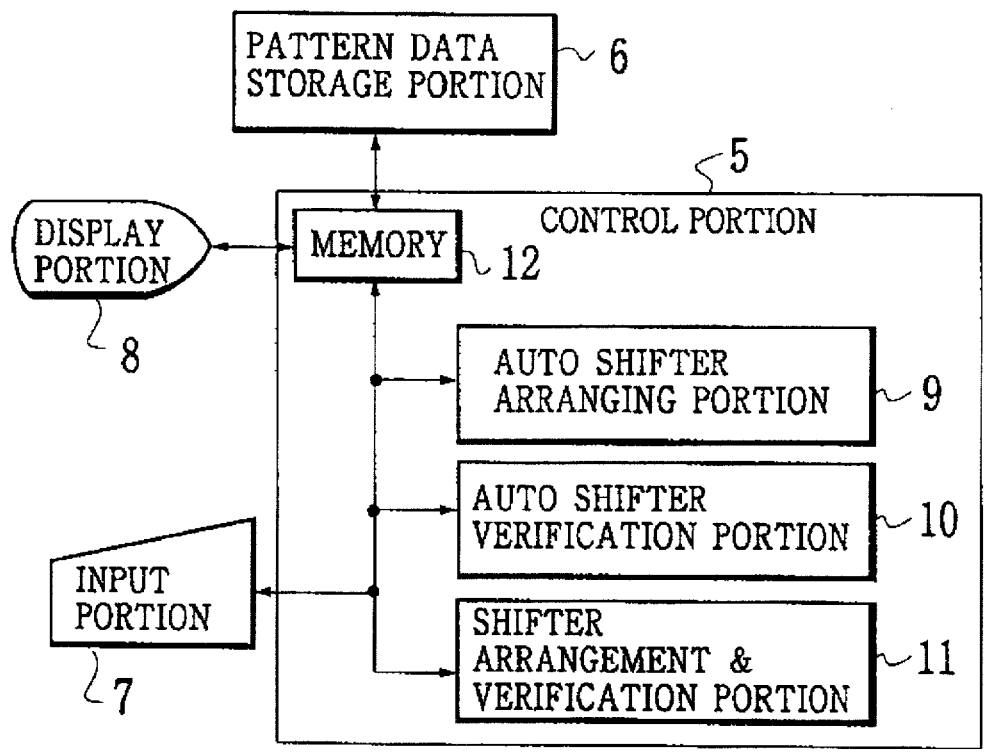
FIG. 11 is a block diagram showing a configuration for a phase-shifting design system according to the second embodiment.

FIG. 11 is a block diagram showing a configuration for a phase-shifting design system according to the second embodiment.

In the same figure, the phase-shifting design system comprises mainly of control portion 5, pattern data storage portion 6, input portion 7 and display portion 8. Control portion 5 is comprised of automatic shifter arranging portion 9, automatic shifter verification portion 10, shifter arrangement & verification portion 11 and memory 12.

Input portion 7 represents an input apparatus such as a keyboard and a mouse. Input portion 7 selects a function among automatic shifter arranging portion 9, automatic shifter verification portion 10 and shifter arrangement & verification portion 11, so as to specify execution of the selected function.

Control portion 5 is composed of a microprocessor, and it processes data in accordance with a control program written in memory 12. Respective processing portions 9 through 11 take in pattern data as input which is sought to be processed, from memory 12 or pattern data storage portion 6.

Input data is processed by respective processing portions 9 through 11. Then, a result thereof is displayed on display portion 8 such as CRT (cathode ray tube).

The phase-shifting mask design system is constructed accordingly. Next, with reference to FIG. 12, there is shown a flowchart for the function of control portion 5 in the event automatic shifter arranging portion is selected. Data to be processed is input from memory 12 or pattern data storage portion 6, then the data is classified to a group of the clear areas which are neighboring at a distance less than the threshold r (STEP 101, STEP 102). Now, though threshold r may be arbitrarily determined by the circuit designer, threshold r can also be obtained in the similar manner described in the first embodiment. Though relative phases within a group may be predeterminedly set, the relative phases between the groups can be freely determined. As described in the first embodiment, the shifter is automatically put on one of a pair of neighboring clear areas where the shortest distance therebetween is less than r (STEP 103).

Figures 12, 13:
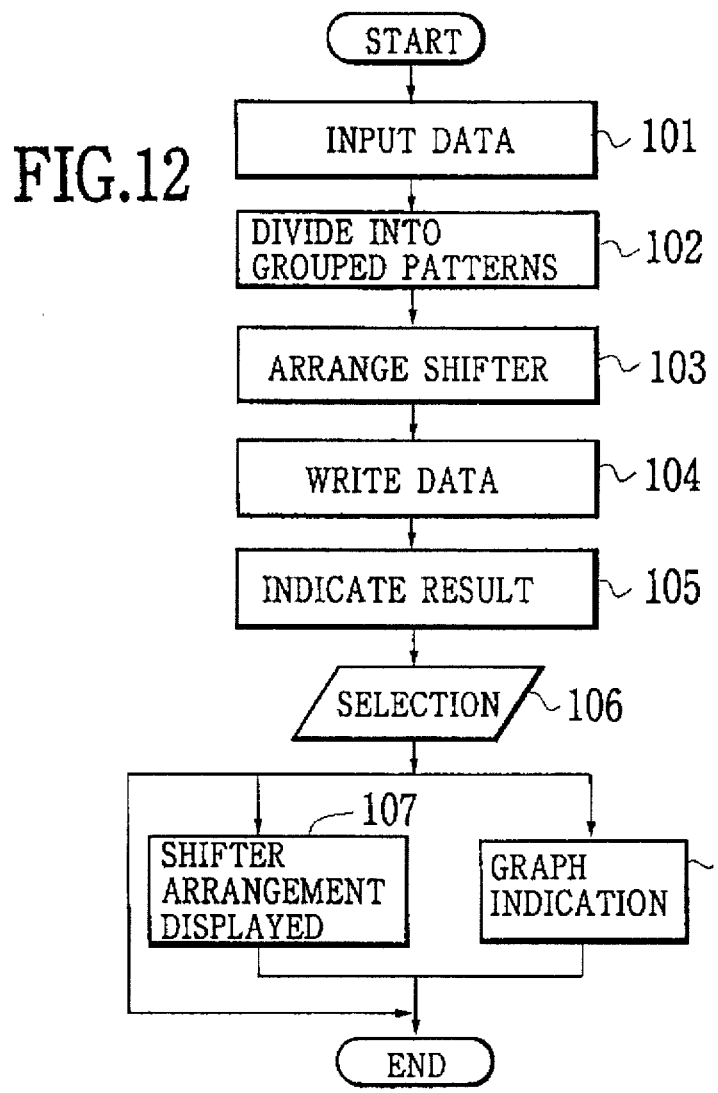
FIG. 12 shows a flowchart for the function of control portion 5 in the event automatic shifter arranging portion is selected.
FIG. 13 shows a displaying example of the execution report.

Thereafter, information on the shifter arrangement and the group is written to memory 12 or pattern data storage portion 6 (STEP 104). A processing result thereof is indicated in the form of execution report (STEP 10S). FIG 13 shows a displaying example of the execution report.

The contents of the execution report includes: the total number of groups existing within a region to be automatically shifter-arranged, the number of group and the group number thereof where the shifter arrangement is possible, and the number of group and the group number thereof where the shifter arrangement is impossible.

Figure 14:
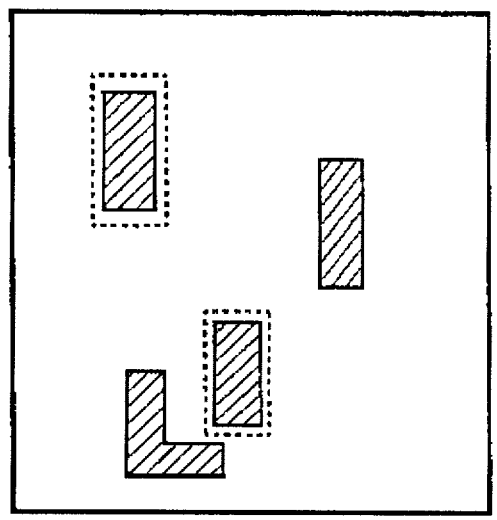
FIG. 14 shows clear regions (hatched) and shifter (broken lines) therein.

Moreover, a shifter-arrangement indication or a graph display is selected, so that a further detailed information is displayed (STEP 106–108). When the shifter assignment indication is selected, the shifter assignment for the group in which the shifter assignment is possible is displayed. Referring to FIG. 14, there are shown clear regions (hatched) and shifter (broken lines) therein.

Figure 15:
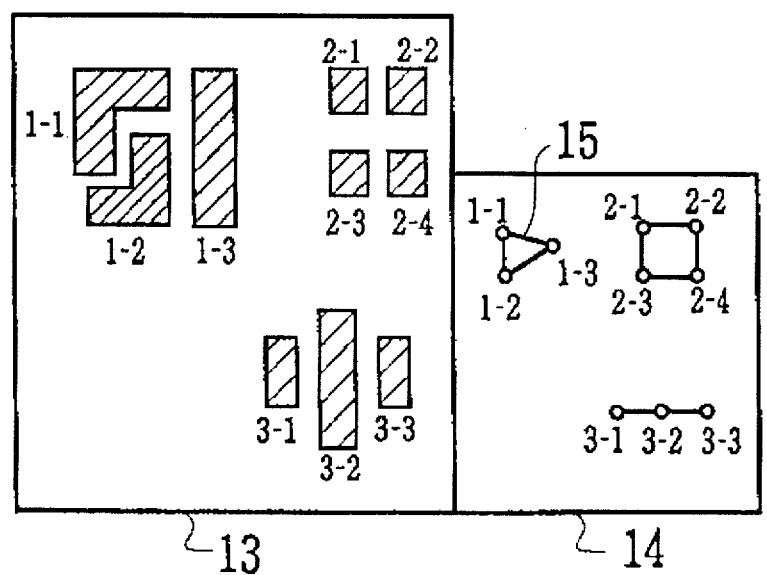
FIG. 15 shows a display example when tile graph display is selected.

FIG. 15 shows a display example when the graph display is selected. In the same figure, a new window 14 is opened in the vicinity of a currently open window 13, so that display is a graph expressing the pattern arrangement in the region in which the shifter is to be automatically attributed. In the graph in window 14, a tiny circle therein indicates a positional relationship of each pattern shown in window 13. The solid lines connecting the tiny circles indicate that the shortest distance between the neighboring clear areas corresponding to the circles are less than threshold r.

In order that the clear areas (hatched portion) of window 13 and the tiny circles in window 14 are well interactively related to each other, the group number to which the clear area belongs and the verification number thereof, are displayed next to both the clear areas and the tiny circles. It shall be appreciated that each circle and the solid line connecting thereto may be displayed with a different color designated to each classified group in window 14, thus facilitating to distinguish each group.

Moreover, a spot where the shifter arrangement is impossible, corresponds to a close loop constituted by odd numbered circles. Thus, on window 14 it is convenient to highlight the loop such as loop 15 constituted by oddnumbered circles, so that it becomes easy to find the spot where the shifter arrangement is impossible in the group.

Figure 16:
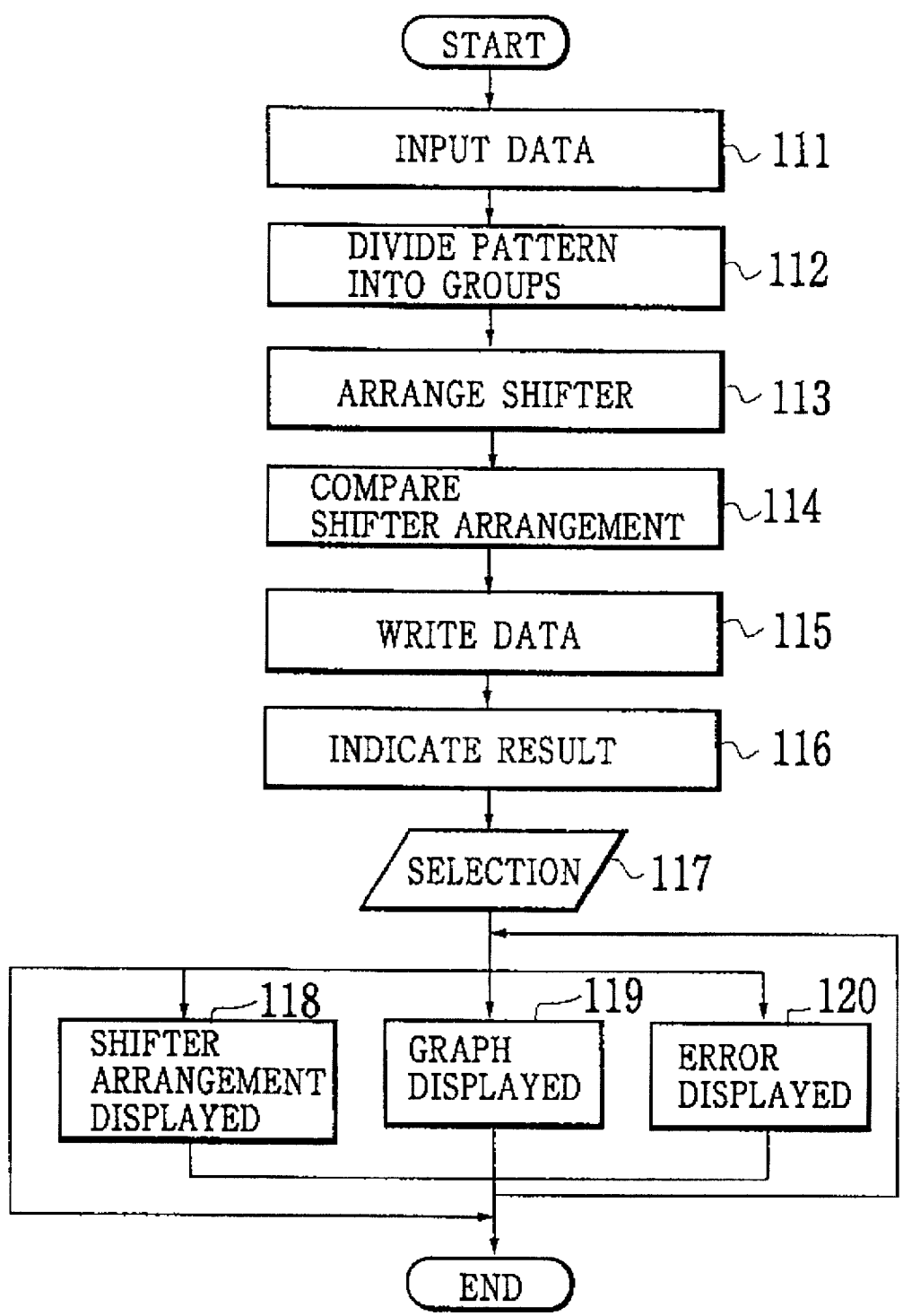
FIG. 16 is a flowchart to show the controlling operation for control portion 5 when the shifter arrangement & verification portion 11 is selected.

Next, when the shifter arrangement & verification portion 11 is selected, the controlling operation for control portion 5 will be described using a flowchart of FIG. 16.

Data to be processed is input from memory 12 or pattern data storage portion 6 and is classified into group (STEP 111, STEP 112). The shifter is temporarily assigned to one of a pair of neighboring areas where the shortest distance between the clear areas is less than threshold r (STEP 113). The assignment-already-completed shifter arrangement and the temporary shifter arrangement are compared (STEP 114).

Figures 17, 18:
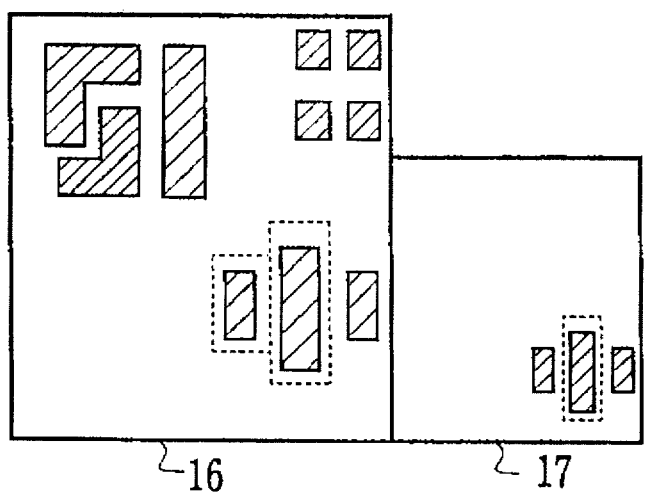
FIG. 17 shows an exemplary execution report display.
FIG. 18 is a display example with the error display being selected, according to the second embodiment.

Thereafter, information on the shifter arrangement and the group is written to memory 12 or pattern data storage portion 6 (STEP 115). A verified result thereof is displayed in the form of the execution report (STEP 116). FIG. 17 shows an exemplary execution report display.

The contents of the execution report include: the total number of groups existent in the region where the shifter arrangement is verified, the number of group and the group number thereof in which the shifter arrangement is possible, the number of group and the group number thereof in which the shifter arrangement is impossible and the arrangement therefor can not be done for real, and the number of group and the group number thereof in which the arrangements is possible but an error is found for the the arrangement of the shifter that is already completed.

Further, one or a combination of shifter arrangement display, a graph display or an error display may be selected so that further detailed information can be displayed (STEP 117–STEP 120). When the shifter arrangement display is selected, there is displayed a S shifter arrangement which is assigned by the group in which the shifter arrangement is possible. An exemplary display therefor is a similar one shown in FIG. 14. An exemplary display with the graph display being selected is also a similar one shown in FIG. 15.

A display example with the error display being selected is shown in FIG. 18. A newly added window 17 is opened right next to a currently open window 16. In window 17, displayed is the very group of the clear area (hatched portion in FIG. 18) and the correct temporary arrangement (dotted lines In FIG. 18) where shifter arrangement that is already completed is found erroneous. By comparing window 16 to window 17, the spot where the shifter arrangement Is erroneous can be examined.

Embodiment No. 3

With reference to FIGS. 19 through 24, the third embodiment for the present invention will be described in detail.

Figure 19:
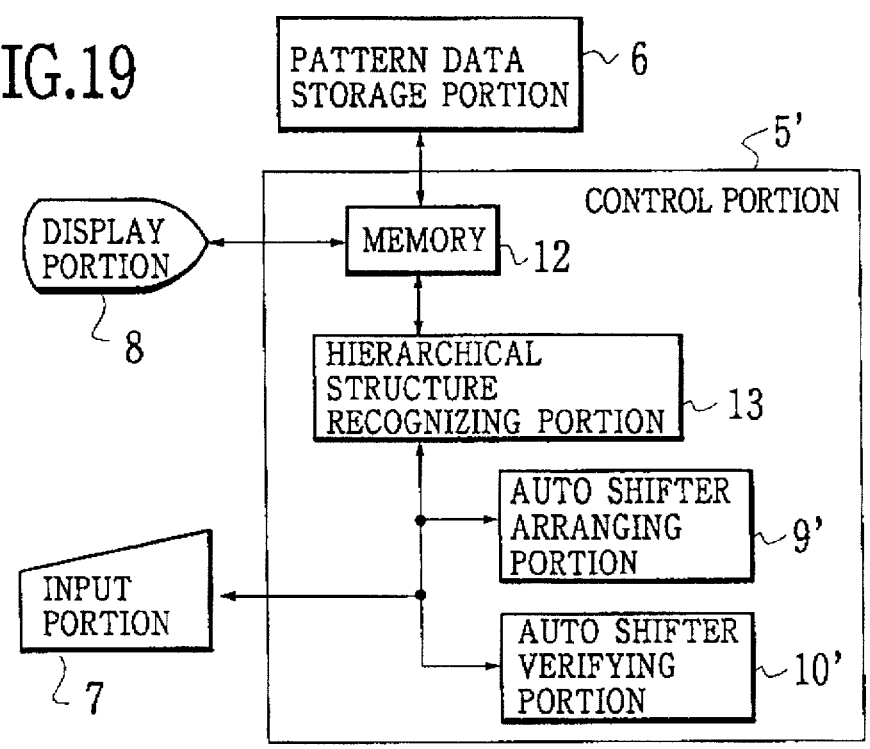
FIG. 19 is a block diagram showing a configuration for the phasing-shifting mask designing system according to the third embodiment.

FIG. 19 is a block diagram showing a configuration for the phase-shifting mask designing system according to the third embodiment.

In the same figure, the phase-shifting mask designing system comprises control portion 5', pattern data storage portion 6, input portion 7, display portion 8. The control portion 5' is equipped with automatic shifter arranging portion 9', automatic shifter verifying portion 10', hierarchical structure recognizing portion 13 and memory 12.

Input portion 7 represents an input apparatus such as a keyboard and a mouse, and selects one function among automatic shifter arranging portion 9' and automatic shifter verifying portion 10' so as to specify the selected execution thereof.

Control portion 5' is composed of a microprocessor, and processes data in accordance with a control program written in memory 12. When the execution thereof is specified, a layout data to be processed is input to hierarchical structure recognizing portion 13 from memory 12 or pattern data storage portion 6.

The processing order is determined for cells in the layout data that is input at hierarchical structure recognizing portion 13. Then, a desired processing is executed in the determined order, at automatic shifter arranging portion 9' or automatic shifter verifying portion 10'. The result thereof is displayed on display portion 8 such as a CRT. As for cells whose shifter assignment is performed without any contradictory spot therein, a flag indicating that the shifter arrangement is completed is given in hierarchical structure recognizing portion 13, so that the processing result thereof is written to pattern data storage portion 6 or memory 12.

Figure 20:
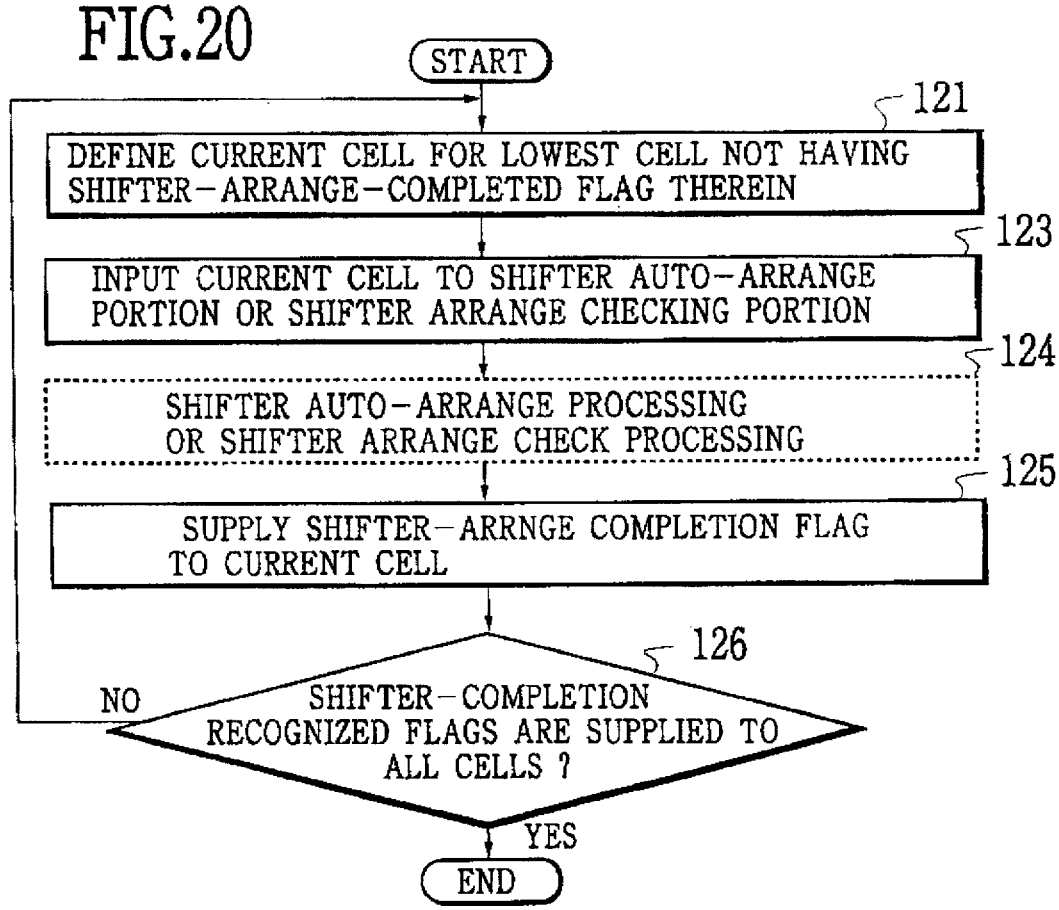
FIG. 20 shows a flowchart showing a control function for hierarchical structure recognizing portion 13 in the phase-shifting mask designing system according to the third embodiment.

FIG. 20 shows a flowchart showing a control function for hierarchical structure recognizing portion 13 in the phase-shifting mask designing system according to the third embodiment.

Figure 21:
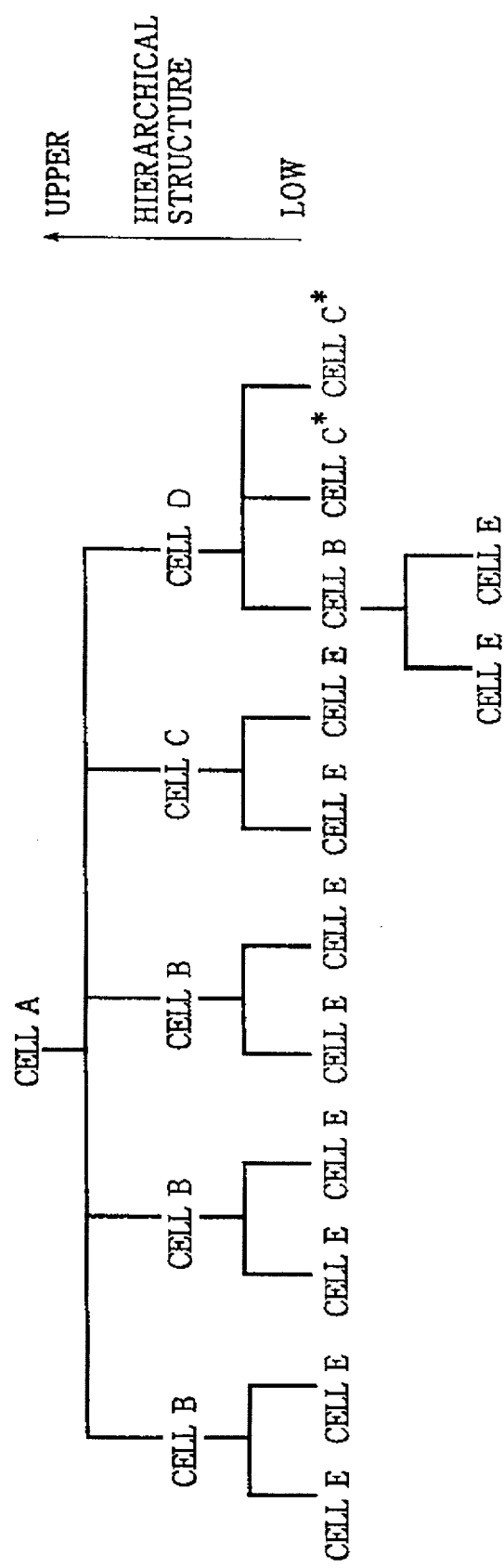
FIG. 21 is an exemplary layout data having a hierarchical structure therein and serves as such for the flowchart shown in FIG. 20.

Data to be processed is input from memory 12 or pattern data storage portion 6. For convenience, suppose that input is layout data represented in FIG. 21 having a hierarchical structure therein. Referring to FIG. 21, the hierarchical structure shown therein is such that cell A is composed of three cell B's, a single cell C and a single cell D. The hierarchy is constructed from a lower level toward an upper level thereof. Cells with asterisks are ones with the flag indicating that the shifter arrangement therefor is already completed.

In hierarchical structure recognizing portion 13, first of all, the most lowest cell in the hierarchical structure without the flag attached thereto is selected, and is regarded a cell to be processed (referred to as a current cell hereinafter) (STEP 121). Thereafter, the layout data for the current cell is input to automatic shifter arranging portion 9' or automatic shifter verifying portion 10' (STEP 123).

Thereafter, for the current cell thus input is automatically shifter-arrangement-processed or shifter-verification-processed by automatic shifter arranging portion 9' or automatic shifter verifying portion 10', respectively (STEP 124). In the example shown in FIG. 21, such a processing is executed in the order of cell E, cell B, cell D and cell A.

As a result of process executed in automatic shifter arranging portion 9' or automatic shifter verifying portion 10', when there is found no contradictory or erroneous spots so that the shifter assignment therefor is possible, a recognized flag, indicating that the shifter is already assigned, is given to such cells in hierarchical structure recognizing portion 13 (STEP 125). In such a manner as described above, the cell to be processed next is determined in sequence in hierarchical structure recognizing portion 13. When all of the cells are given the flag which indicates that the shifter assignment has been completed, the control function therefor terminates (STEP 126).

Besides, hierarchical structure recognition portion 13 is equipped with the following function. That is, the recognition flag for a cell as well as the flags for all cells including the cell as the lower level cell are cancelled when the layout is changed after the shifter-arrangement-completed flag is given to the cell. For instance, suppose that all of cells in FIG. 21 are given the shifter-arrangement-completed flags. When the layout for cell B is changed, the flags attached to cell B, cell D and cell A are removed so as to be cancelled.

Figure 22:
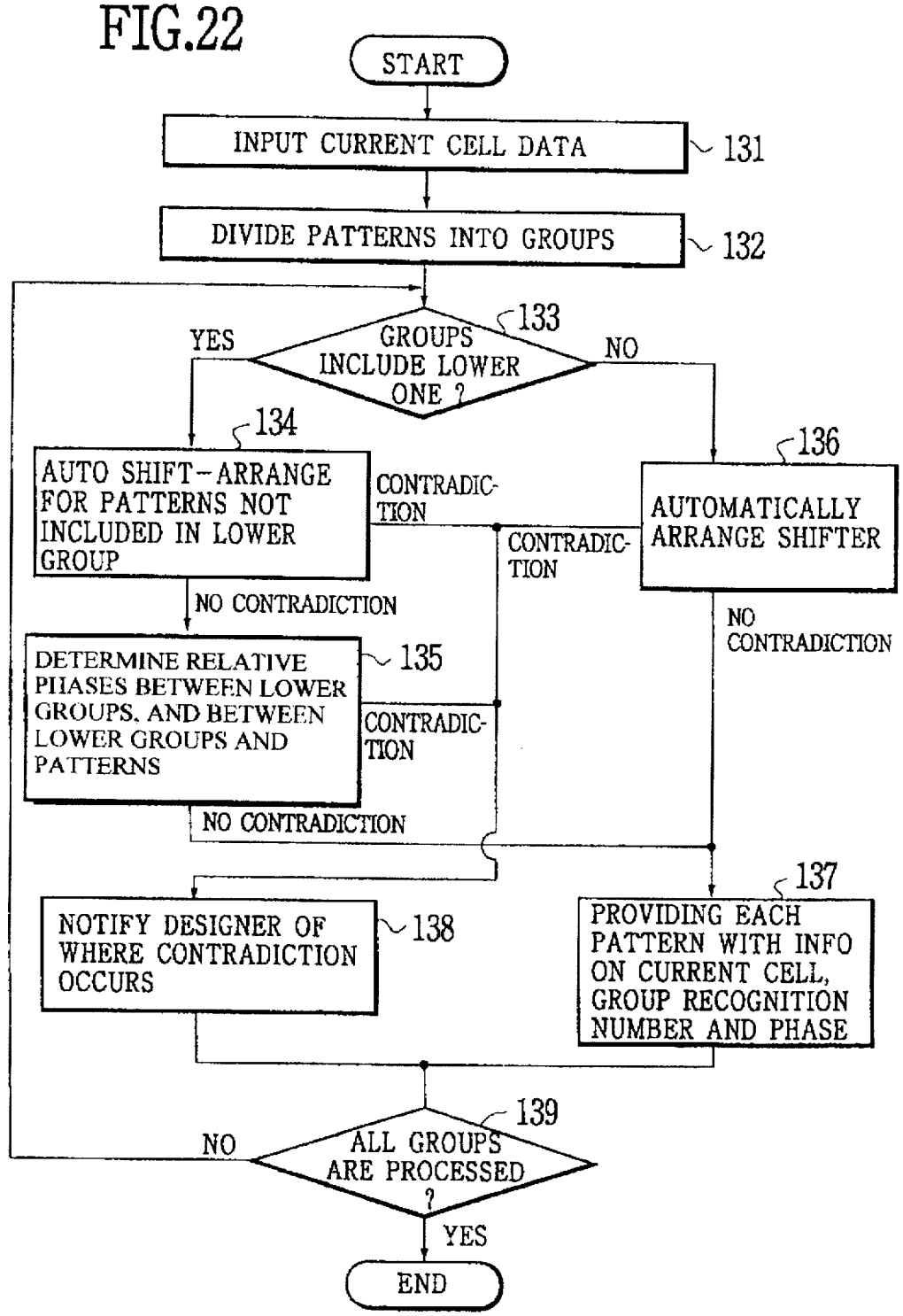
FIG. 22 is a flowchart showing the control operation for automatic shifter arranging portion 9' in the phase-shifting mask designing system according to the third embodiment.

FIG. 22 is a flowchart showing the control operation for automatic shifter arranging portion 9' in the phase-shifting mask designing system according to the third embodiment.

First of all, the current cell is input from hierarchical structure recognizing portion 13 (STEP 131). Classify the current cell data into a set of patterns (referred simply to as a group hereinafter) which are mutually neighboring with the shortest distance being less than a certain threshold r (STEP 132). As for how to determine the threshold r, the method described in the first embodiment is employed.

Figure 23:
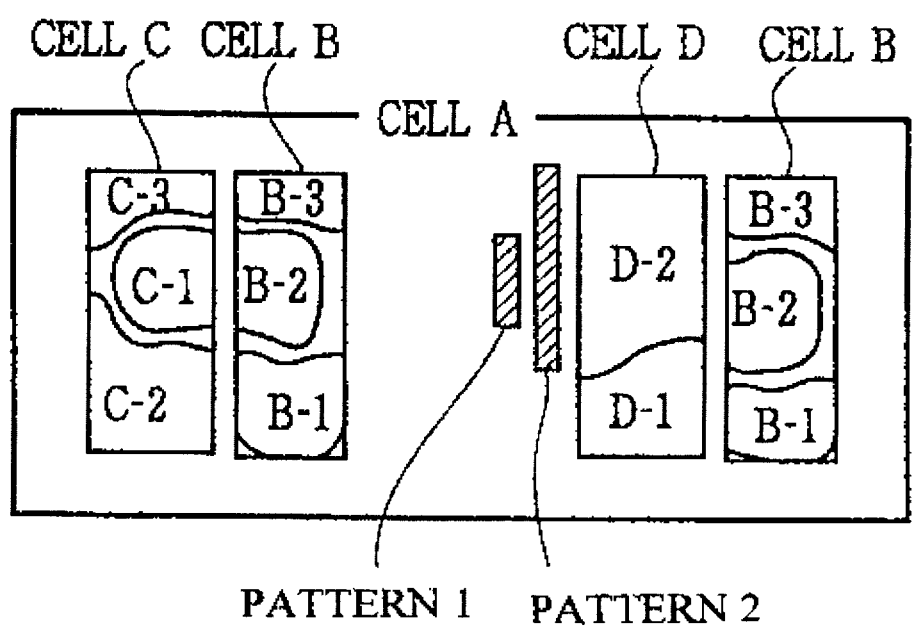
FIG. 23 illustrates an example for how to classify cells into groups.

FIG. 23 illustrates an example for how to classify cells into groups. FIG. 23 shows a case where each cell is constituted by a plurality of lower-level groups. For instance, lower groups C-1, B-2 and D-2 as well as pattern 1 and pattern 2 belong to the same group. Notice that lower-level group D-2 and lower-level group C-1 belong to the same group even though D-2 and C-1 are not mutually neighboring.

Thereafter, in the group including the lower-level group therein, the automatic shifter assignment is performed on a pattern which is not included in the lower-level group (STEP 124). As a result of the automatic shifter assignment, if there is caused a contradictory spot in assigning the shifter, such a spot is informed to the circuit designer accordingly (STEP 138). Here, methods concerning the automatic shifter arrangement and letting known of the contradictory spot to the designer are similar to those described in the second embodiment.

As a result of the automatic shifter assignment, if there is no contradictory spot and the shifter assignment is thus possible, relative phases therefor are determined between the lower-level groups, as well as, between patterns included in the lower-level group and the patterns included in the current cell (STEP 135). Namely, the phases therefor are determined in a manner that the phase of the patterns adjacent within the threshold at a boundary between the lower-end groups or patterns, is mutually set to be opposite. If there is caused a contradictory spot as a result thereof, such a contradictory spot is presented to the circuit designer (STEP 138).

In a case where the group in question does not include the lower-level group therein, such the group is automatically shifter-arranged (STEP 136). If there is caused a contradictory spot thereby, such the contradictory spot is presented to the circuit designer (STEP 138). If is there is found no contradictory spot as a result of the automatic shifter assignment and thus the shifter arrangement is possible, the current cell, group recognizing number and the phase are given to each pattern (STEP 137).

Thereafter, a processing of above steps 133 through 138 is performed on the all groups (STEP 139).

In a case where three information on the current cell, group recognition number and phase given at step 137 is given plural times against a single pattern, such information is sequentially stored and then the latest information is recognized as the current state. Moreover, in a case where the shifter-arrangement-completed recognizing flag is removed due to a change in the layout and so on, the three information for the current cell having such a cancelling flag thereon is also removed. In other words, each pattern's three information on the current cell, group recognition number and phase need be corresponded to the cell having the shifter-arrangement-completed flag.

Figure 24:
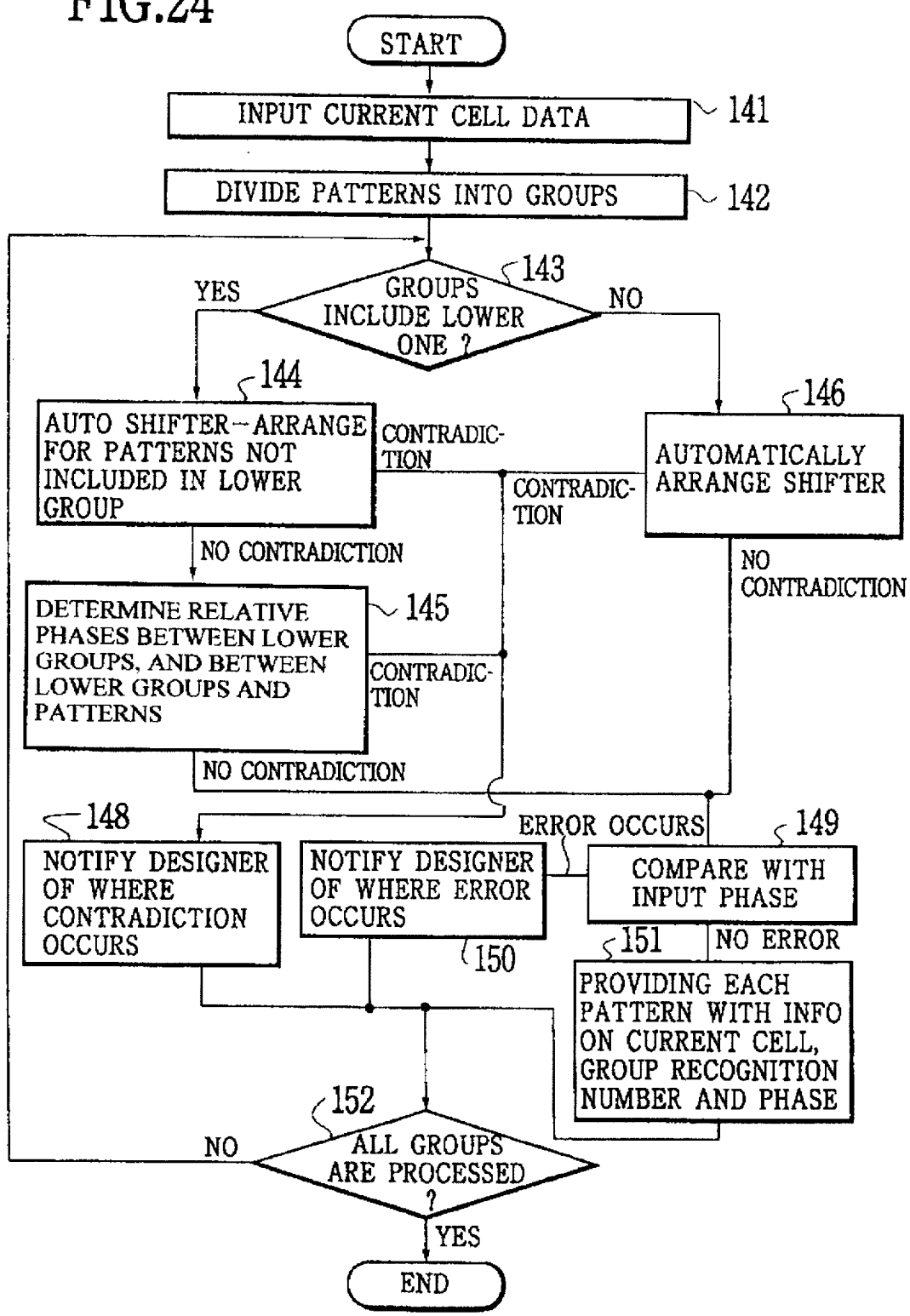
FIG. 24 is a flowchart showing the control operation for automatic shifter verifying portion 10' in the phase-shifting mask designing system according to the third embodiment.

FIG. 24 is a flowchart showing the control operation for automatic shifter verifying portion 10' in the phase-shifting mask designing system according to the third embodiment.

Referring to FIG. 24, first, a current cell data is input from hierarchical structure recognizing portion 13 (STEP 141). Thereafter, the process for classifying into the group and the process of determining the phase therefor are executed. The processings for steps 141–146 and 148 are similar to steps 131–136 and 137 executed in automatic shifter arranging portion 9' shown in FIG. 22.

As a result of the automatic shifter arranging process (steps 144 and 145 or step 146), comparison with the phase input from the circuit designer is performed to the group which does not contain a contradictory spot (STEP 149). In other words, it is verified whether or not the input phase and the phase (temporary) determined in the above manner are identical. It shall be appreciated that such a comparison process may be executed after the phase determined in the above manner is reversed for each group.

If the phase input is found to have an error therein, such an erroneous spot is presented to the circuit designer (STEP 150). Now, how to present the spot may be similar to the one described in the second embodiment. Moreover, when there is no error, the three information on the current cell, group recognition number and phase are presented to each pattern (STEP 151).

The above process of step 143 through 151 is executed for all groups (STEP 152).

Embodiment No. 4

Figure 25:
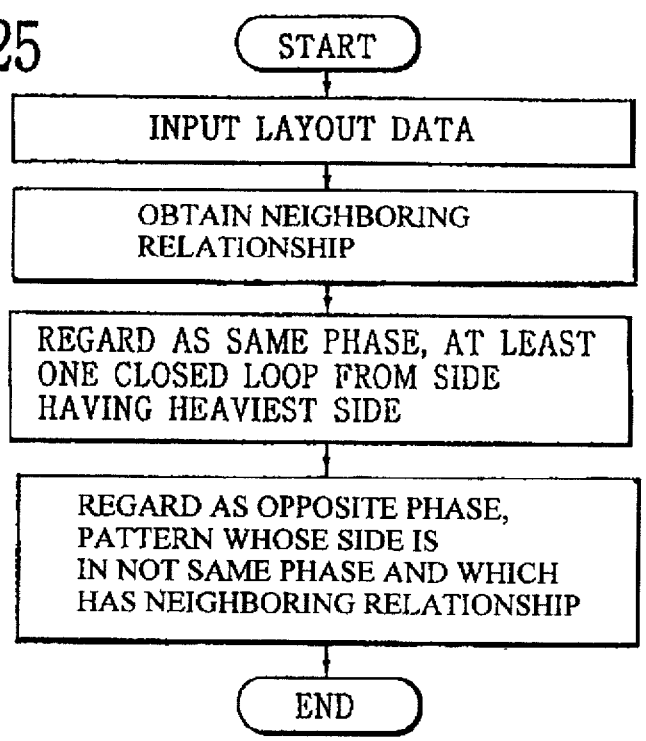
FIG. 25 shows a procedure for determining the phase according to the fourth embodiment.

FIG. 25 shows a procedure for determining the phase according to the fourth embodiment.

Figure 26:
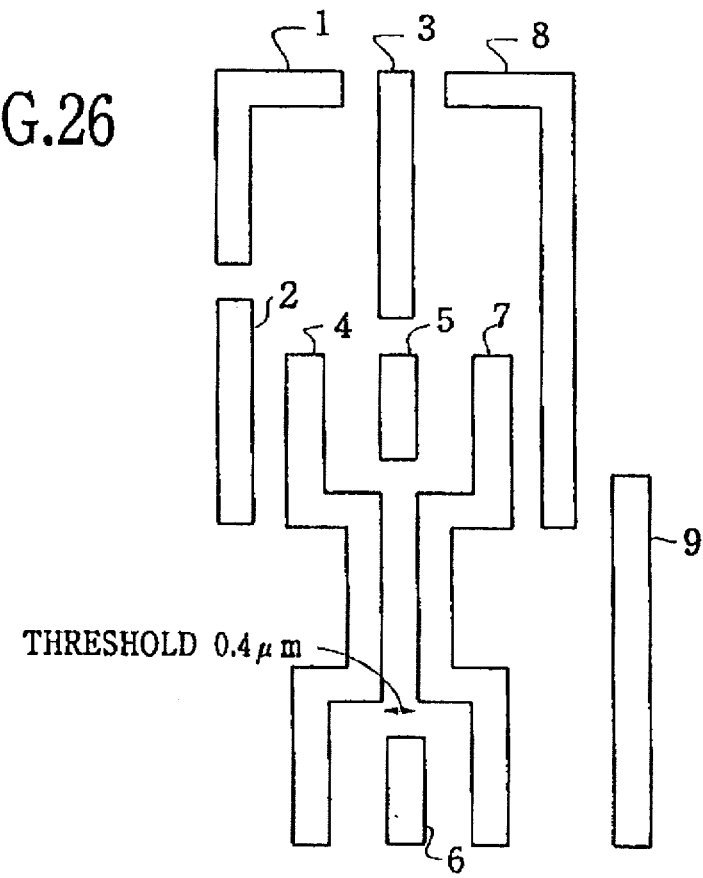
FIG. 26 is an exemplary layout design which is used to explain the method employed in the fourth embodiment.

There is a layout data to be processed. For a shape or shapes (clear area) in the layout data, neighboring relationship therefor is obtained. When the shortest distance between the shapes are less than the threshold, the shapes are defined to be adjacent or neighboring to each other. For example, when the layout data is one shown in FIG. 26, the neighboring relationship can be illustrated in a graph shown in 27A. In FIG. 27A, a tiny circular dot (referred to as a node hereinafter) represents the shape or figure in the layout data; when shapes are neighboring, such nodes are connected by straight line.

For example, a weighting procedure is carried out and is set out as per FIG. 28 where there are shown four different conditions. It is preferable that more than one condition among the four conditions shown in FIG. 28 is utilized on request. Moreover, it is necessary that arbitrary weightings are considered besides the four conditions.

The first condition is that the more often the node is included in odd-numbered loops, the heavier the line therefor is weighted. By regarding the spot which is more often included in the odd-numbered loops, as being the identical phase, other neighboring spots become less identically in phase.

The second condition is that farther the shortest distance between the shapes are, the heavier the line segment therefor is weighted. This is because there is more chance to possibly resolve if the shortest distance therebetween is far apart.

The third condition is that if a side length of the shape facing to the neighboring shape is rather short, the line segment therefor is given a heavier weighting; those shapes are of course neighboring at a distance less than the threshold. This is because the shorter the length of sides facing at a distance less than the threshold is, the greater the possibility to resolve becomes.

The fourth condition is that the line segment is given a heavier weight, the line segment corresponding to the shapes whose area is small, where the shapes have the distance less than the threshold. This is because the smaller the area of the shape is, the greater the possibility to resolve those shapes; the shapes are neighboring at a distance less than the threshold.

Besides the above four conditions, it is possible to offer other arbitrary weightings. Among them, the circuit designer may give weighting of plus infinity or minus infinity at a particular spot, so that the designer can specify where to make identical phase or reverse phase.

A degree of absolute value for the weighting may depend on condition of a process, experimentation or a circuit designer in question. In the graph shown in FIG. 27A, the weighted values based on the table shown in FIG. 28 are labeled therein which are underlined for easy clarity.

Let us define the odd-numbered loop. The odd-numbered loop means a closed loop which is composed of odd number of nodes. For instance, referring to FIG. 27A, nodes constituted by 4, 5 and 7 are the odd-numbered loops; by the same token, 4-6-7, 4-5-3-8-7, 1-2-4 -5-3, 1-2-4-6-7-5-3, 1-2-4-5-7-8-3, and 1-2-4 -6-7-8-3 are also odd-numbered loops.

Among the line segments included in the odd-numbered loops, starting from the line segment whose weighting is heaviest, the shapes corresponding to both ends for such the line segment are determined in sequence so that identical phases are assigned; such a spot where the corresponding shapes have the identical phases is referred to as a loop cut-off spot hereinafter. Then, if there exists already the loop cut-off spot in all odd-numbered loops including the line segment in question, such line segment is not considered as the loop cut-off spot. S Moreover, as for the odd-numbered loop including more than one loop cut-off spot, such odd-numbered loop is excluded from the category of odd-numbered loop which is to be weighted under the first condition. Therefore, upon determination of the loop cut-off spot, the weight thereof changes. For example, referring to FIG. 27A, the line segment between nodes 4 and 5 (4-5) whose weight is heaviest among the line segments included in the odd-numbered loop, is regarded as the loop cut-off spot. The odd-numbered loops including 4-5 are excluded from the odd-numbered loop under the first condition. FIG. 27B ls a graph that is rearranged after such exclusion. Continuing to proceed accordingly, the line segment between nodes 4 and 6 or between nodes 6 and 7 is regarded as the loop cut-off spot. If there are plural spots presenting the same weight, one of them is selected at random. In the example of FIG. 27B, two loop cut-off spots are decided so that every odd-numbered loop contains a single loop cut-off spot therein.

Figure 29:
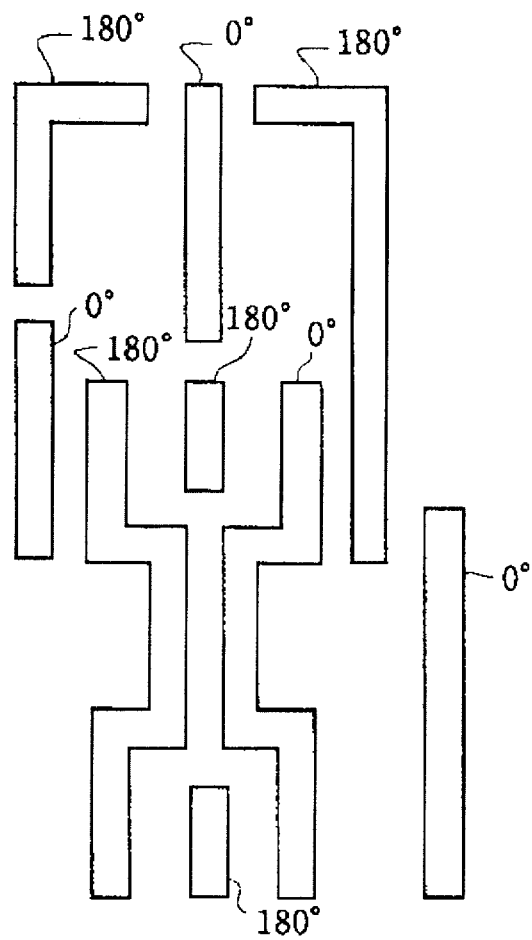
FIG. 29 shows a result employing the weighting shown in FIG. 27B.

The phases are determined in a way that at the loop cut-off spot the shapes corresponding to both-end nodes of the line segment are mutually identical in phase thereof, and at other spots the shapes corresponding to both end nodes of the line segment are mutually opposite in phase. Referring to FIG. 27B, for example, 4-5 and 4-6 are made identical phases, whereas in other neighboring shapes are made opposite phases. FIG. 29 is the result of phases determined for the shapes in compliance with the method of the fourth embodiment. The loop cut-off spots are reported to the circuit designer.

Moreover, it shall be appreciated that the shapes corresponding to the loop cut-off spot thus determined in the fourth embodiment may be moved or the pattern thereof may be re-sized so that appropriate modification therefor can be achieved in best compliance with an intended pattern resolution.

Though a sum or total of weights in terms of more than one condition is utilized in the above example, the following method adopting the above-mentioned one may serve good as well.

When the weight is given to the drew-up graph, the weight giving is performed under the most important condition (i.e., having utmost priority attached thereto), then the line segment having heaviest weight among the line segments included in the odd-numbered loops is :first regarded as the loop cut-off spot. Then, in the event there exist plural line segments having the same weight, the line segment having the heaviest weight under a condition of next importance, is regarded as the loop cut-off spot. In other words, in the event there exist the plural line segments having the same weight where the priority (importance) therefor is greater, the weight therefor is compared in view of a condition presenting next greatest priority (importance). Accordingly, in a case where among various conditions there exist a definite condition which is dominant in the course of circuit designing, the loop cut-off spot can be determined without being affected by other conditions.

Embodiment No. 5

Figure 30:
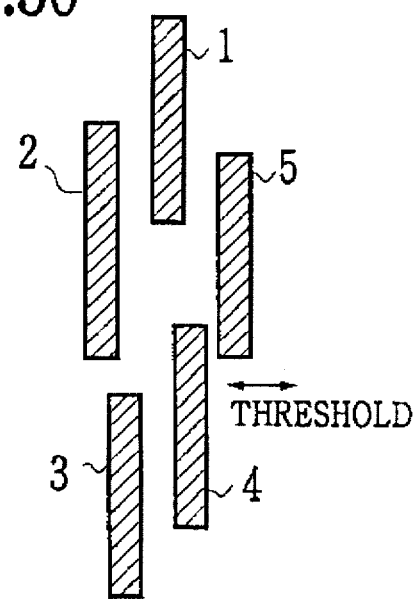
FIG. 30 shows an example of a shifter arrangement for explaining the fifth embodiment.

FIG. 30 shows an exemplary layout data used to describe the fifth embodiment.

For example, consider that an input layout data is as per FIG. 30. The shortest distance between a pair of shapes (clear areas) is measured. Then, when the measured inter-shape distance falls within a specific threshold value, such shapes are defined to be adjacent or neighboring, and such adjacent relationship is memorized as such. In order to facilitate such adjacent relationship, the graph configuration is employed as in FIGS. 27A and 27B.

Figure 31:
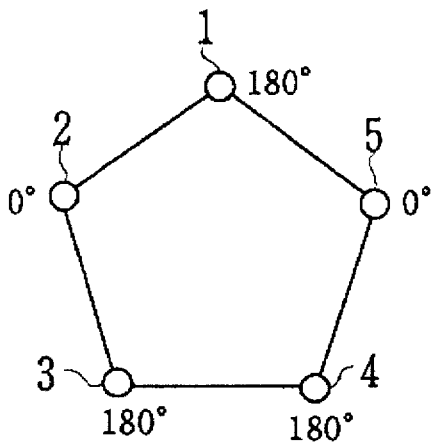
FIG. 31 is a simplified schematic diagram showing topological arrangement corresponding to FIG. 30.

Referring to FIG. 31, each shape on the mask is represented by an tiny circle called node, and the adjacent nodes defined thus are connected by the line segment. Such adjacent relationship configured is memorized as such. Thereafter, if there exists therein more than one shape whose phase is already assigned, shapes disposed in the vicinity of the phase-already-determined shape are assigned phases thereof, in a sequential order, in a manner that the neighboring shape is assigned a phase opposite to other pair of the shape in question.

Still referring to FIG. 31, if phase 180° is already assigned to node 1, nodes 2, 5 neighboring thereto are assigned the phases of 0° and 0°. Thereafter, paying attention to node 2, node 3 adjacent to node 2 is assigned the phase of 180°. Thereafter, paying attention to node 5, node 4 adjacent to node 5 is assigned the phase of 180°. Thereafter, paying attention to node 3, node 4 adjacent to node 3 has been given the phase of 180°, and the identical phase is assigned to both node 3 and node 4 which are adjacent to each other. Since the neighboring shapes are, according to a strict rule, given opposite phase to each other, such a spot where adjacent nodes therein have the identical phases is defined to be a contradictory spot.

In this embodiment, the shapes disposed in the vicinity of the phase-already-determined shape are assigned phases thereof, in a sequential order, in the manner that the neighboring shape is assigned the phase opposite to other pair of the shape in question. Then, if there occurs the spot where the adjacent nodes therein have the same phase, such a spot is presented to the circuit designer as the contradictory spot.

Embodiment No. 6

Figure 32:
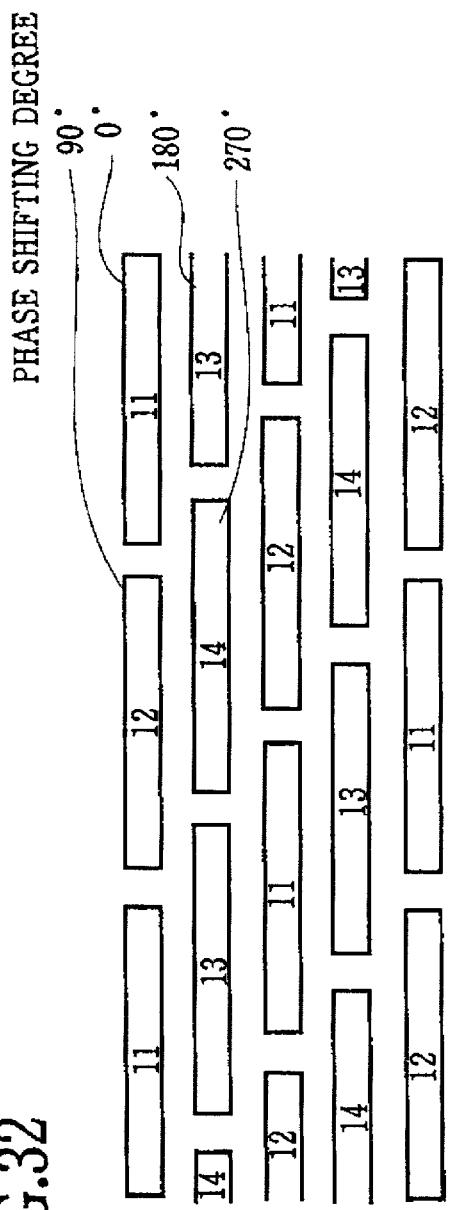
FIG. 32 is an example where the phase shifter is arranged over patterns of an element region of a memory cell array, according to the sixth embodiment.
Figure 33:
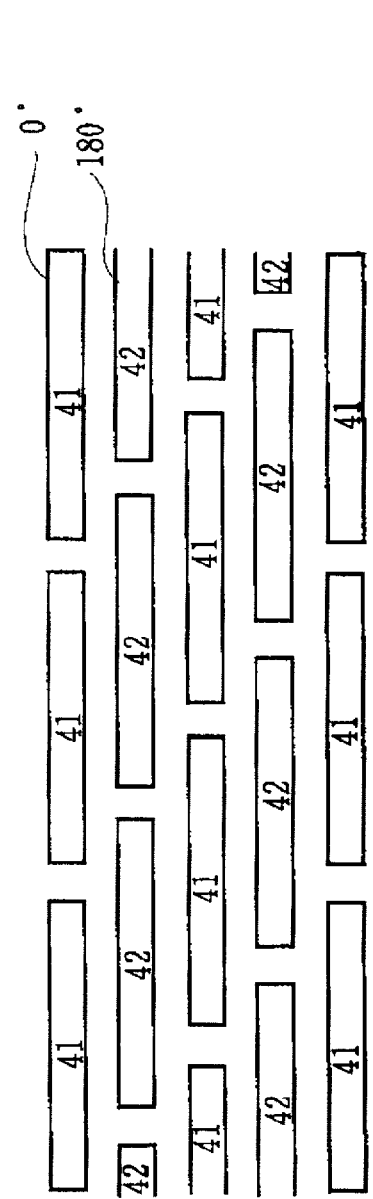
FIG. 33 is an example where the Levenson-type phase shifting method is applied to the same opening pattern shown in FIG. 33.
Figure 34:
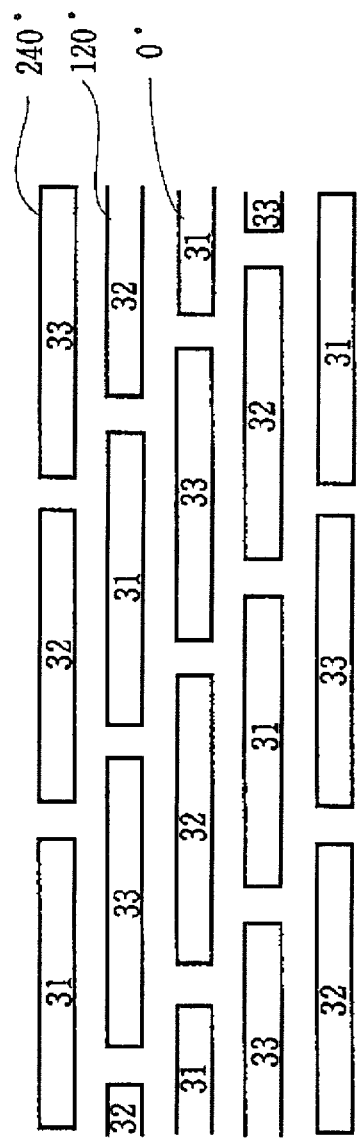
FIG. 34 is an example employing three separate phases in assigning the shifter.

FIG. 32 is an example where the phase shifter is arranged over patterns of an element region of a memory cell array, according to the sixth embodiment. FIG. 33 is an example where the Levenson-type phase shifter method is applied to the same opening pattern shown in FIG. 33. FIG. 34 is an example employing three separate phases in arranging the shifter.

Referring to FIG. 33, reference numeral 41 denotes an opening portion having no shifter material arranged thereon. 42 is an opening portion having material for the phase-shifter at 180°. In this example shown in FIG. 33, there are only used 0° and 180° phase-shifting arrangement. Thereby, between the neighboring opening portions facing at longer sides, that is between 41 and 42, the phase difference therefor is 180°, so that the pattern is well resolved. On the other hand, between the neighboring opening portions facing at shorter sides, that is between 41 and 41 or between 42 and 42, there causes no phase shifting effect, so that resolution therefor is very difficult.

It is to be noted that the opening and the clear area are interchangeably used.

Referring to FIG. 34, opening 31 (clear area) is given no shifter material so that the phase-shifting degree is 0°. Openings 32, 33 are given the shifter material whose phase-shifting degrees are 120° and 240°, respectively. In this example shown in FIG. 34, every phase difference for the neighboring clear areas are of 120°, so that none of openings is given the same phase to the neighboring opening thereof. However, in view of the fact that the resolution is particularly required in openings facing the longer sides, the resolution of inter-openings facing at the longer sides are weaker as compared to the example shown in FIG. 33.

Referring to FIG. 32, opening 11 does not contain the phase-shifting material, namely, the phase-shifting degree therefor is 0°; respective openings 12, 13 and 14 have the phase-shifting materials of phase-shifting degrees of 90°, 180° and 270°, respectively. In this embodiment, the phase difference is set to 180° when the facing portion is rather long, whereas the phase difference is set to 90° when the facing portion is comparatively short. As a result thereof, none of opening portions are neighboring at the identical phase. Moreover, in the the longer side of the openings where the resolution therefor is especially required, the phase difference is arranged as 180° which gives rise to the most resolution-improving effect. Thereby, very suitable pattern resolution can be obtained.

There will be explained, as follows, why phase between shapes whose facing sides are comparatively long is set to 180°, and the phase between shapes whose facing sides are comparatively short is set to 90°, in island-shaped patterns.

Figures 35B, 35C:
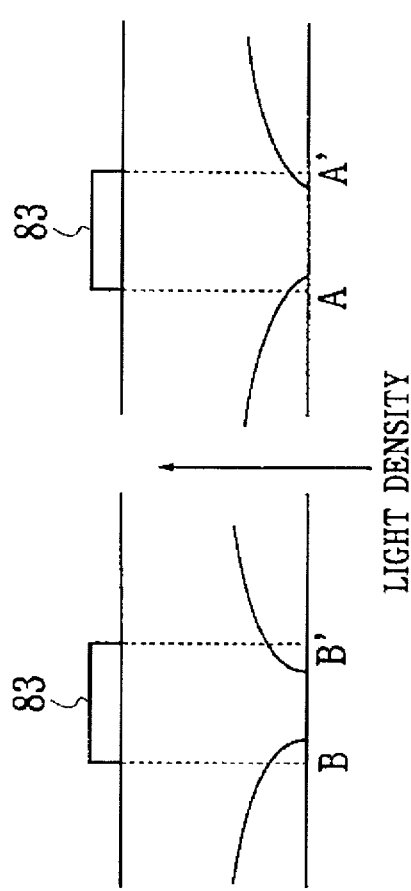

Firstly, in view of the two-dimensional light intensity distribution passing through the openings on the exposure mask as shown in FIG. 35A, it is observed that the intensity becomes weak at the corners of the rectangles. Thus, comparing the opening facing with short sides and one the long sides, the openings facing with longer sides present stronger light intensity (FIGS. 35B and 35C). In such portions neighboring with the strong light intensity, optical interference is strong, so that resolution therefor deteriorates (FIG. 35B). Therefore, in that portions, there need be given the phase difference of 180° which presents most effective resolution improving power.

Figure 48:
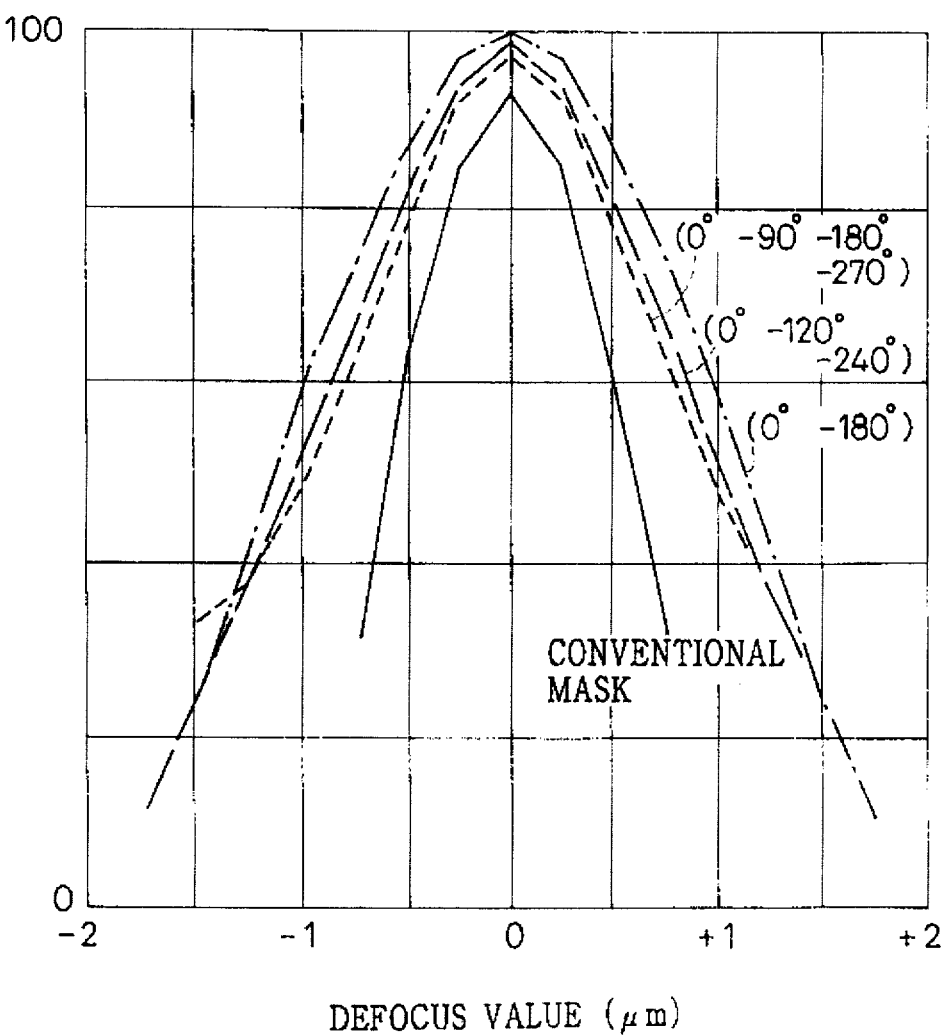
FIG. 48 is a graph showing correlation between various phase arrangements in terms of defocus value and contrast.
Figure 49A:
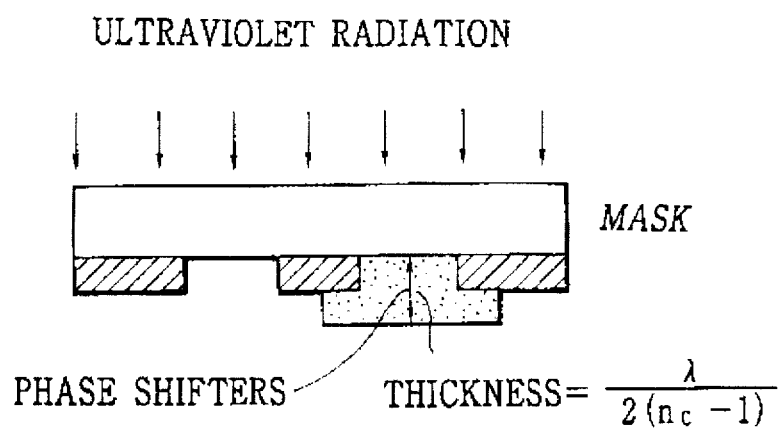
FIGS. 49A through 49D illustrate a principle of the phase-shifting technique which is similar to FIGS. 5A through 5D.
Figure 49B:
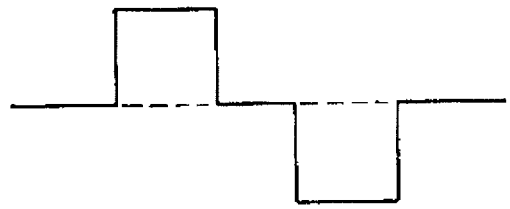
Figure 49C:
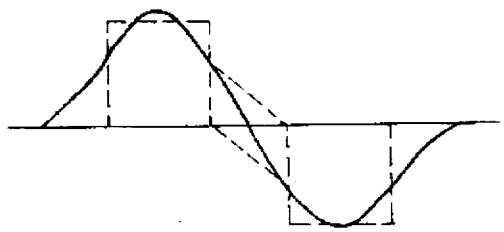
Figure 49D:
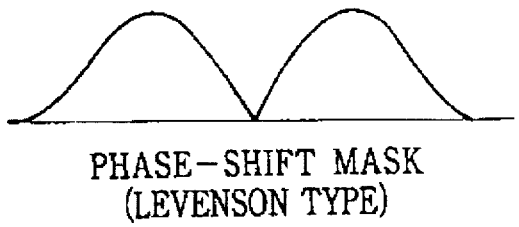

Secondly, it is due to an advantageous aspect concerning overall area shrink factor. Referring to FIG. 48, the resolution differs in the case where the phase differences are 90° and 180°. Now, the minimum interpattern distance which is possible to resolve with the phase difference being 180° is defined as d1; in a similar manner, d2 with the phase difference being 90°, d3 with no phase difference (identical phase). In accordance with FIG. 48, it is clarified that d1<d2<d3.

Figure 36A:
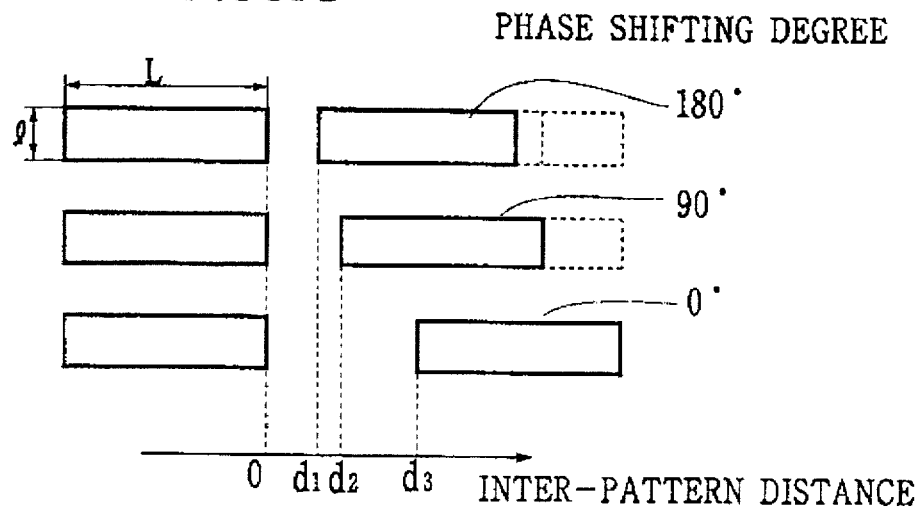
FIGS. 36A and 36B show diagrams to describe relation between the phase determining method and shrink factors.
Figure 36B:
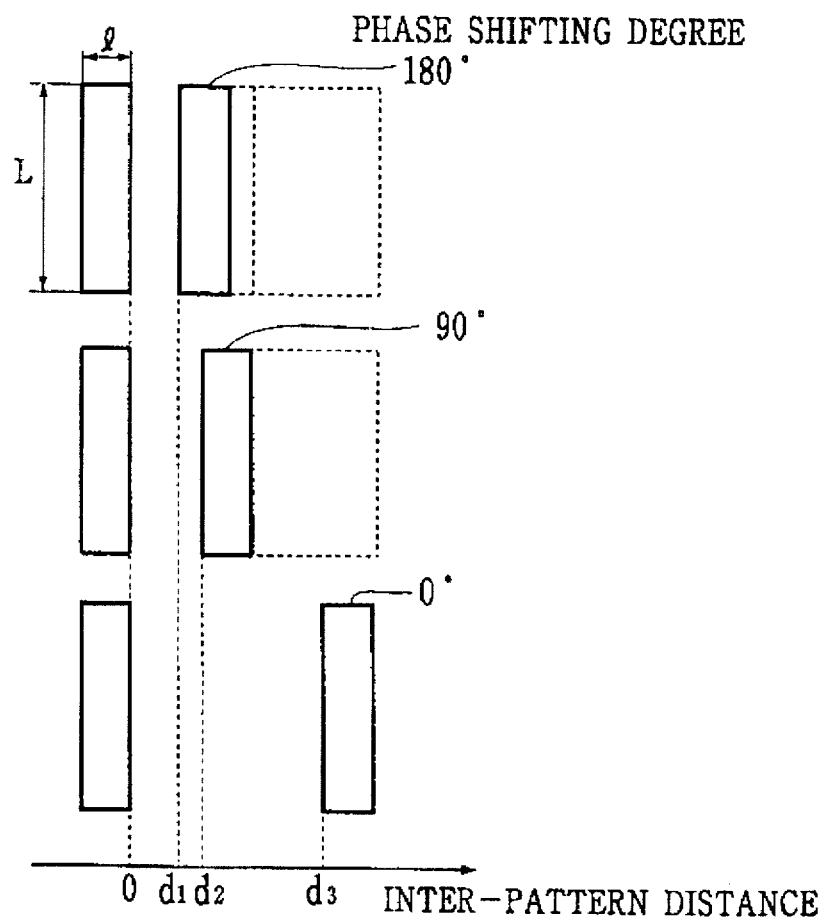

Consider that there are two rectangles that are mutually facing each other. FIGS. 36A and 36B indicate comparison in which two figures are made close-positioned together at the minimum distance therebetween. FIG. 36A shows a case where the two figures face each other with a shorter side thereof. The two figures can be additionally closely disposed by as much as (d3-d2), compared to the case where the identical phase (0°) is assigned when 90° of phase difference is assigned. Moreover, best of all, when the phase difference is 180°, the two figures can be closely disposed by as much as (d2-d1), compared to the case where the phase difference is 90°. Therefore, in the case of phase difference being 180°, a layout area therefor can be shrinked by as much as (d2-d1) X 1, compared to the case of phase difference being 90°. Similarly, in the case of phase difference being 180°, the layout area therefor can be shrinked as much as (d2-d1) X L.

Thus, comparing the shrink areas (d2-d1) X 1 in the case facing with the short sides and (d2-d2) X L in the case facing with the long sides upon a phase change from 90° to 180°, it is observed that L>1. Therefore, when the phase difference is set to 180° between shapes facing with long sides, so that the layout area therefor can be significantly minimized. Moreover, the inter-shapes facing the short side are identical phases, the phase difference therefor is set to 90°, so that the area for (d3 -d2) X 1 can be further minimized.

Taking, as example, the pattern for an element isolation layer, the shrink factor therefor is calculated as follows.

Figure 37A:
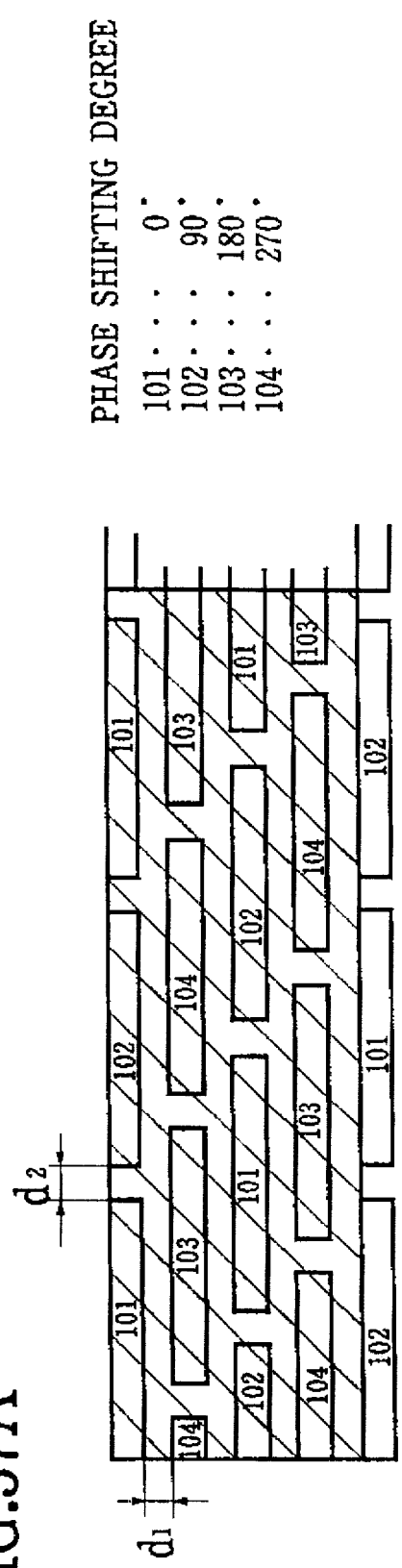
FIG. 37A is an exemplary arrangement obtained by the sixth embodiment.
Figure 37B:
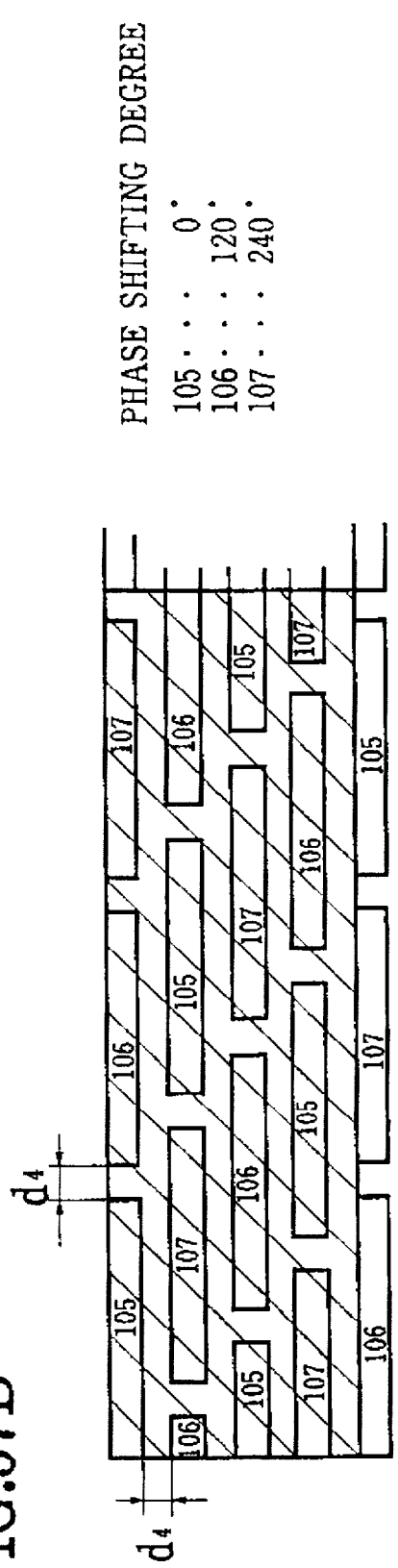
FIG. 37B is an exemplary arrangement utilizing three phases of 0°, 120° and 240°.

As an exposure condition, assume is that reduction-type projection wavelength $\lambda$=248 nm, numeric apertures NA of a shrink lens =0.45, and coherence factor $\delta$=0.3. When the size of the opening portion is 0.4 $\mu m \times 2.4$ $\mu m$, the minimum distance by which to possibly resolve is obtained by simulation for each combination. Each minimum distance obtained was d1=0.16 $\mu m$, d2=0.22 $\mu m$, d3=0.32 $\mu m$ and d4 for phase difference 120° was 0.2 $\mu m$. In this simulation, the minimum distance was defined such that contrast of a resist is 70% and a depth of focus of 1.0 $\mu m$ can be obtained. Based on such results, there are obtained the element isolation layers as shown in FIGS. 37A and 37B. FIG. 37A is an exemplary arrangement obtained by the embodiment. FIG. 37B is an exemplary arrangement utilizing three phases of 0°, 120° and 240°. FIG. 38A represents the Levenson-type phase-shifting arrangement, while FIG. 38B is an exemplary arrangement which represents a usual lithography technique without using the phase-shifting method. The shortest distance of the opening for each above case is one calculated in the above simulation which is possible to resolve. As for each case of the portion enclosed with the hatched lines which form a unit of periodic repetition, the size therefor in FIG. 38B is 23.50 $\mu m^2$, FIG. 38A 18.28 $\mu m^2$, FIG. 37B 18.72 $\mu m^2$, and FIG. 37A 17.61 $\mu m^2$. Comparing to FIG. 38B in which the phase-shifting is not utilized, the shrink factors for FIG. 37A and FIG. 37B and FIG. 38A are 74.94%, 79.66% and 77.79%, respectively. As a result, the shrink factor employed in the sixth embodiment is greater than others by approximately 5%.

Embodiment No. 7

Figure 39A:
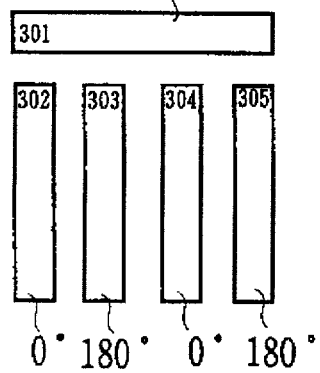
FIGS. 39A through 39C illustrate a method according to the seventh embodiment.
Figure 39B:
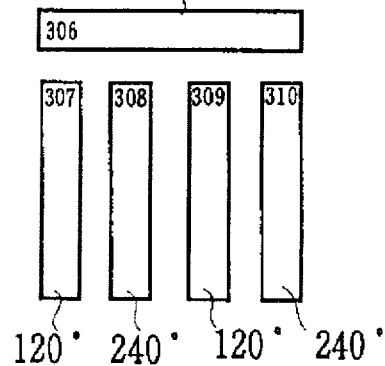
Figure 39C:
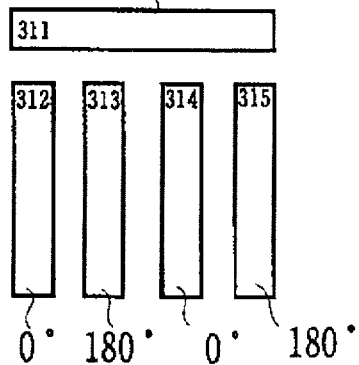

FIGS. 39A through 39C illustrate a method according to the seventh embodiment. In FIGS. 39A through 39C, the reference numerals 301 through 315 denote opening portions (clear areas). FIG. 39A is an exemplary arrangement achieved by adopting the Levenson-type phase shifting technique. FIG. 39B shows an example where three phases of 0°, 120° and 240° are used. FIG. 39C is an example of the phase-shifting arrangement according to this embodiment.

In FIG. 39A, the clear area indicated by the reference numerals 301, 302 and 304 are opening portions which do not equip the phase-shifting material, thus the phase-shifting degree therefor is 0°. On the other hand, 303 and 305 are the opening portions where 180° phase shifting material is provided. In this example utilizing the Levenson-type technique, it is hard to have good resolution in opening portions between 301 and 302, and between 301 and 304 where the respective phases are identical.

In FIG. 39B, the clear area indicated by the reference numeral 306 is an opening portion which does not equip the phase-shifting material, thus the phase-shifting degree therefor is 0°. On the other hand, the opening portions 307, 309 and opening portions 308, 310 are provided with the material whose phase-shifting degrees are 120° and 240°, respectively. In this example illustrated in FIG. 39B, since the phase-shifting degree is 120° everywhere for the neighboring opening portions, and there does exist opening portions facing with the identical phase. However, the resolution between 307 and 308, 308 and 309, and 309 and 310 is weak compared to the case where 180° phase difference is introduced.

With reference to FIG. 39C, 312 and 314 represent opening portion where the phase-shifting degree thereof is 0°. On the other hand, 311 is the opening portion whose phase-shifting degree is 90°, whereas 313 and 315 are opening portions have material whose phase-shifting degree is 180°. In this embodiment, the opening portions which are mutually neighboring and facing with the long sides (namely, opening portions between 312, 313, 314 and 315) are given the phase difference of 180°. The opening portions which are neighboring and facing with the short sides (namely, opening portions between 311, 312, 313, 314 and 315) are given the phase difference of 90°. According to seventh embodiment, the opening portions facing with long sides are given the phase difference of 180° which gives rise to the most effective resolution, so that extremely desirous patterns can be obtained thereby.

Embodiment No. 8

Figure 40:
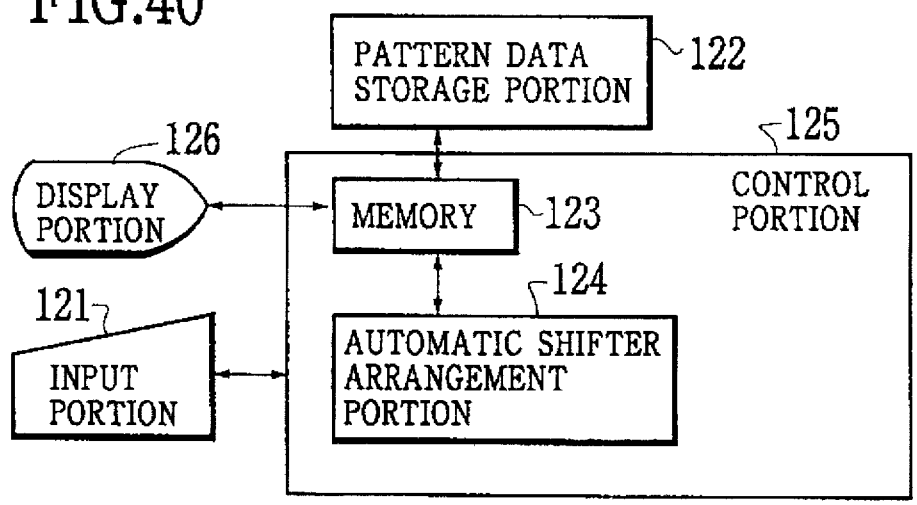
FIG. 40 is a block diagram showing a configuration of automatic shifter arranging apparatus, according to the eighth embodiment.

FIG. 40 is a block diagram showing configuration of automatic shifter arranging apparatus, according to the eighth embodiment.

In the same figure, the reference numeral 121 denotes a keyboard or mouse. This input portion 121 instructs the execution of automatic shifter arrangement to control portion 12S. Control portion 12S is composed of memory 123, automatic shifter arranging means 124 and a microprocessor which controls the apparatus in its entirety. Upon receipt of the instruction from input portion 121, control portion 123 reads a pattern data to be shifter-arranged, to memory 123 from storage portion 122 that stores the pattern data. Next, automatic shifter arranging means 124 is initialized. Automatic shifter arranging portion 124 reads a required data from memory so as to perform shifter arrangement. The result of the shifter arrangement is temporarily stored in memory 123. The result thereof is transferred to display portion 126 such as CRT by way of control portion 125. The result thereof is also written to pattern data storage portion 122.

Figure 41:
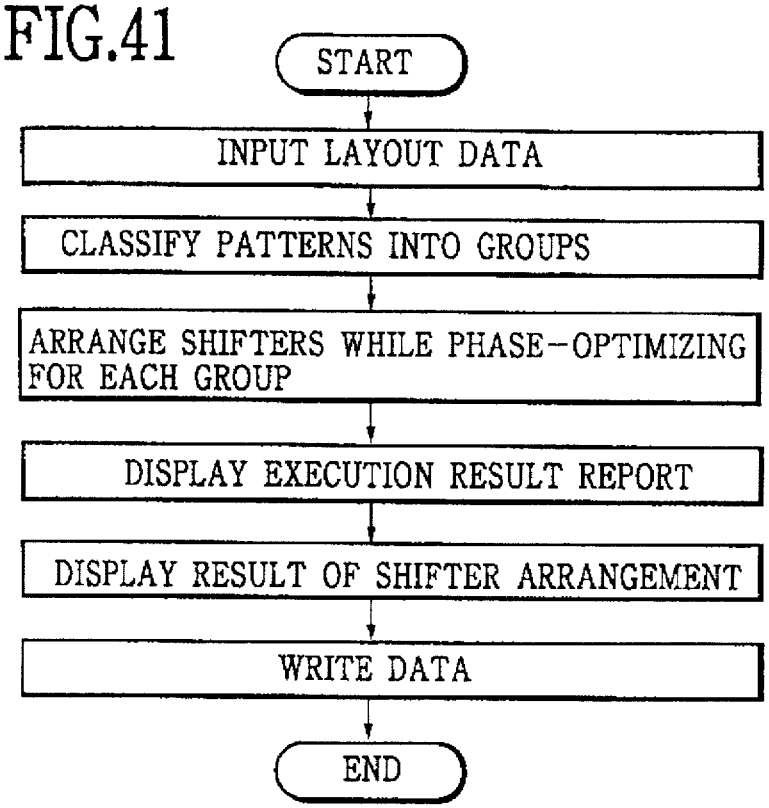
FIG. 41 is a flowchart for performing the automatic shifter arrangement.
Figure 42A:
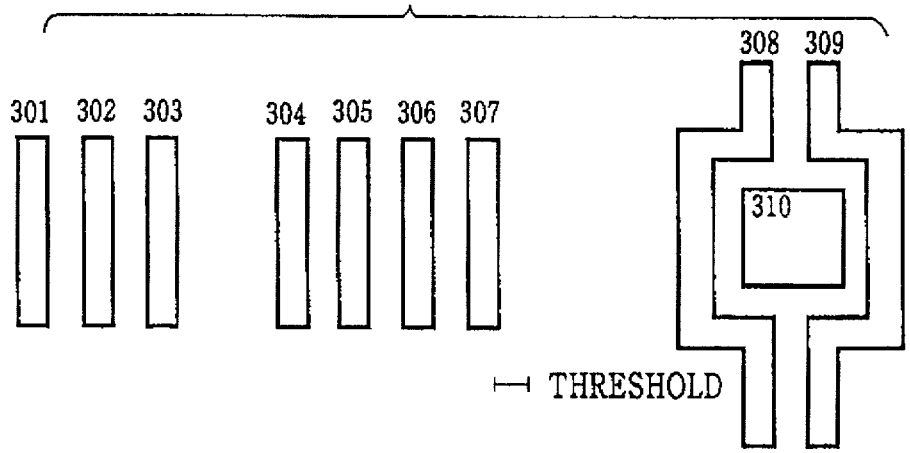
FIGS. 42A and 42B show an exemplary pattern configuration and the corresponding graph, according to the eighth embodiment.
Figure 42B:
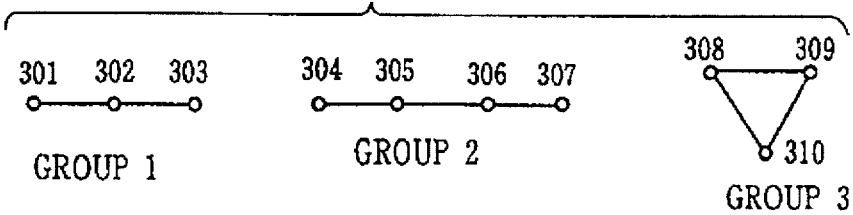

Next, FIG. 41 is a flowchart for performing the automatic shifter arrangement. Data to be processed is input to memory from pattern data storage portion 122. The input pattern data is classified into a group by the automatic arranging portion. Now, the group is defined to be a set of patterns which are adjacent at the distance less than threshold S (see FIG. 42A and FIG. 42B). In order to systematically treat the shapes, it is preferred to utilize a graph. With reference to FIG. 42A and FIG. 42B, there will be described the graph in detail.

A node corresponding to the pattern is written. Next, if two patterns in question is neighboring at a distance less than threshold S, the two nodes corresponding to such patterns are connected by a line segment. Those relational figure is defined here as the graph. The group indicates a certain set within the graph where each node is connected by the line segment.

Next, a set of phases are determined for each group. As the phase-shifting degree of the phase shifters arranged for patterns, there are used 0° and 180°; for other degrees than 0° and 180°, there are used (n−2) kinds of phases such as $m_1$, $m_2$, ..., $m_{n-2}$, where n represents a positive integer greater than 3. Phase-shifting degrees $m_1$, $m_2$, ..., $m_{n-2}$ are given by the circuit designer himself. Referring to FIG. 40, an automatic shifter arranging apparatus shown therein selects a proper phase from among 0°, 180°, $m_1$, $m_2$, ..., $m_{n-2}$ so as to automatically arrange the phase thereof. Typically preferable values for the degrees given by the designer are expressed by an integral multiple of ø, where $$ø=360°/k \quad —(A) \quad (k \text{ is } 3, 4, 5, ...)$$

however, since (B)

$$ø'=ø±(t×360°) \quad —(B) \quad (t=0, 1, 2, 3, ...)$$

takes an identical effect with ø, therefore, in general, phase-shifting degrees $m_1$, $m_2$, ..., $m_{n-2}$ is represented by an integral multiple of (C), where $$ø=360°/k±(t×360°) \quad —(C)$$

$$(k=3, 4, 5, ...; t=0, 1, 2, 3, ...)$$

Data on shifter arrangement and data concerning each group are written to memory 123 or pattern data storage portion 122. A processing result thereof is displayed in the form of an execution report. In the execution report, there are displayed therein the total number of groups and whether or not the shifters are normally arranged, each group existing in a region which is designated to be automatically shifter-arranged.

Figure 43:
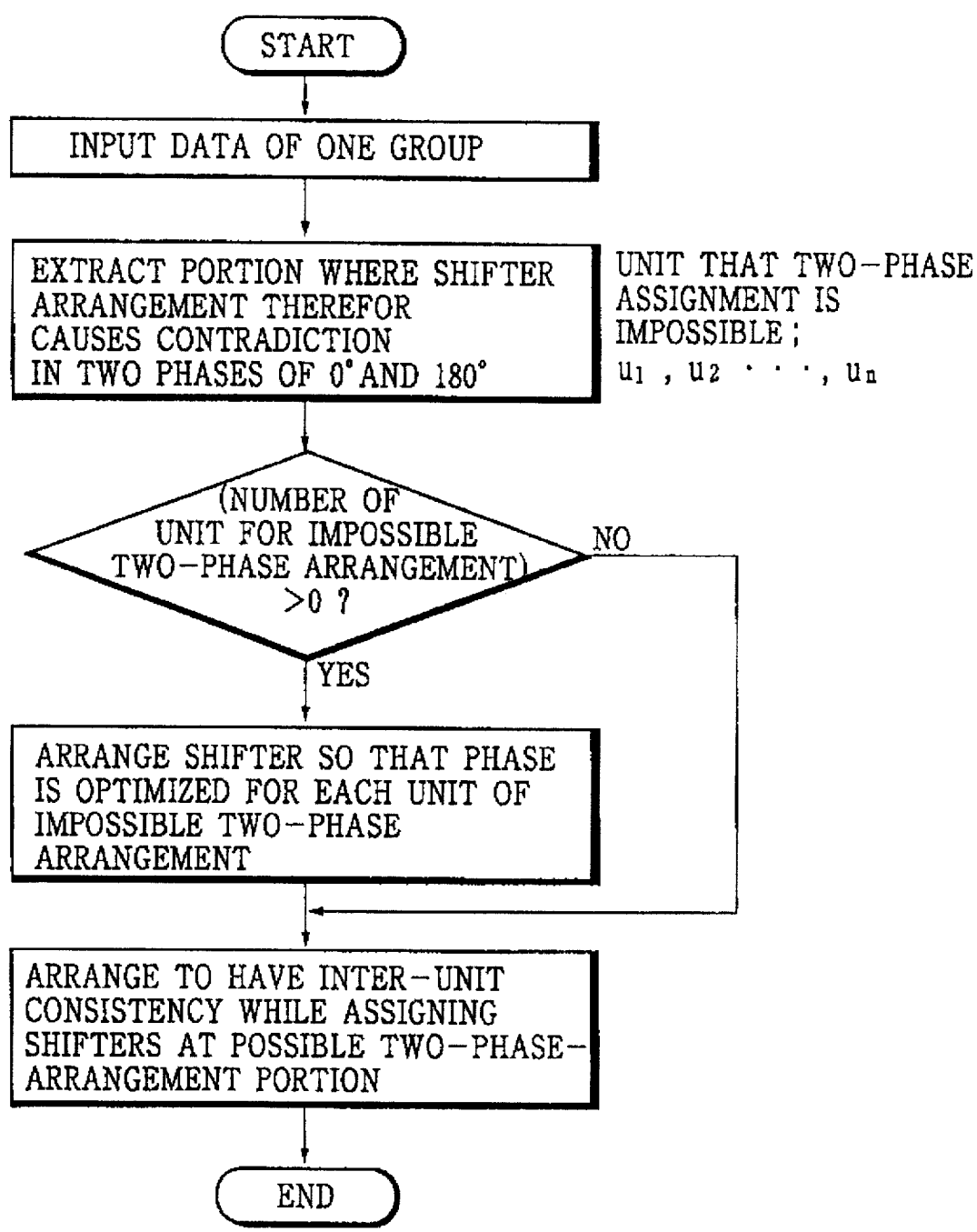
FIG. 43 is a flowchart showing the automatic shifter arranging method, according to the eighth embodiment.

Next, a procedure for automatically assigning the shifters is described in a flowchart shown in FIG. 43. First, a pattern data corresponding to a single group is input from memory 123. Next, the adjacent relationship in the group is expressed in the form of the simplified line-and-node graph, and whether or not the group contains an odd-numbered loop therein is determined. If there exists no spot where the odd-numbered loop is associated in the graph (in other words, if the group does not contain any odd-numbered loop in the group in question), it means that the normal Levenson-type technique can be applied without causing a contradictory spot. In that case, the phase-shifting material is sequentially put to one of a pair of openings which are neighboring at a distance less than the threshold.

For the group containing the odd-numbered loop, the phase thereof is assigned in the following manner. First, the graph is divided into a two-phase-assignment-impossible unit and a line-segment portion connecting units. Now, the two-phase-assignment-impossible unit is a graph such that it contains one odd-numbered loop or it contains both odd-numbered loops and a plurality of other loops associated therewith.

It is to be noted that such a group containing the odd-numbered loop can be the group which is composed of mixed loops of both the odd-numbered loop and the even-numbered loop therein.

Figure 44A:
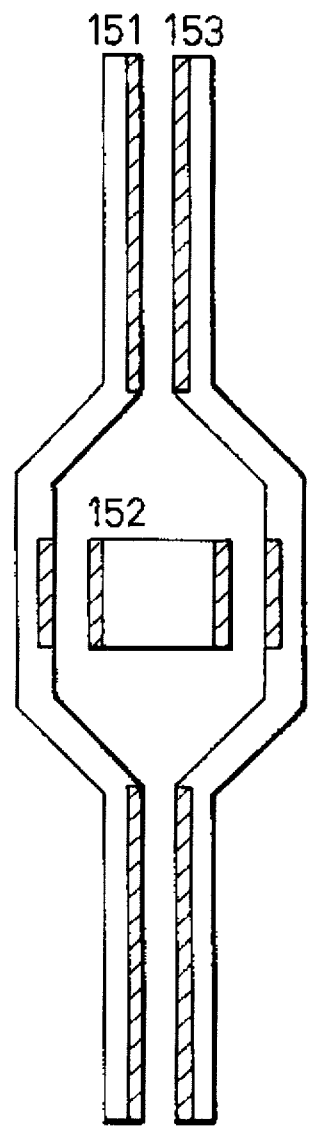
FIGS. 44A and 44B show the automatic shifter arranging method where there exist an odd-numbered loop therein.

For a unit or spot where two-phase (0° and 180°) assignment is not possible, the following steps are executed. Referring to FIG. 44A, when there exists a single odd-numbered loop where the two-phase assignment is impossible, the sum of the length of sides which are neighboring to two figures at a distance less than the threshold is obtained. Then, one among phase-degrees $m_s$ through $m_{n-2}$ is arbitrarily selected to be applied to the shape having the minimum value for the sum of length of sides.

Figure 44B:
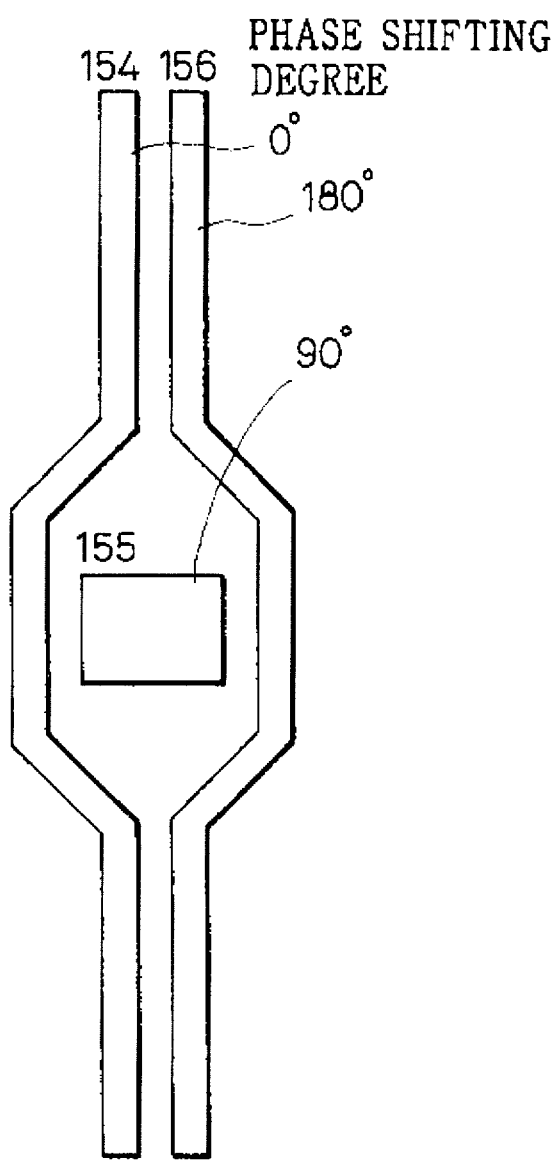

For other figures not belonging to the above figures whose phases are already determined in the above step, the nodes thereof are assigned the phase such that the phase of neighboring figures is differentiated by 180° (namely, 0° or 180°). For example, if $m_3$=90°, the phase shifting thus assigned becomes as shown in FIG. 44B. In the case where, in addition to the single odd-numbered loop where the two-phase assignment is impossible, there are loops where two-phase assignment therefor are also impossible, one phase out of given phase differences $m_1$, $m_2$, $m_3$, ..., $m_{n-2}$ is selected so that adjacent two shapes have different phase from each other. Then, if the adjacent phase for the node can not be differentiated from each other by using all n types of phases, such a state is displayed as error in the execution report.

If there exist plural solution possibilities, the following steps are preferably performed: Obtaining the total sum of the length of spots which are neighboring at a distance less than threshold and are neighboring with phase difference being other than ø' (=ø±t×360°); and Adopting the phase-shifting arrangement having the minimum total sum in the above step, as the phase for each figure in the above unit.

Thereby, each unit is determined the phase therefor such that the length between the pattern facing at 180° becomes the maximum.

Figure 45A:
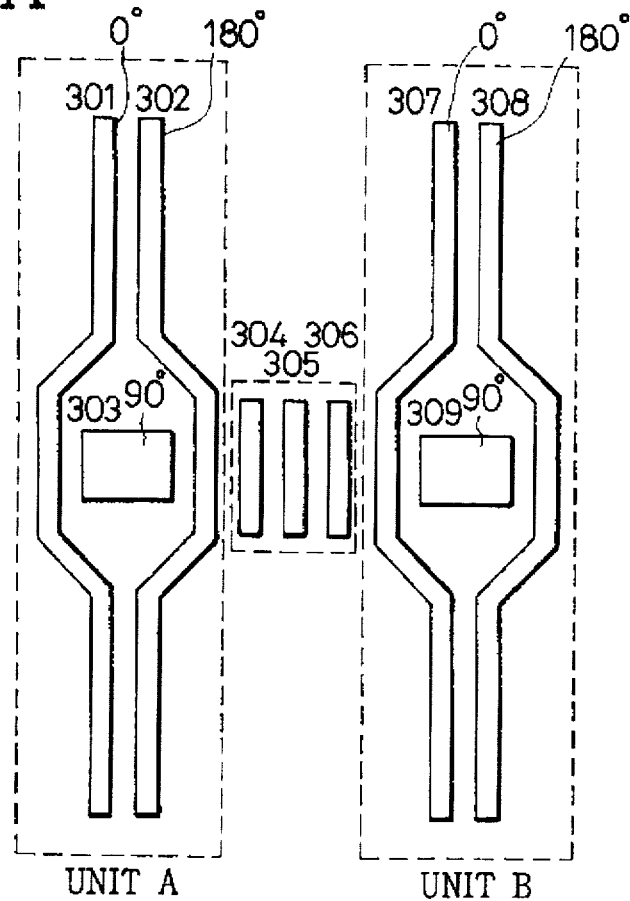
FIGS. 45A through 45C show the automatic shifter arranging method by which a consistency between nodes is manipulated to obtain optimum shifter arrangement.
Figure 45B:
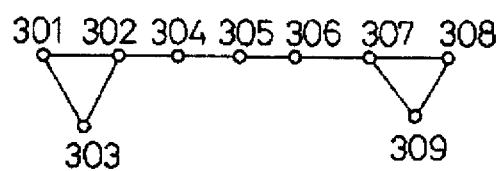
Figure 45C:
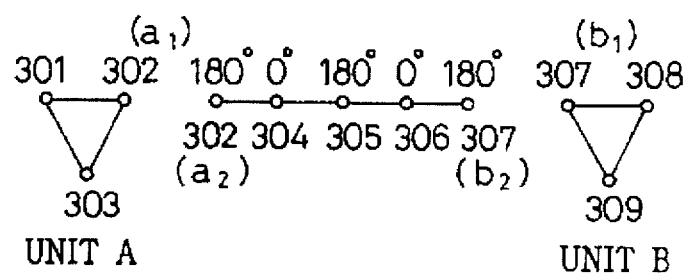

Next, consistency for the phases is manipulated between each unit. With reference to FIGS. 45A through 45C, such a consistency making is described. First, phase is determined at each unit of patterns (FIG. 45A).

Thereafter, an arbitrary unit of patterns is taken out. Then, determined is the phase of a spot of the graph (FIG. 45B) in which the units are connected by the line segments. The phase of node (a2) of the line segment is already determined by the phase of node a1 determined at unit A. The adjacent node is determined the phase thereof such that the phase has a difference of 180° from the adjacent node. Accordingly, in the line-segment graph (FIGS. 45B and 45C), each node's phase is determined in a manner that the phase difference of neighboring nodes is set to 180°. Thereafter, the consistency for the phase for unit B disposed next to the above line segments is obtained. The nodes of unit B is shifted so that node b2 at the end of the line segment is identical to node b1 of unit B. Now, phase-shifting degree is such that øs equals to (the phase of b2—phase of b1). The phase where øs is added to the phase of node belonging to unit B is defined to be a phase-shifting degree of a phase shifter for a pattern corresponding to each node. It is to be noted that the relative phase-shifting degrees between each figure remain intact even if øs is added to the phase of node belonging to unit B. In the example shown in FIG. 45C, a new phase is obtained after 180° is added to the phase of the shape belonging to unit B.

Figure 46:
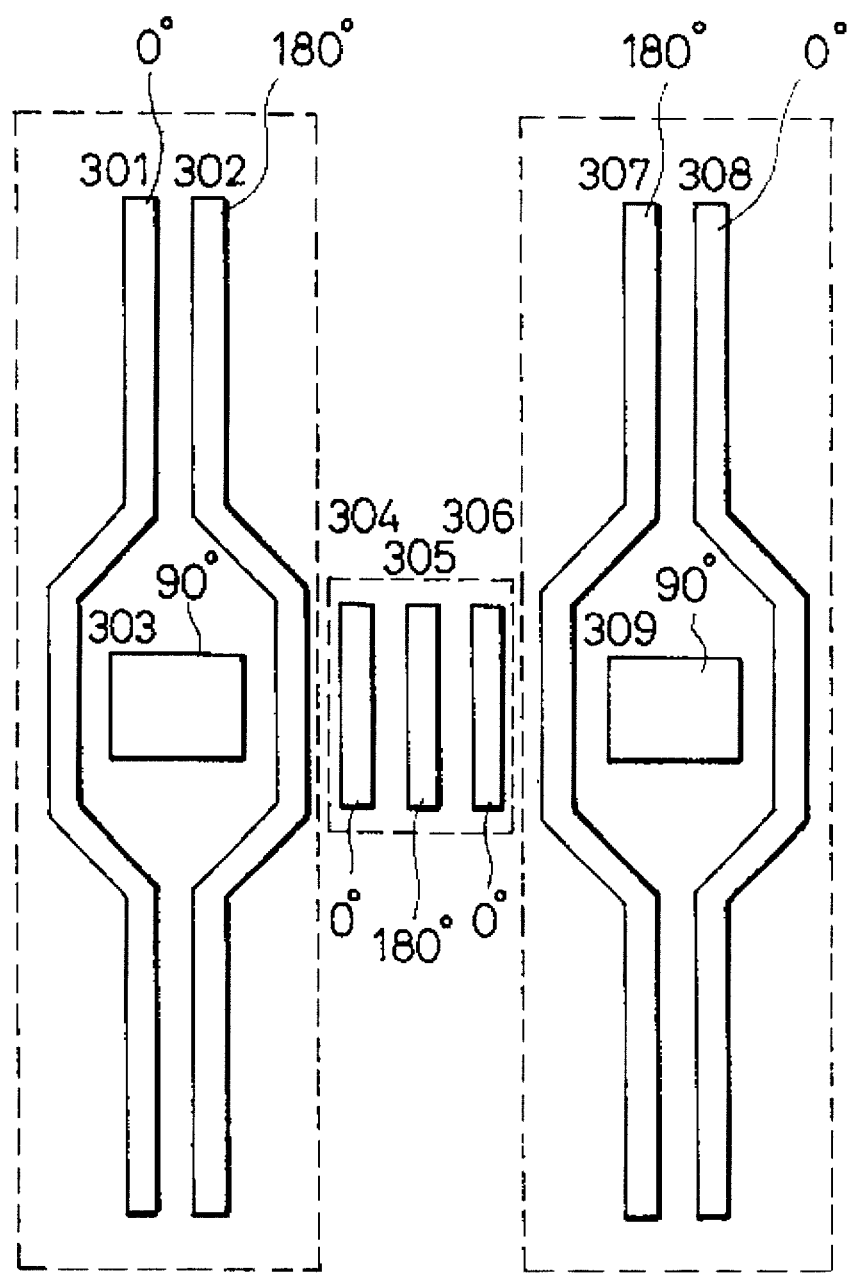
FIG. 46 shows a result of the consistency manipulation shown in FIGS. 45A through 45C.
Figure 47A:
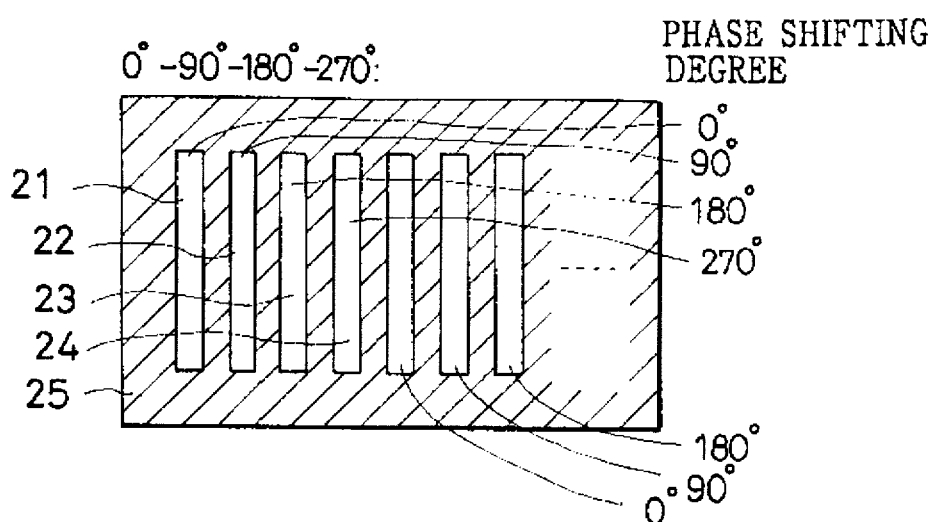
FIGS. 47A through 47C show a case where the phase shifter is placed on the continuously existing patterns.
Figure 47B:
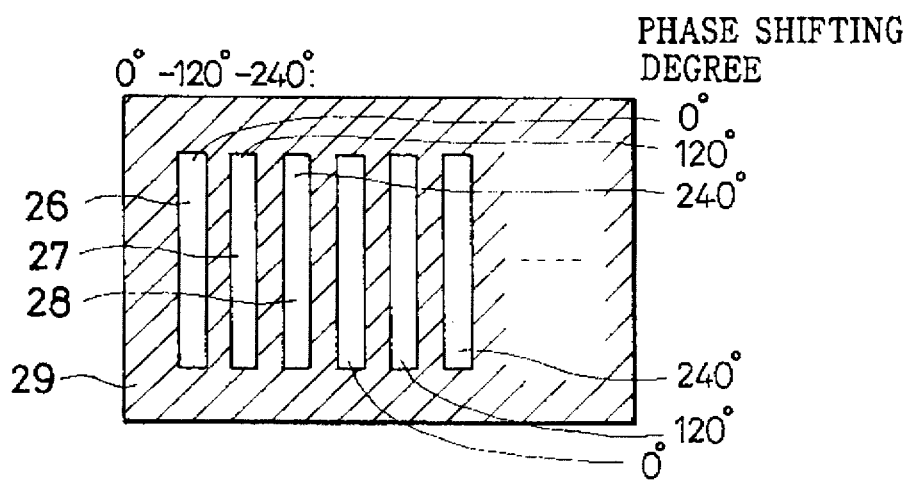
Figure 47C:
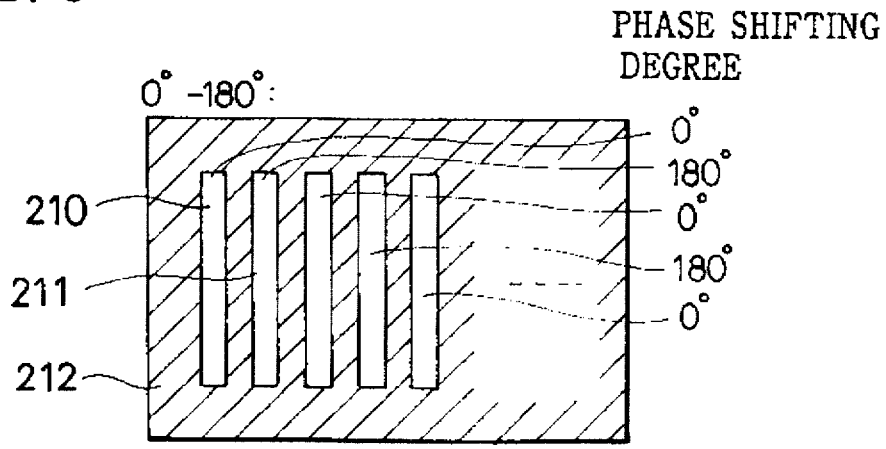

The result of such a consistency making is shown in FIG. 46. The result of such a phase assignment is also displayed in the execution report. Moreover, in the case where, as a result of phase shifting of øs being applied thereto, a certain node of unit B is none of phases among $m_1$, $m_2$, $m_3$, ..., $m_{n-2}$, the group number, unit number and pattern number thereof are displayed in the execution report.

Accordingly, the phase shifters are arranged so that the neighboring patterns at the distance less than threshold can have different phases. Then, there can be obtained an exposure mask with significantly high resolution at an entire layout pattern area which is provided for optimally arranging the shifters in order that the side length having phase difference of 180° becomes the maximum.

Embodiment No. 9

Figure 50A:
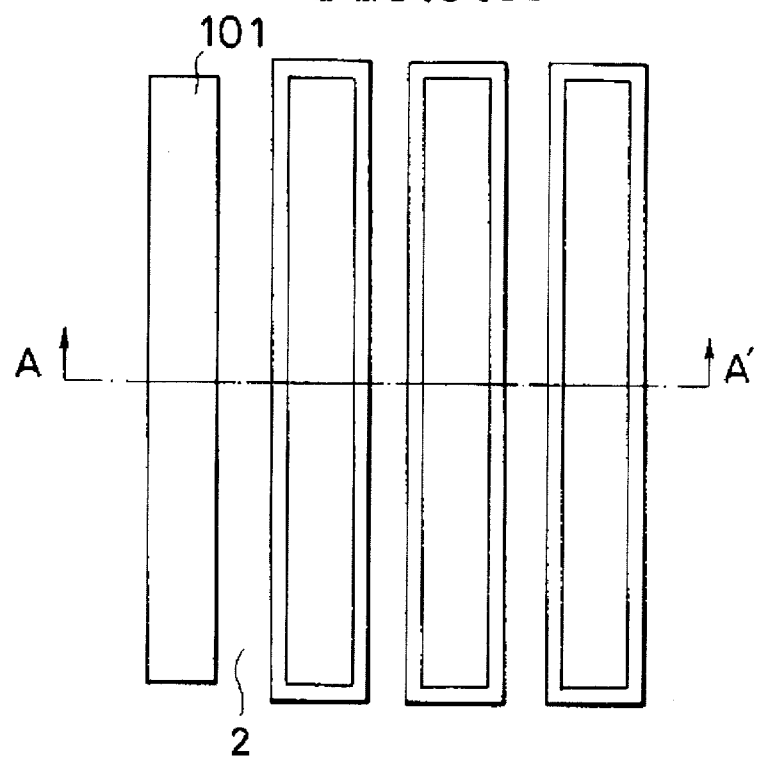
FIGS. 50A through 50C show structures of the phase-shifting mask according to the ninth embodiment.
Figure 50B:
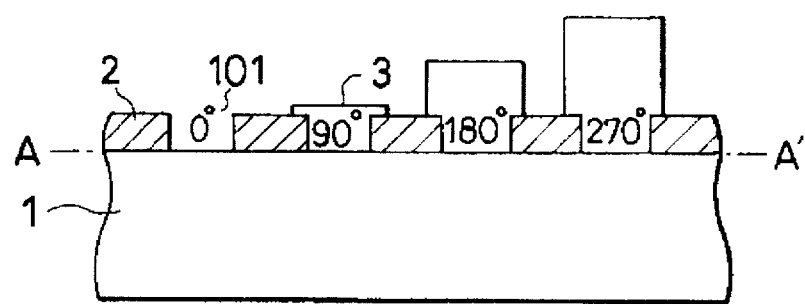
Figure 50C:
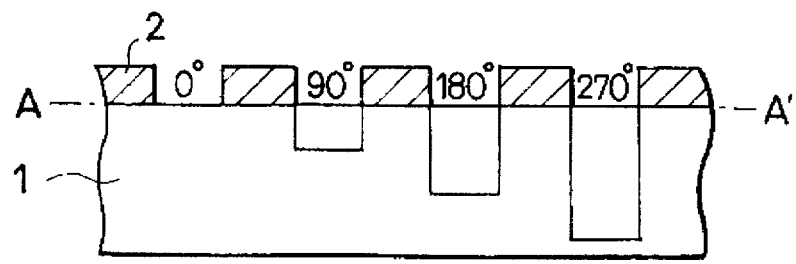

FIGS. 50A through 50C show a structure of the phase-shifting mask according to the ninth embodiment. FIG. 50A is a plan view; FIG. 50B and FIG. 50C are cross sectional view of FIG. 50A taken along lines A—A'. Referring to FIG. 50B, light-shielding film pattern 2 is formed on clear substrate 1. Clear substrate 1 is made of, for example, quartz and light-shielding film 2 is made of, for example, chromium oxide. Phase shifter 3 is formed in an opening region on clear substrate 1. Thickness of the phase shifter 3 is expressed by $$t = \lambda/\{2(n_s-1)\}\phi/180 \qquad (1)$$

where $\lambda$ indicates an exposure wavelength, $n_s$ an index of refraction and $\phi$ a phase difference from ray passing through clear opening portion 101.

Thickness of the phase-shifter formed is identical in the opening region. The material of phase shifter 3 may be $SiO_2$ film or the like formed by liquid deposition, sputtering method, coating method or CVD method.

Now, let the exposure ray be an i-ray ($\lambda$=365 nm), the phase-shifting material be $SiO_2$ film formed in atmosphere of the liquid phase. The index of refraction for the phase shift at the i-ray wavelength is $n_s$=1.446. Thus, if the phase difference is to be 180° between the light passing through phase shifter and the light passing through clear opening portion 101, the film thickness for phase shifter 3 shall be 409 nm according to equation (1). Similarly, if the phase difference is to be 90°, the film thickness shall be 204.5 nm; if 270°, the film thickness shall be 613.5 nm. Then, tolerance for film thickness error is +10% of the desired film thickness.

In the conventional Levenson-Type phase-shifting method, there are available only a single combination of (0°, 180°), so that the circuit designing therefor is very limited. Thus, by adding the phase shifters of 90° and 270°, the combination of differing phases for neighboring patterns are possible with six ways such that (0°, 90°), (0°, 180°), (0°, 270°), (90°, 180°), (90°, 270°) and (180°, 270°), thus significantly reducing a design restraint.

Though there is shown an example where phase shifter 3 is formed on clear substrate 1, the phase shifter may also be formed by means of forming a groove as shown in FIG. 50C. In this case, the degree to form the groove is expressed by equation (1), let alone $n_3$ being the index of refraction of the clear substrate at the exposure wavelength. Then, the tolerance for groove-forming error is ±10% of a desired groove-forming degree.

Accordingly, in the conventional practice using the Levenson-type phase-shifting technique, 180° shifter is alternatively arranged on repetitive patterns such as one for line and space, thus seriously creating the restraint in terms of circuit designing. However, by arranging, the shifters, for example, at 0°, 90°, 180° and 270° according to the ninth embodiment, there can be obtained a sufficient efficiency as a phase-shifting technique, thus significantly improving the degree of freedom for circuit designing.

Specifically, for a pattern portion where a periodic or high resolution is required as in a memory cell array pattern of highly integrated memory device, the combination of (0°, 180°) presenting the relative phase difference of 180° is applied. In other patterns, the shifters are assigned in a manner that the combinations of the differing phase of the neighboring pattern are (0°, 90°), (0°, 180°), (0°, 270°), (90°, 180°), (90°, 270°) or (180°, 270°). Thereby, the cell array portion can obtain high resolution, and other portions can be relieved from the designing restraints.

Embodiment No. 10

FIGS. 51A through 51G are cross sectional views showing a production process for the phase shift masks.

Figure 51A:
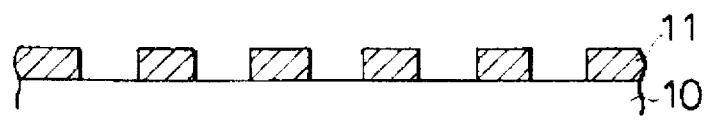
FIGS. 51A through 51G are cross sectional views showing a production process for the phase shift masks.

Referring to FIG. 51A, on clear substrate 10 there is formed a pattern constituted by light-shielding film 11. For example, clear substrate 10 is made of quartz and light-shielding film 11 is made of chromium oxide whose thickness is 100 nm. Thereafter, referring to FIG. 51B, a patterning is performed on a resist so that the resist 12 is formed on clear substrate opening portion 112 on which the 180° shifter is formed, and is formed as well as on clear substrate opening portion 110 where no shifter is formed thereon. In other words, the patterning is trim-performed on the opening portion in which the phase divided by 180° has a decimal portion in the range of 0.44 and 0.55. For the resist patterning, there may be utilized an electron beam or optical lithography.

Thereafter, it is submerged into the liquid phase where silicon oxide is supersaturated. Then, with reference to FIG. 51C, silicon oxide film 13 is deposited over the clear opening portion. The film thickness for the silicon oxide film 13 to be grown then is preferably made such that the phase difference between the light passing through the phase shifter and the ray passing through the clear substrate is close to 90°. Then, the tolerance for the film thickness error of the phase is within ±10%. Now, suppose that the exposure light is the i-ray where k=365 nm. Then, since the index of refraction for silicon oxide formed utilizing the liquid phase deposition technique is $n_s$=1.446 under the wavelength, the film thickness for then grown silicon oxide film 13 is close to the value of 204.5 nm.

Figure 51B:
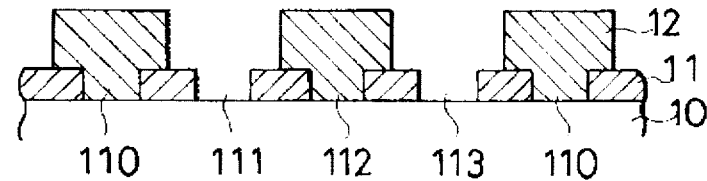
Figure 51C:
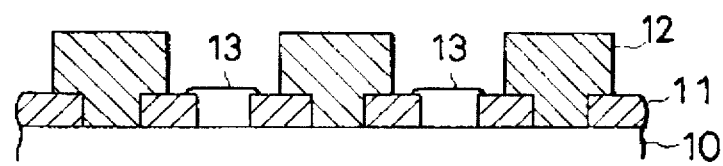
Figure 51D:
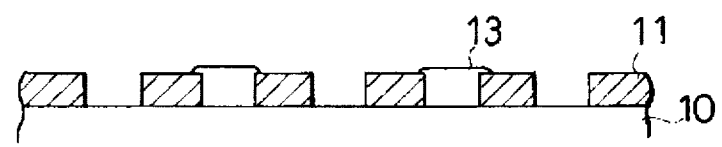
Figure 51E:
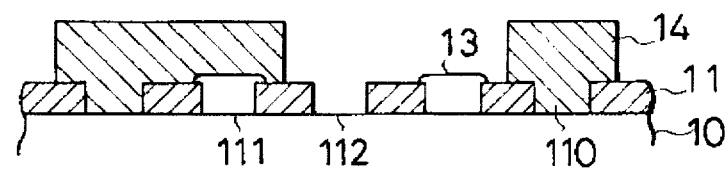
Figure 51F:
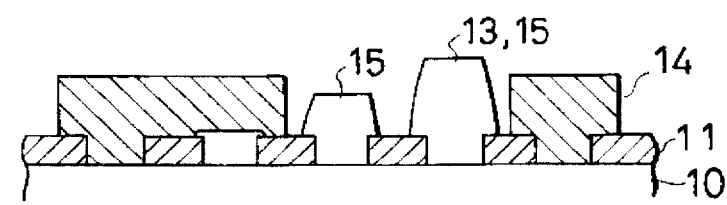
Figure 51G:
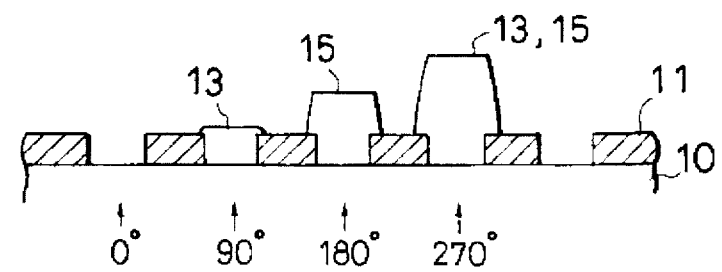

Thereafter, with reference to FIG. 51D, resist 12 is removed by means of SH technique, asher method or the like. Thereafter, with reference to FIG. 51E, the patterning is performed on the resist so that the resist is formed on clear substrate opening portion 110 where the shifter is not formed and on clear substrate opening portion where 90° shifter is formed. In other words, the opening portion where the phase shifter is formed so that value obtained after the phase is divided by 180° is less than 0.94, is trim-patterned. For such resist patterning, there may be utilized an electron beam or optical lithography.

Thereafter, it is submerged into the liquid phase where silicon oxide is supersaturated. Then, with reference to FIG. 51F, silicon oxide film 15 is deposited over the clear opening portion. The film thickness for the silicon oxide film 15 to be grown then is preferably made such that the phase difference between the light passing through the phase shifter and the ray passing through the clear substrate is close to 180°. Then, the tolerance for the film thickness error of the phase within ±10%. Now, suppose that the exposure light is the i-ray where k=365 nm. Then, since the index of refraction for silicon oxide formed utilizing the liquid phase deposition technique is $n_s$=1.446 under the i wavelength, the film thickness for then grown silicon oxide film 13 is close to the value of 409 nm. Thereafter, with reference to FIG. 51G, the resist is removed by means of the SH technique, asher method or the like.

Thereby, by performing the first deposition of silicon oxide film 13, the phase shifter (90°) having thickness of 204.5 nm is formed in substrate opening portion 111. Then, by performing the second growth of silicon oxide film 15, the phase shifter (180°) having thickness of 409 is formed in substrate opening portion 112. By performing both the first and second growth of silicon oxide films 13, 15, there is formed the phase shifter (270°) in the substrate opening portion 113 at a thickness of 13.5 nm.

Accordingly, by employing the production process according to the tenth embodiment where there are three different thickness for the phase shifters (90°, 180°, 270°), the resist patterning on the mask after the light-shielding pattern is formed, is only performed twice, thus reducing overall processing time of the mask production. Moreover, since the 90° phase shifter is started first (in S other words, the shifter with thinner film thickness is started first), the effect possibly caused by a sharp drop or level difference (that is, the level difference between the phase shifter and the light-shielding) can be suppressed to a minimum in the event of the second resist patterning (see FIG. 51E).

Embodiment No. 11

FIGS. 52A through 52G show a production process according to the eleventh embodiment.

In this embodiment, there will be described a process for making the phase shift by utilizing a method of coating liquid-state silicon oxide film such as SOG (spin on glass), the sputtering method, the CVD method or the like.

Figure 52A:
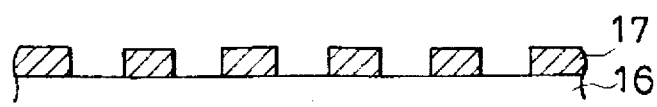
FIGS. 52A through 52G show a production process according to the eleventh embodiment.

First, referring to FIG. 52A, a pattern constituted by light-shielding film 17 is formed on clear substrate 16. For example, clear substrate 16 is made of quartz and light-shielding film 17 is made of chromium oxide whose thickness is 100 nm.

Figure 52B:
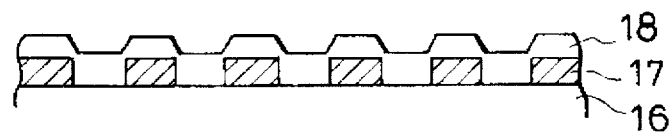

Thereafter, with reference to FIG. 52B, by utilizing a method of coating liquid-state silicon oxide film such as SOG, the sputtering method, the CVD method or the like, silicon oxide film 18 is deposited over the whole surface of the mask. Then, the film thickness of silicon oxide film 18 to be formed is determined such that the phase difference between the light passing through the phase shifter and the light passing through the clear substrate is as close to 90° as possible. Then, the tolerance for the film thickness error of the phase shifter is within ±10% of the desired film thickness. Now, suppose that the exposure light is the i-ray where $\lambda=365$ nm. Then, since the index of refraction for silicon oxide formed utilizing the CVD technique is $n_s=1.446$ under the i wavelength, the film thickness for then grown silicon oxide film 18 is close to the value of 204.5 nm.

Figure 52C:
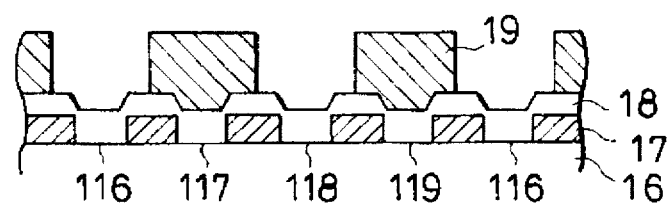

Thereafter, with reference to FIG. 52C, the patterning is performed so that resist 119 is formed on clear substrate opening portion 117 where 90° shifter is formed and the clear substrate opening portion 119 where 270° shifter is formed. In other words, the opening portion where the phase shifter is formed so that decimal portion obtained after the phase is divided by 180° is in the range of 0.44–0.55, is trim-patterned. For such the resist patterning, there may be utilized the electron beam or optical lithography.

Figure 52D:
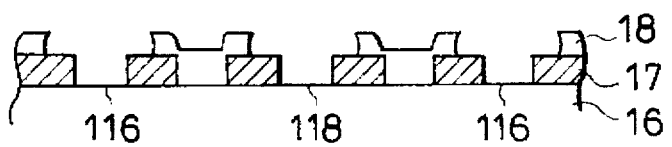

Thereafter, with reference to FIG. 52D, silicon oxide is removed by etching; the silicon oxide is deposited over both clear substrate opening portion 116 where shifter is not formed and clear substrate opening portion 118 where 180° shifter is to be formed. The etching may be of either anisotropic or isotropic one.

Figure 52E:
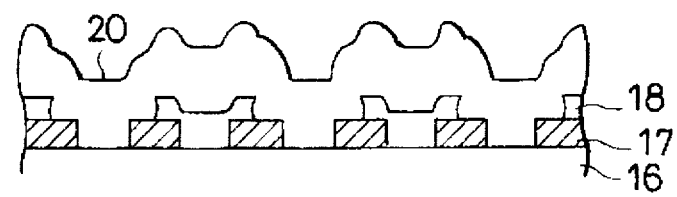

Thereafter, with reference to FIG. 52E, silicon oxide film 20 is deposited over the entire surface of the mask by utilizing the method of coating the liquid-state silicon oxide film such as a SOG, the sputtering technique or the CVD. Then, the film thickness is such that the phase difference between the light passing through the phase shifter and the light passing through the clear substrate is as close to 180° as possible. Then, the tolerance of the film thickness error for the phase shifter is within ±10% of the desired film thickness. Now, suppose that the exposure light is the i-ray where $\lambda=365$ nm. Then, since the index of refraction for silicon oxide formed utilizing the CVD technique is $n_s=1.446$ under the i wavelength, the film thickness for then grown silicon oxide film 20 is close to the value of 409 nm.

Figure 52F:
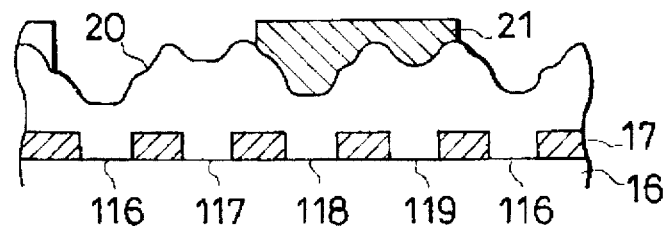
Figure 52G:
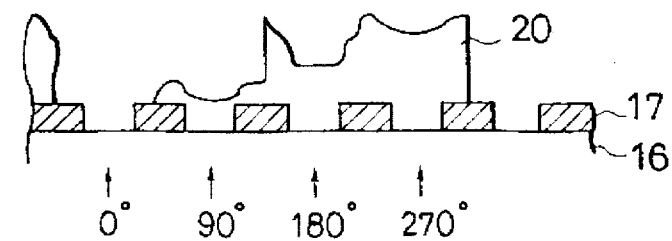

Thereafter, with reference to FIG. 52F, the patterning is performed so that resist 21 is formed on clear substrate opening portion 118 where 180° shifter is formed and the clear substrate opening portion 119 where 270° shifter is formed. In other words, the opening portion where the phase shifter is formed so that decimal portion obtained after the phase is divided by 180° is less than 0.94, is trim-patterned. For such the resist patterning, there may be utilized the electron beam or optical lithography.

Thereafter, with reference to FIG. 52F, removed by the etching is the silicon oxide film formed on clear substrate opening portion 116 where no shifter is formed and clear substrate opening portion 117 where 90° shifter is formed. The etching may be performed by either anisotropic or isotropic one. Thereafter, the resist is removed by use of the SH method, the asher method or the like.

In this embodiment, the resist patterning on the mask is performed only twice after the light-shielding pattern is formed, thereby obtaining the three different phase shifter film thickness for 90°, 180° and 270°. Accordingly, the similar effects can be realized as in the tenth embodiment.

Embodiment No. 12

FIGS. 53A through 53G are cross sectional views showing a production process for the phase shift masks. In this embodiment, there will be described a method for making the phase-shifting mask by utilizing an etching technique.

Figure 53A:
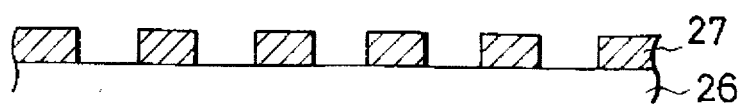
FIGS. 53A through 53G are cross sectional views showing a production process for the phase shift masks.
Figure 53B:
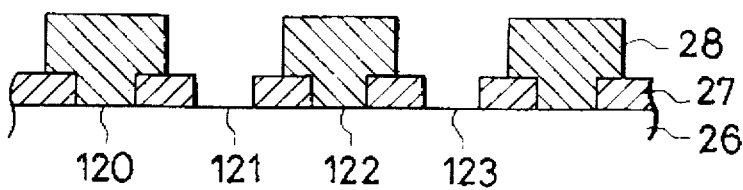

Referring to FIG. 53A, on clear substrate 26 there is formed a pattern constituted by light-shielding film 27. For example, clear substrate 26 is made of quartz and light-shielding film 27 is made of chromium oxide whose thickness is 100 nm.

Thereafter, referring to FIG. 51B, a patterning is performed on a resist so that the resist 28 is formed on clear substrate opening portion 122 on which the 180° shifter is formed, and is formed as well as on clear substrate opening portion 120 where no shifter is formed thereon. For the resist patterning, there may be utilized an electron beam or optical lithography. In other words, the opening portion where the phase divided by 180° has a decimal portion in the range of 0.44 and 0.55, is engraved so as to form a pattern.

Figure 53C:
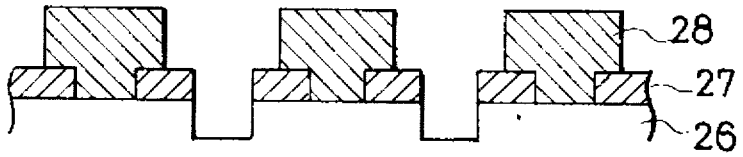
Figure 53D:
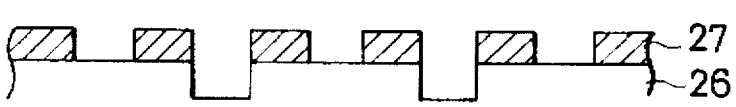

Thereafter, with reference to FIG. 53C, the etching is performed on clear substrate 26. Such the etching may be performed either by anisotropic or isotropic one. Depth of the etching is such that the film thickness therefor realizes that the phase difference between the the light transmitted through the etching portion and the light transmitted through clear substrate 26, becomes close to 90°. Then, the tolerance for the etching depth error is within ±10% of the desired etching degree. Now, suppose that the exposure light is the i-ray where $\lambda=365$ nm and that clear substrate 26 is quartz. Then, since the index of refraction for the quartz is $n_s=1.446$ under the wavelength, the etching depth becomes close to the value of 204.5 nm. Thereafter, resist 28 is removed by use of the SH method, asher technique or the like.

Figure 53E:
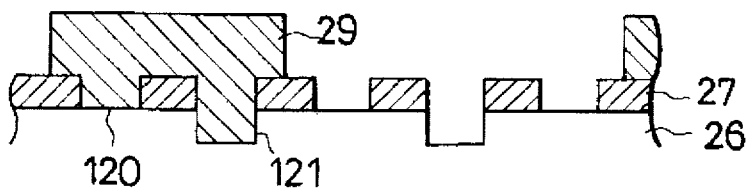
Figure 53F:
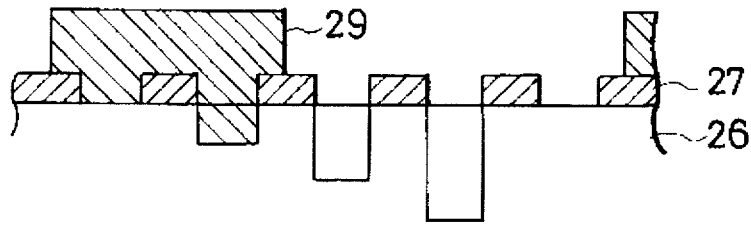
Figure 53G:
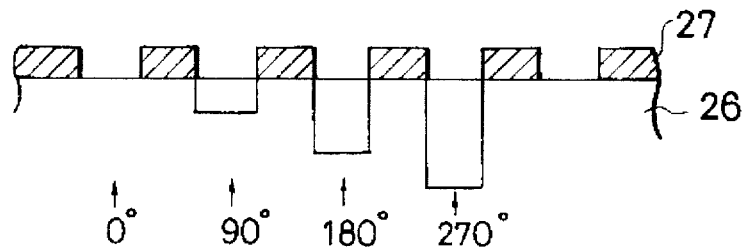

Thereafter, with reference to FIG. 53E, the patterning is performed on the resist so that the resist 29 is formed on clear substrate opening portion 120 where the shifter is not formed and on clear substrate opening portion 121 where 90° shifter is formed. In other words, the opening portion where the phase shifter is formed so that value obtained after the phase is divided by 180° is less than 0.94, is engraved so as to form a pattern. For such the resist patterning, there may be utilized an electron beam or optical lithography.

Thereafter, with reference to FIG. 53E, the etching is performed on clear substrate 26. Such the etching may be performed either by anisotropic or isotropic one. Depth of the etching is such that the film thickness therefor realizes that the phase difference between the the light transmitted through the etching portion and the light transmitted through clear substrate 26, becomes close to 180°. Then, the tolerance for the etching depth error is within ±10% of the desired etching degree. Now, suppose that the exposure light is the i-ray where λ=365 nm and that clear substrate 26 is quartz. Then, since the index of refraction for the quartz is $n_s$=1.446 under the i wavelength, the etching depth becomes close to the value of 409 nm. Thereafter, with reference to FIG. 53G, resist 29 is removed by use of the SH method, asher technique or the like.

Thereby, by the first etching, there is formed the phase shifter (90°) in substrate opening portion 121 with the etching depth being 204.5 nm. By the second etching, there is formed the phase shifter (180°) in substrate opening portion 122 with the etching depth being 409 nm. By both the first and second etching, there is formed the phase shifter (270°) in substrate opening portion 123 with the etching depth being 613.5 nm.

Accordingly, by employing the production process according to the twelfth embodiment where there are three different thickness for the phase shifters (90°, 180°, 270°), the resist patterning on the mask after the light-shielding pattern is formed, is only performed twice, thus reducing overall processing time of the mask production. Moreover, since the 90° phase shifter is produced at first (in other words, the shifter having shallower etching depth is produced at first), the effect possibly caused by a sharp drop or level difference (that is, the level difference between the phase shifter and the light-shielding) can be suppressed to a minimum in the event of the second resist patterning (see FIG. 53E).

Embodiment No. 13

Figure 54:
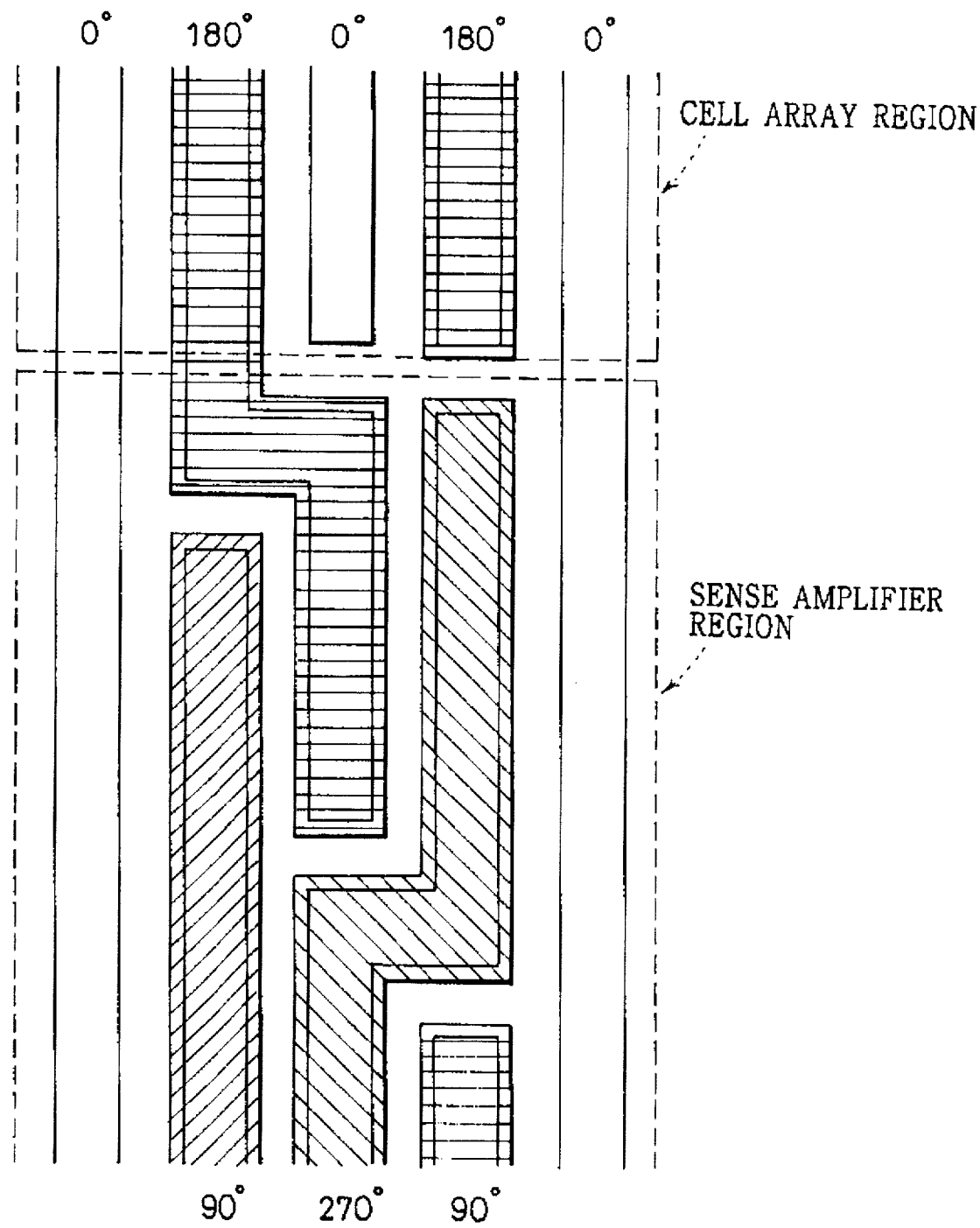
FIG. 54 is a plan view for assigning the phase-shifting mask, according to the thirteenth embodiment of the present invention.

FIG. 54 is a plan view for assigning the phase-shifting mask, according to the thirteenth embodiment of the present invention. For comparison reason, there is shown an example of the conventional shifter arrangement in FIG. 55. In respective FIGS. 54 and 55, the cell array region constituted by the periodic patterns and the sense amplifier region constituted by non-periodic patterns are enclosed by the dotted lines.

Figure 55:
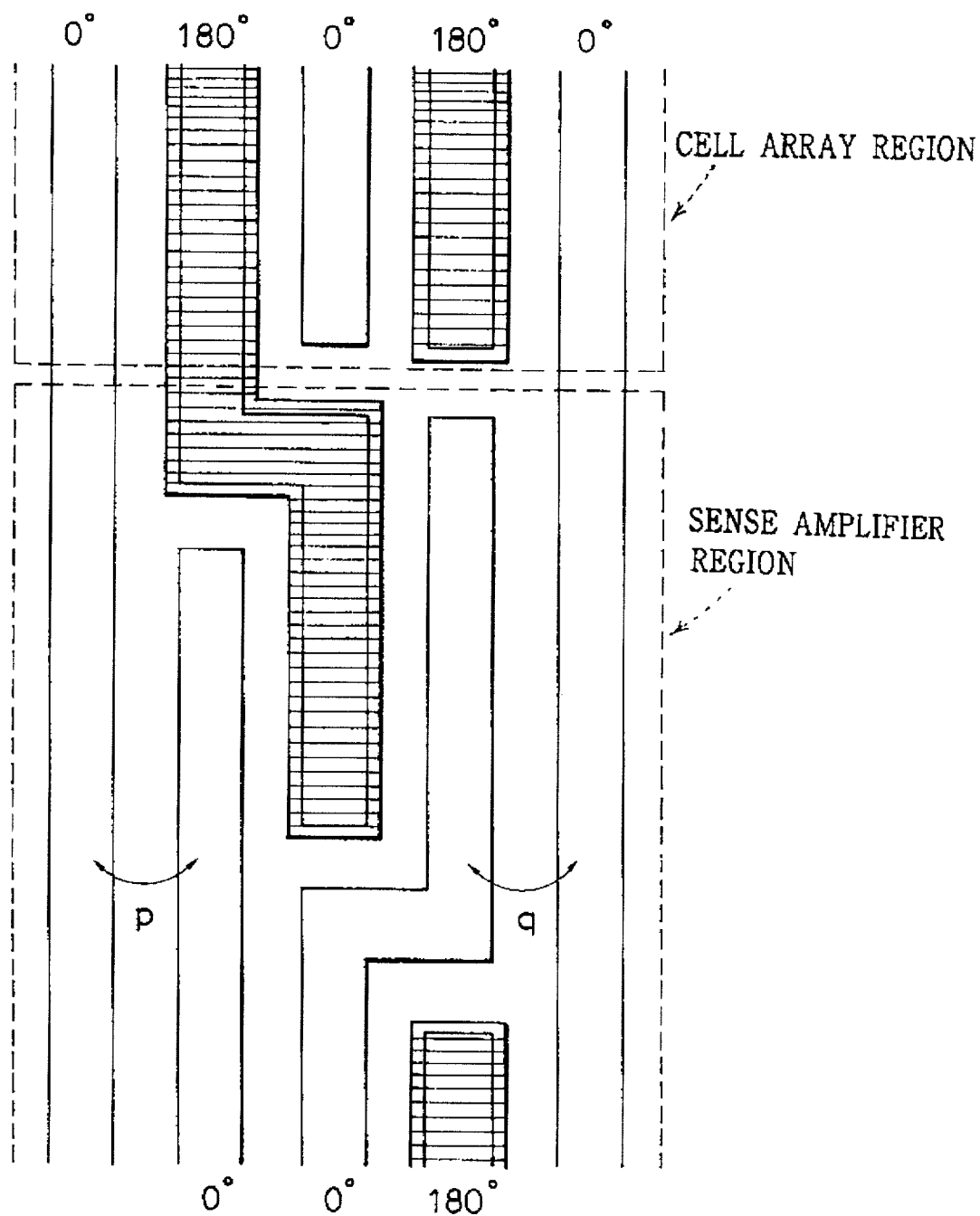
FIG. 55 is an example for the conventional shifter arrangement.

In the conventional example shown in FIG. 55, the shifters are arranged with only two phases of 0° and 180°. In the portion such as a cell array portion which constitutes a periodic pattern therein, the presence of film-thick shifter corresponding to 180° is sufficient so that the phase of the ray transmitting through the neighboring opening portion can be differentiated desirably. However, in the extending portion from the cell array portion (the extending portion such as the the sense amplifying portion) the portion with identical phase exists (see p, q in FIG. 55). In such a contradictory spot where the portion in question have the same phase as each other, the effect gained by the phase-shifting technique is significantly reduced. Accordingly, the patterns in a contradictory spot must be rewritten. As have been evidenced above, the designing method where the shifters are assigned to the opening portion by use of only two phases 0° and 180°, causes a serious limitation to optimum circuit designing.

Figure 66:
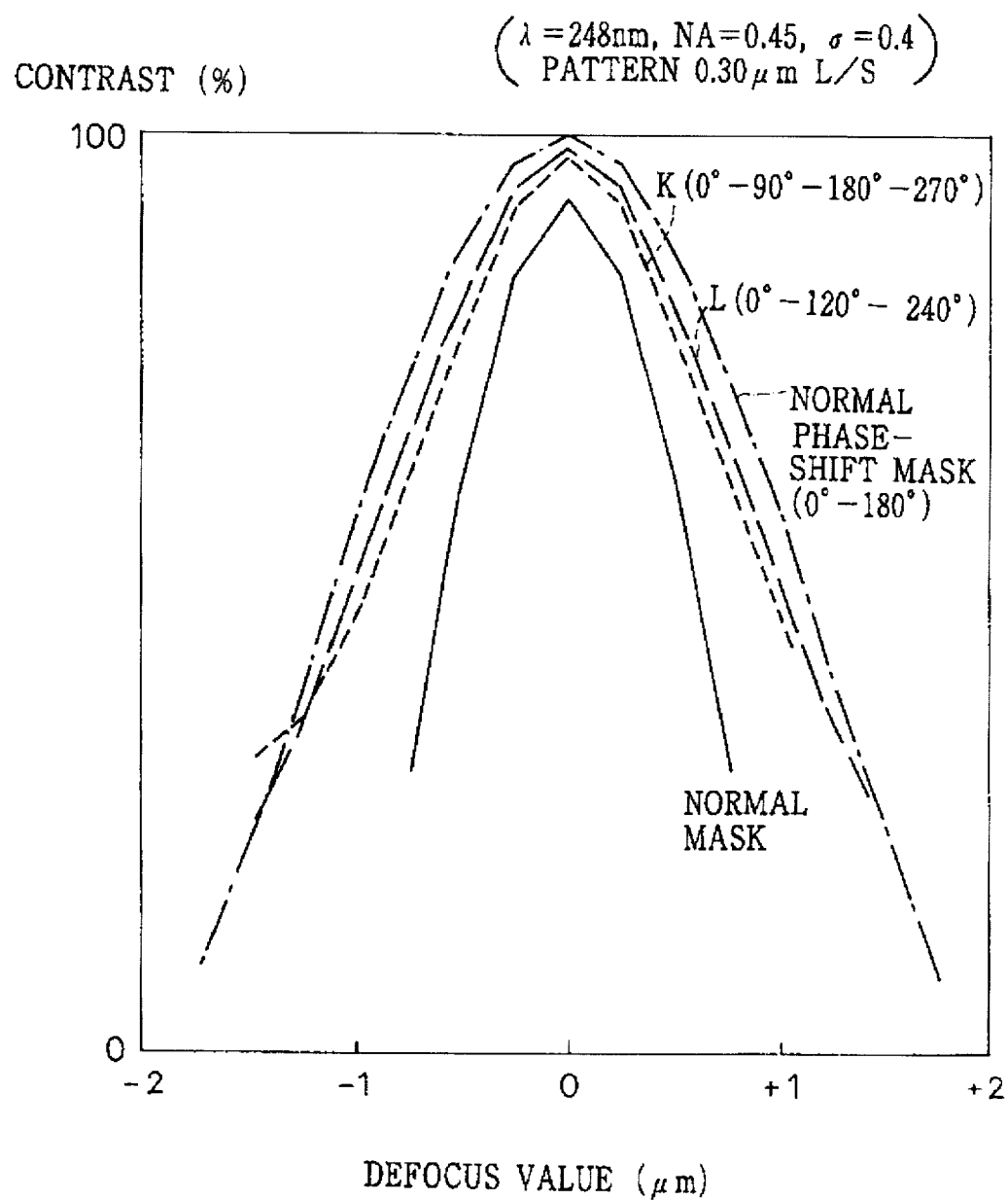
FIG. 66 is a graph showing relationship between various phase assignments in terms of defocus value and contrast, similar to FIG. 49.

In contrast to the above conventional example, in FIG. 54 there is shown the shifter arrangement having shifters of 90° and 270' in addition to 0° and 180°. When the four types of phases (0°, 90°, 180°, 270°) are used, the phase difference would be 90° or 180° if the phase of light transmitting through the neighboring opening portion is intended to be differentiated. As shown in FIG. 66, the phase difference of the light transmitting through the neighboring opening portion gives out best resolution when it is 180°. In this connection, the shifters are preferably arranged in an alternative manner of 0°, 180°, 0°, 180° and so on, especially for area of patterns, such as the cell array portion, presenting a simple repetition. Notice that the cell portion in DRAM often takes the form of three-dimensional structure such as a trench or stack, so that such a structure requires very high resolution.

In this embodiment, the phases of 90° and 270° are additionally provided to a spot where the phase of the light transmitting through the opening portion becomes the same phase in the sense amplifier portion under the conventional practice. By employing this embodiment, the phase of the light passing through neighboring opening portion can be made different even in the sense amplifier portion, thus duly obtaining the phase-shifting effect thereby. Therefore, significantly reduced is the portion where the phases passing through the neighboring opening portion are identical to each other. As a result, there is no more need to enlarge the dimension where contraction often occurs. According to the thirteenth embodiment, designing restraints are significantly lessened as well.

Embodiment No. 14

Figure 56A:
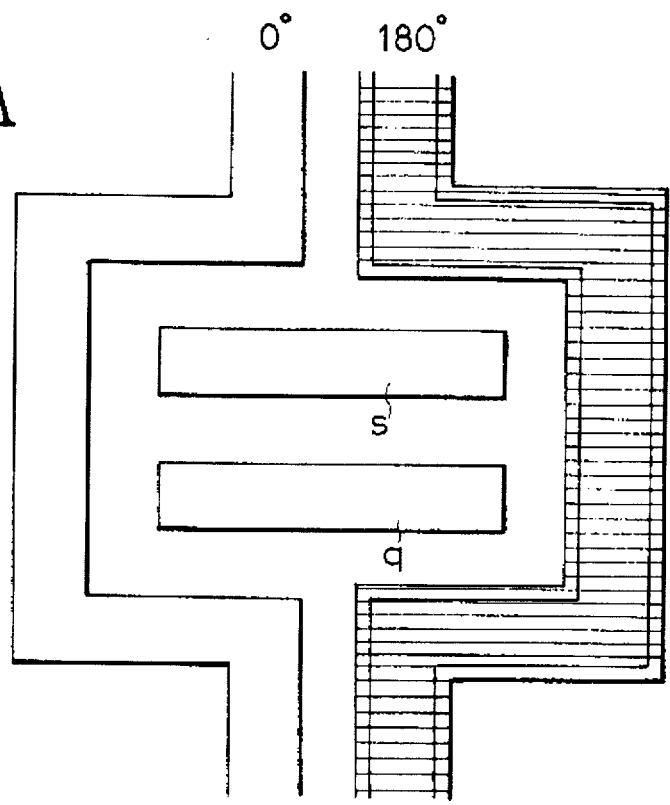
FIG. 56A is a plan view showing shifter arrangement for phase-shifting mask, according to the fourteenth embodiment.
Figure 56B:
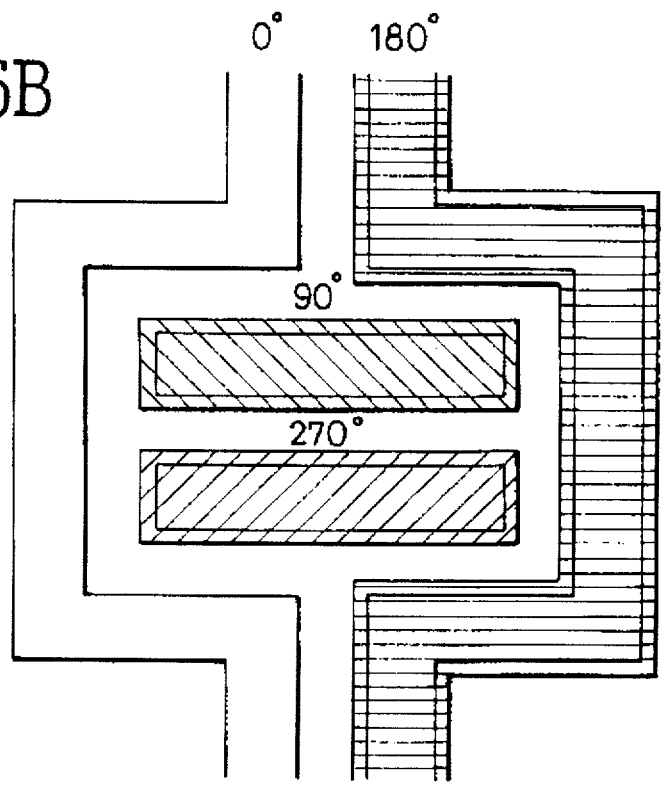
FIG. 56B is the conventional example.

FIG. 56B is a plan view showing shifter arrangement for phase-shifting mask, according to the fourteenth embodiment. FIG. 56A shows the conventional example, where the shifters are given in the opening portion at phases of only 0° and 180°. In the conventional Levenson-type phase shifting technique, a single combination of (0°, 180°) is only available to form phase-shifting mask. Thus, even if either of 0° or 180° phase is assigned to s and q shown in FIG. 56A, there is still caused a case where the neighboring pattern has the same phase to each other. Thereby, the phase-shifting method loses its effectiveness in such a spot.

In view of such a drawback in the conventional technology, patterns s and q are given additional combination of phases 90° and 70°, as shown in FIG. 56B. Thereby, there are obtained combinations of (0°, 90°), (0°, 180°), (0°, 270°), (90°, 180°), (90°, 270°) and (180°, 270°) where the phases of neighboring pattern differ from each other. Thus, there are obtained six separate combinations so that phases of the neighboring patterns mutually differ, thus giving rise to effectiveness as the phase-shifting technique.

Embodiment No. 15

Figure 57:
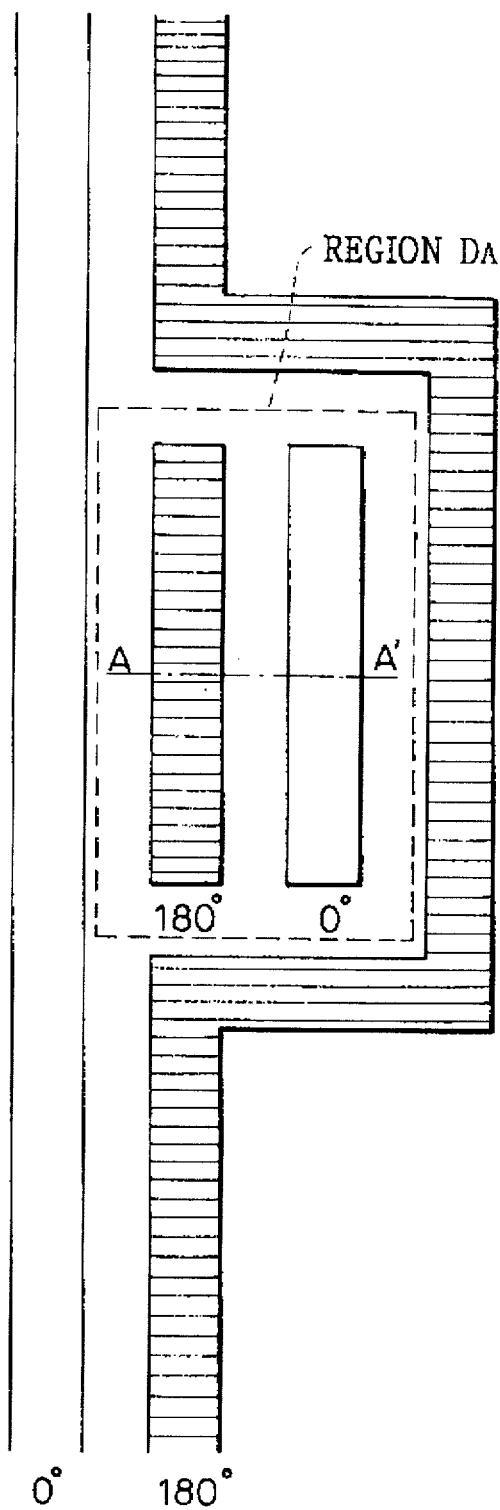
FIG. 57 is a plan view showing an example of phase shifter arrangement of the phase-shifting mask, according to the fifteenth embodiment.

FIG. 57 is a plan view showing an example of phase shifter arrangement of the phase-shifting mask, according to the fifteenth embodiment.

In this embodiment, first, there are provided two arbitrary opening portions which are parallel to each other. Second, these are provided another two opening portions (see region $D_A$ indicated within the dotted line in FIG. 57) which are enclosed by said two parallel opening portions along longer sides thereof. Notice that the number of openings existing along a given vertical cross section taken along line A—A' is two which is an even number. In this case, the phase shifters therefor is assigned so that the phase difference for rays transmitted trough the neighboring opening portions is set to as close to as 180°.

By arranging the phase shifters accordingly, the relative phase for the light transmitted through the neighboring opening portions is always approximately 180°. Thereby, such phase assignment serves as a sufficiently effective phase-shifting technique. Moreover, patterns produced by use of such masks produce sufficiently high resolution.

Embodiment No. 16

Figure 58:
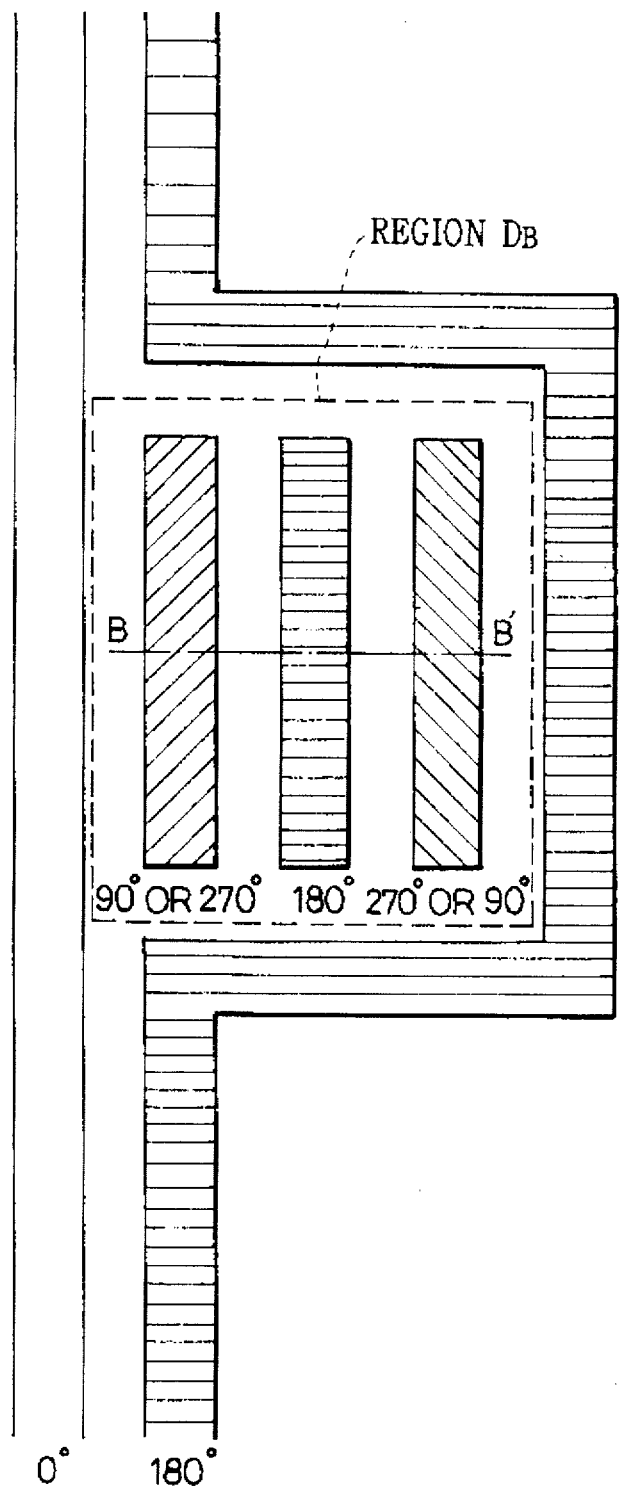
FIG. 58 is a plan view showing an example for the phase shifter arrangement of the phase-shifting mask, according to the sixteenth embodiment.

FIG. 58 is a plan view showing an example for the phase shifter arrangement of the phase-shifting mask, according to the sixteenth embodiment.

In this embodiment, first, there are provided two arbitrary opening portions which are parallel to each other. Second, these are provided another set of opening portions (see region $D_S$ indicated within the dotted line in FIG. 58) which are enclosed by said two parallel opening portions along longer sides thereof. Notice that the number of openings existing along a given vertical cross section taken along line B—B' is three which is an odd number. In this case, the phase shifters therefor is assigned so that the phase difference for rays transmitted trough the neighboring opening portions is set to as close to as 90°.

By arranging the phase shifters accordingly, the relative phase for the light transmitted through the neighboring opening portions is always approximately 90°. Thereby, such phase assignment serves as a sufficiently effective phase-shifting technique. Moreover, patterns produced by use of such masks produce sufficiently high resolution.

Embodiment No. 17

Figure 59:
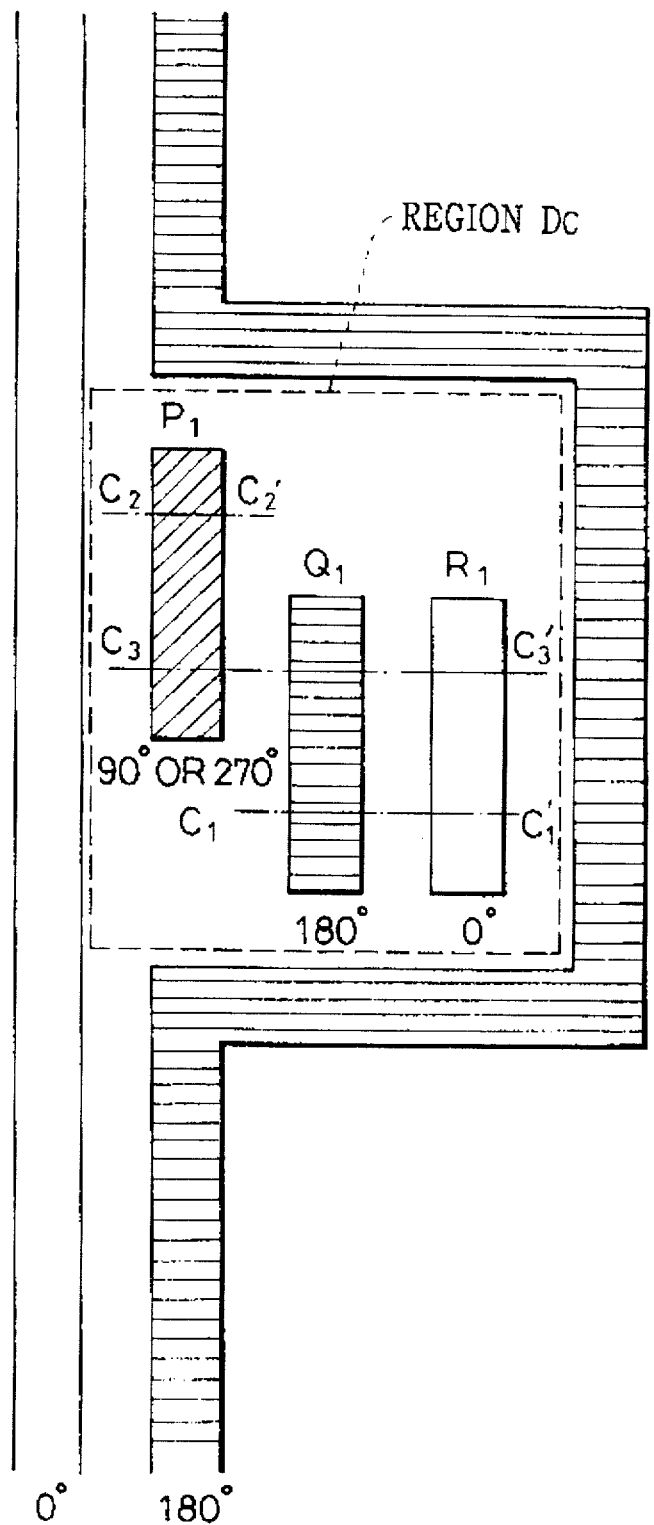
FIG. 59 is a plan view showing an example for the phase shifter arrangement or the phase-shifting mask, according to the seventeenth embodiment.

FIG. 59 is a plan view showing an example for the phase shifter arrangement of the phase-shifting mask, according to the seventeenth embodiment.

In this embodiment, first, there are provided two arbitrary opening portions which are parallel to each other. Second, these are provided another set of opening portions (see region $D_C$ indicated within the dotted line in FIG. 59) which are enclosed by said two parallel opening portions along longer sides thereof. Notice that the number of openings existing along a given vertical cross section is either even number or odd number, thus being mixed in a case of even or odd number. Namely, it is two (even) when taken along line C1—C1', is one (odd) when taken along with line C2—C2', and is three (odd) when taken along with line C3—CS'.

In this case where there is one even-numbered spot and there are plural odd-numbered spots, first, the relative phase of light transmitted through the neighboring opening portion is set to as close to as 180° in the even-numbered spot (Q1 being set to approximately 180° and R1 being set to approximately 0° in the cross section C1—C1'). Secondly, in the rest of spots, the relative phase therefor is set to as close to as 90°. In other words, P1 is set to approximately 90° or 270° in the cross sections of C2—C2' and C3—C3'.

By arranging the phase shifters accordingly, the relative phase for the light transmitted through the neighboring opening portions is always approximately 180° or 90°. Thereby, such phase assignment serves as a sufficiently effective phase-shifting technique. Moreover, patterns produced by use of such masks produce sufficiently high resolution.

Embodiment No. 18

Figure 60:
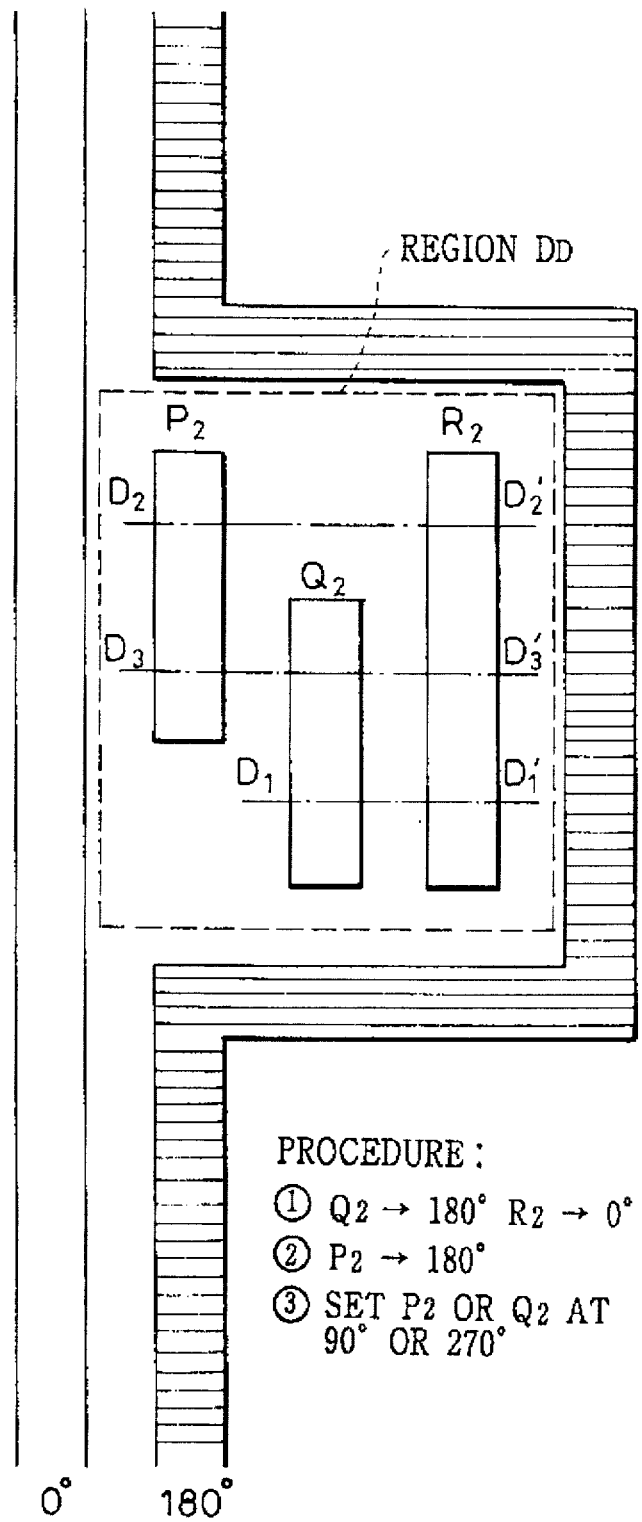
FIG. 60 is a plan view showing an example for the phase shifter arrangement of the phase-shifting mask, according to tile eighteenth embodiment.

FIG. 60 is a plan view showing an example for the phase shifter arrangement of the phase-shifting mask, according to the eighteenth embodiment.

In this embodiment, the relative phase difference between the light transmitted through the neighboring opening portion is set to as close to as 180°. First, there are provided two arbitrary opening portions which are parallel to each other. Second, these are provided another set of opening portions (see region $D_D$ indicated within the dotted line in FIG. 60) which are enclosed by said two parallel opening portions along longer sides thereof. Notice that the number of openings existing along a given vertical cross section is mixed in case of even or odd number. Namely, it is two (even) when taken along lines D1—D1' and D2—D2', is three (odd) when taken along with line D3—D3'.

In this case where there is one odd-numbered spot and there are plural even-numbered spots (corresponding to cross sections along lines D1—D1' and D2—D2' in FIG. 60), first, the relative phase of light transmitted through the neighboring opening portion is set to as close to as 180° in one spot among the plural even-numbered spots (Q2 being set to approximately 180° and R2 being set to approximately 0° in the cross section D1—D1'). Secondly, in the rest of even-numbered spots (cross section taken along line D2—D2' in the figure), the relative phase therefor is set to as close to as 180° (namely, P2 being set to as close to as 180° in cross section D2—D2' in the figure). Then, the phase difference between P2 and Q2 becomes 0°, thus in this spot the phase shift effect therefor is not obtained. Thus, either P2 or Q2 is set to as close to as 270°. Thereby, the phase difference between P2 and Q2 becomes 90°, thus obtaining the phase shifting effect.

By arranging the phase shifters accordingly, the relative phase for the light transmitted through the neighboring opening portions is always approximately 180° or 90°. Moreover, the relative phase difference 180° is set first, thereby generating more phase shifting efficiency compared to the 90° setting. It is to be noted here again that the efficiency for phase-shifting technique is higher when set to 180° of phase difference, compared to 90°, as evidenced in FIG. 66. Such phase assignment serves as a very effective phase-shifting technique, so that patterns produced by use of such masks produce very high resolution.

Embodiment No. 19

Figure 61:
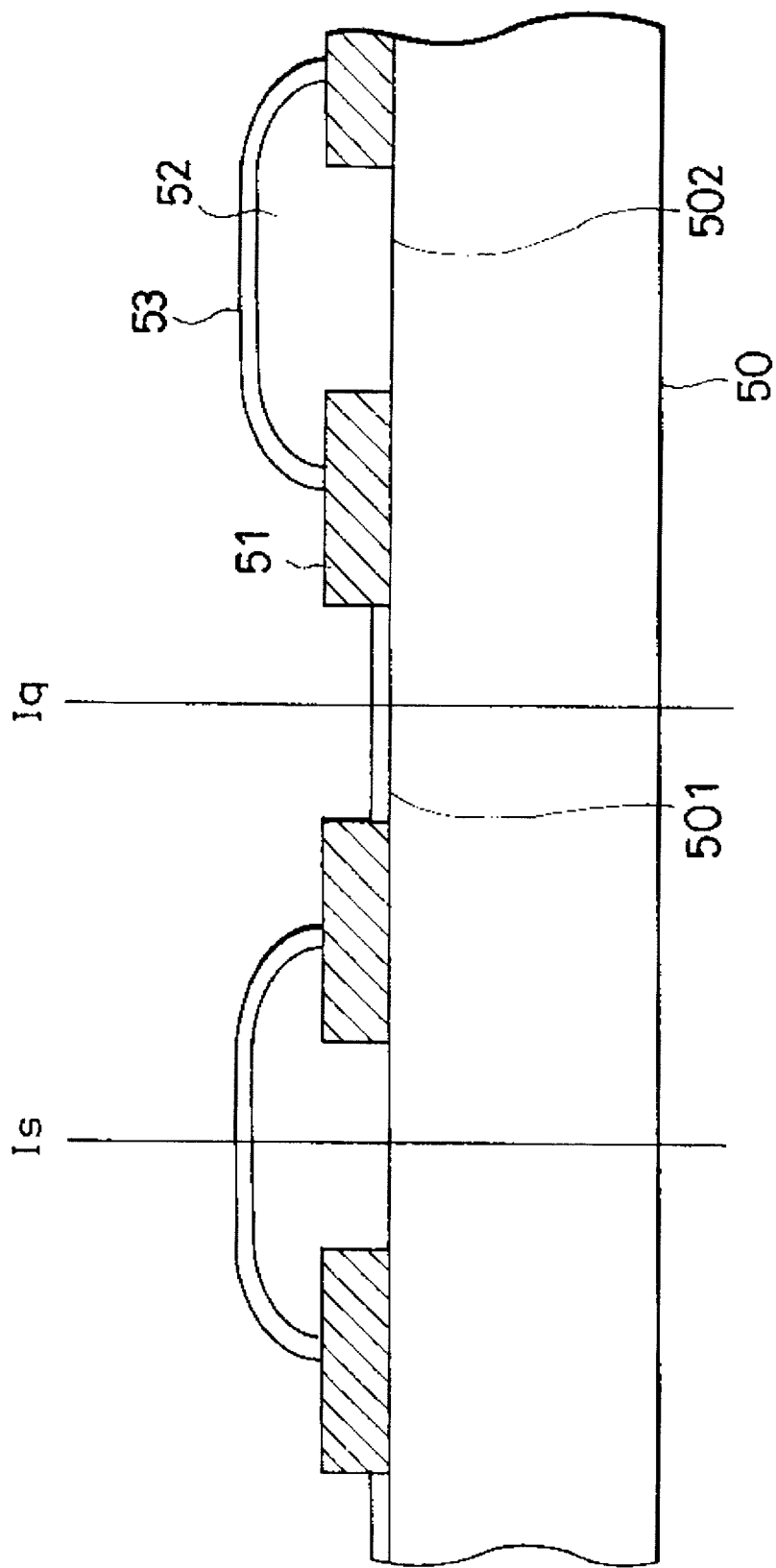
FIG. 61 is a cross section of the phase-shifting mask profile, according to the nineteenth embodiment.

FIG. 61 is a cross section of the phase-shifting mask profile, according to the nineteenth embodiment.

In the same figure, light-shielding film pattern 51 is formed on clear substrate 50. As material for clear substrate 50 and light-shielding film 51, in this embodiment, there are used the quartz for substrate 50 and chromium oxide for film 51, for example. There is formed phase shifter 52 in a region having opening portions on quartz substrate 50, where the thickness of phase shifter 52 is expressed by:

$$\lambda/2(n_s-1),$$

where $\lambda$ is exposure wavelength and $n_s$ the index of refraction of the phase shifter in the exposure wavelength. As material for phase shifter 52, there are used $SiO_2$ film or the like which is produced by the liquid deposition method, sputtering method or CVD method and so on.

Up to the above procedure, the structure therefor is similar one to the conventional practice. In addition thereto, in this embodiment, buffer 53 whose constituting material and production are identical to those for phase shifter 52, is uniformly formed onto the region including both quartz opening portion 501 and phase shifter portion 502. Then, though the buffer 53 may be formed on the light-shielding film depending on a film-forming method used, such buffer 53 that is formed on the light shielding film 51 does not cause a negative affect in the course of transcription by exposure. Film thickness h for buffer 53 which is made of the same material with the phase shifter is expressed by:

$$h=(\lambda/4n_s)\{m-n_s/(n_s-1)\}- \qquad (2)$$

where $n_s$ is the index of refraction of the shifter, $\lambda$ the exposure wavelength and m an integer.

Now, suppose that the exposure is an i-ray ($\lambda$=365 nm) and $SiO_2$ film is obtained in a manner that the phase-shifting material is formed under liquid phase, the index of refraction $n_2$ is 1.446 at the i-ray wavelength of the phase shifter. Therefore, the film thickness for phase shifter 52 is 409 nm, and the film thickness for buffer film is 11.1 nm at m=5, where the constituting material for the buffer is identical to that of the phase shifter.

In other words, in order to produce the phase-shifting mask against the i-ray by utilizing the liquid deposition method, light-shielding film pattern 51 is formed on quartz substrate 50. Thereafter, The phase shifter 52 is formed at thickness of 409 nm by employing the liquid deposition method. Thereafter, utilizing the same method, buffer 53 is formed both on quarts opening portion 501 and phase shifter portion 502, where buffer film 53 is made of the same material with phase shifter 52. The tolerance for the film thickness of buffer film 53 is within ±10% of the desired film thickness.

Figure 62:
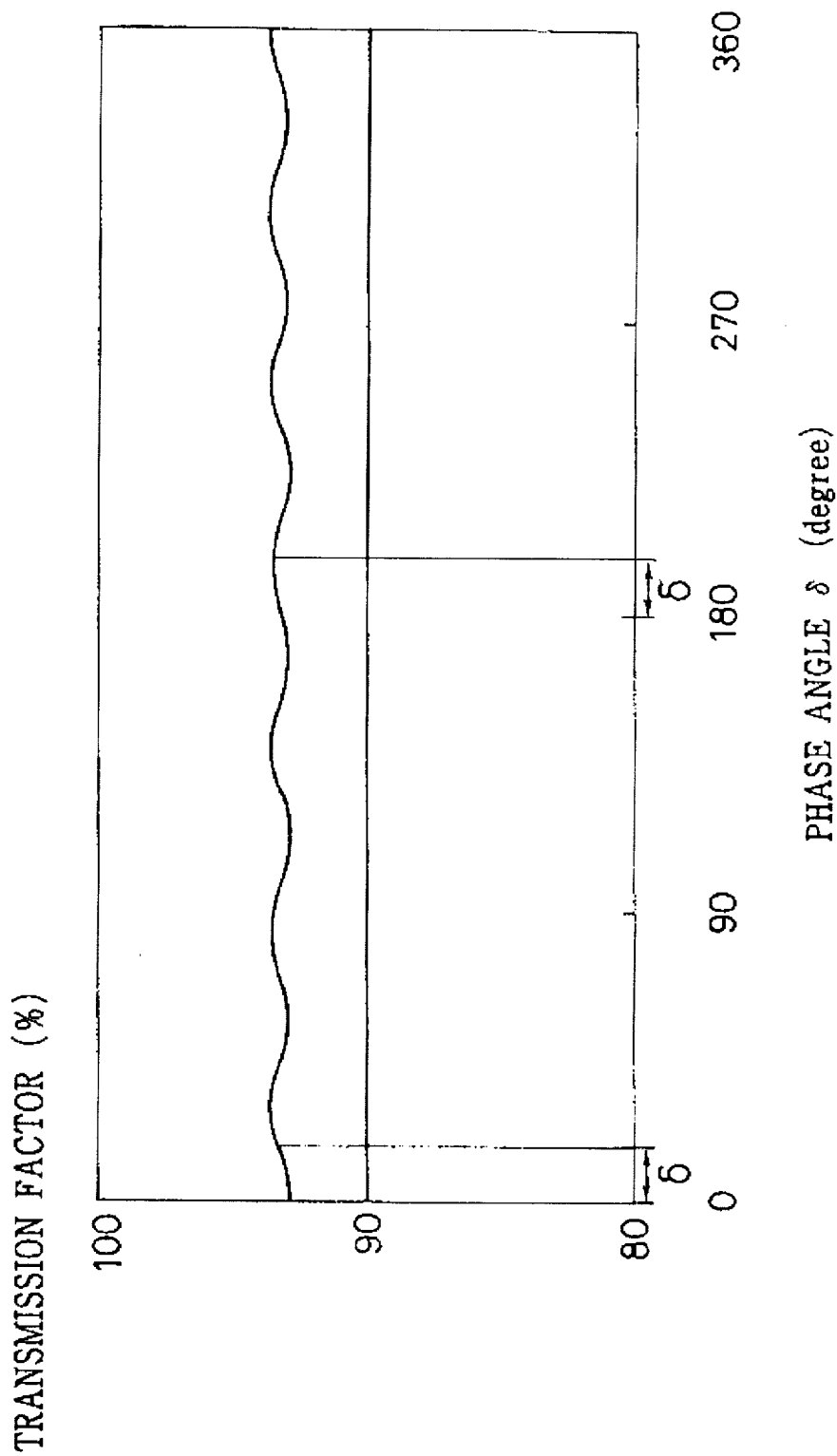
FIG. 62 is a graph showing correlation between the transmission factor (%) and phase angle (δ), according to the nineteenth embodiment.

FIG. 62 is a graph showing dependency of phase angle δ responsive to ratio $I_s$ of transmission ray against incident intensity. In the same figure, $I_s$ is 92.793% when δ=0°, whereas $I_s$ is 93.109% when δ=180°. This shows that when the method for the embodiment according to the present invention is not used, the ratio for the light transmission is increased by 0.316% compared to the light intensity transmitted through the quartz opening portion. Again, the method for the embodiment according to the present invention is that the film made of the same material with the phase shifter is uniformly formed on both the quartz opening portion and the phase shifter portion.

Referring still to FIG. 62, in order to realize that the ray intensity transmitted through the phase shifter is equal to one transmitted through the quartz opening portion and that the phase difference between the ray transmitting the phase shifter portion and the ray transmitting through the quartz opening portion is set to 180°, film thickness h corresponding to phase angle δ shall be uniformly formed on to both quartz opening portion and the phase shifter portion.

Figure 63:
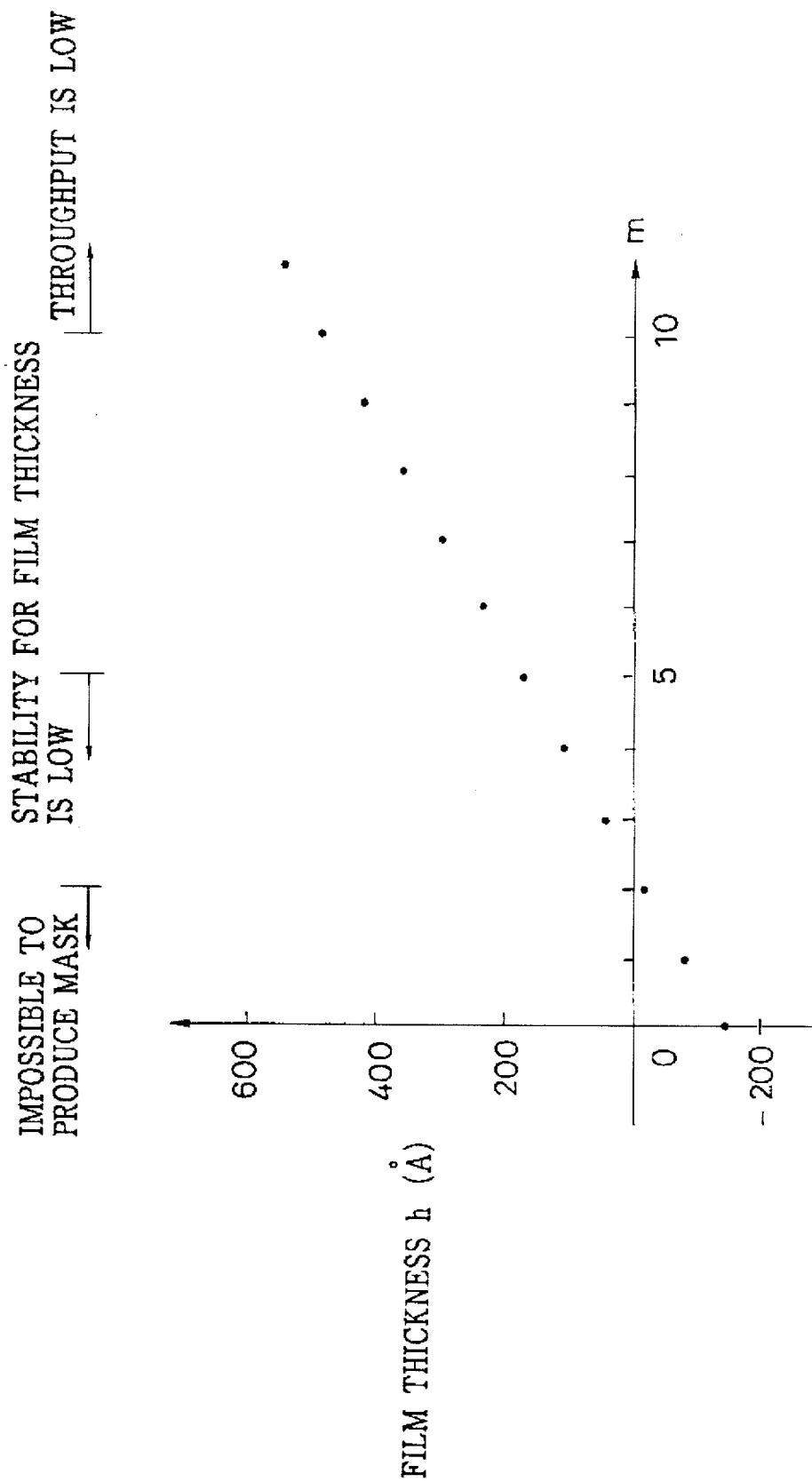
FIG. 63 is a graph showing dependency of phase angle δ responsive to ratio $I_s$ of transmission ray against incident intensity.

FIG. 63 is a graph showing the correlation between film thickness h and integer m according to this embodiment, where the exposure ray is the i-ray (λ=365 nm) and $SiO_2$ ($n_s$=1.446) serving as the material for the phase shifter is formed under the liquid phase. In the same figure, though film thickness h becomes negative depending on the value of integer m, this state indicates that mask production is impossible. Thus, integer m must be selected so that h is positive (h≧0). At the same time, film thickness is preferably as thin as possible in terms of throughput in mask production.

Referring still to FIG. 63, for example, suppose that $SiO_2$ of the phase shifter for use with the i-ray is formed under the liquid phase at film-forming rate of approximately 100 nm/h. When m=10, the film-forming time requires an extra time of approximately 12% of the normal phase-shifting production time. Moreover, when the value of h is undesirably too small, the uniform and precise film can not be made due to the fact that the time for film forming is too short. It is commonly known that when the phase shifter is formed under the liquid phase, the evenness of the film is low under the film thickness being less than 20 nm. Namely, the lower limit for the value of m can be determined by stability thereof, and such a lower limited value of m varies depending on a phase-shifting mask production process in use. In view of the above careful observation, the value of m is considered to be appropriate between 6 and 9, inclusive, when the phase-shifting mask for use with the i-ray is produced under the liquid phase.

Accordingly, by employing the nineteenth embodiment where the buffer made of the same material with the phase shifter is formed on the whole surface of the mask formed through the normal phase-shifting mask production process so as to select a proper film thickness for the material of the buffer, the light intensity transmitted through the clear substrate opening portion and the light intensity transmitted through the phase-shifting portion are made equal to each other. Notice that the value for film thickness is determined by the exposure wavelength and the index of refraction of the material used for the phase shifter. Thereby, a desired pattern is obtained so that there is caused no nonuniformity between a resolution pattern formed in the phase-shifting portion and that formed in the clear substrate opening portion.

Embodiment No. 20

Figure 64:
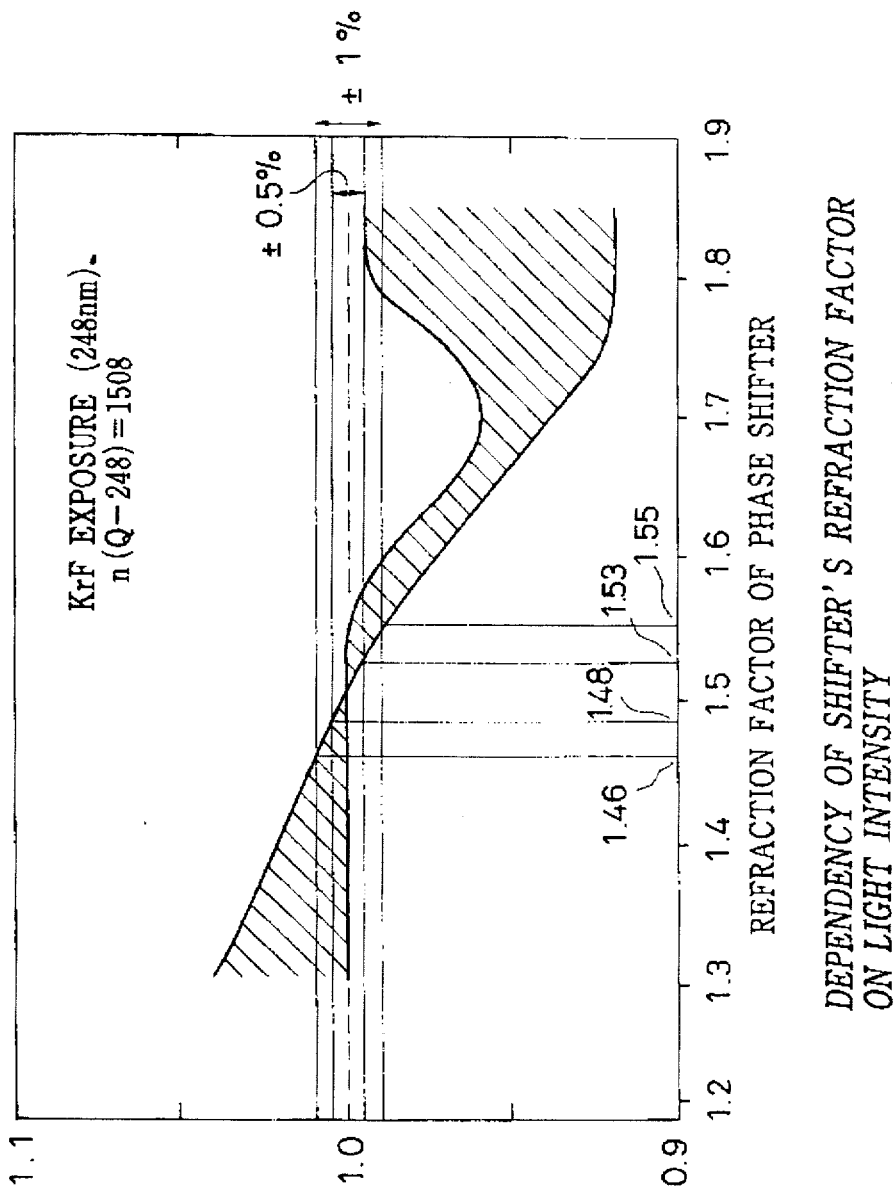
FIG. 64 is a graph to facilitate explanation as to a method for selecting the shifter material having the optimal index of refraction, according to the twentieth embodiment.

FIG. 64 is a graph to facilitate explanation as to a method for selecting the shifter material having the optimal index of refraction, according to the twentieth embodiment. In a case where there is not used a method in which the buffer whose material is same with the phase shifter is formed on both the quartz opening portion and the phase shifter portion, the index of refraction for the shifter material has to be selected so that the difference between the transmitting ray intensity at the quartz opening portion and the transmitting ray intensity at the phase shifter portion is presented within the tolerance. In other words, the appropriate shifter material having such an index of refraction has to be thus selected.

Now, suppose that the difference of the transmitted light intensity between the quartz opening portion and the phase shifter portion presents the tolerance of 1% of the light intensity at the quartz opening portion. The following equation is obtained:

$$-0.01 \leq \{(2(n_q-n_s)(1-n_s))/((n_q+n_s)(1+n_s))\}(\cos\delta+1)\}/\{1+[((n_q-n_s)^2(1-n_s)^2)/((n_q+n_s)^2(1+n_s)^2)]\cos\delta\ (2(n_q-n_s)(1-n_s))/((n_q+n_s)(1+n_s)))]\} \leq 0.01 - \quad (3)$$

where $n_q$ indicates the index of refraction the clear substrate.

Moreover, if tolerance for a dislocated value for the phase-shifter film thickness of 180° is assumed to be ±10 %, the phase-shifting angle is such that 170°≦δ≦190°.—(4).

FIG. 64 is a graph showing dependency of the index of refraction $n_s$ of the phase shifter for $I_s I_q$ when a KrF eximer laser is utilized. The values of $I_s I_q$ which satisfy equation (4) is hatched in the figure. Now, when the difference between the transmitted light intensity at quartz opening portion and one at the phase shifter shifter portion is within 1% of light intensity of the quartz opening portion, the shifter's refraction index need satisfy the following relation:

$$1.46 \leq n_s \leq 1.55 - \quad (5)$$

If the tolerance for such the difference is severe 0.05%, equation (6) need to be satisfied:

$$-0.005 \leq \{(2(nq-ns)(1-ns))/((nq+ns)(1+ns))\}(\cos\delta+1)\}/\{1+[((nq-ns)^2(1-ns)^2)/((nq+ns)^2(1+ns)^2)-\cos\delta(2(nq-ns)(1-ns))/((nq+ns)(1+ns))]\} \leq 0.005 \quad (6)$$

If the dislocation value from the phase shifter of 180° is ±10 degrees, equation (4) need be established.

FIG. 64 is a graph showing dependency of the index of refraction $n_s$ of the phase shifter for $I_s/I_q$ when the KrF laser is utilized.

The values of $I_s/I_q$ which satisfy the following equation (6) is hatched In the figure.

$$h=(\lambda/4n_s)\{m-(n_s/(n_s-1)-\quad (7)$$

$$m=1, 2, 3, \ldots$$

Now, when the difference between transmitted light intensity at the quartz opening portion and one at the phase shifter is within 1% of the light intensity of the quartz opening portion, the index of refraction for the shifter need satisfy relationship expressed by following equation (8)

$$1.48 \leq n_s \leq 1.53 \tag{8}$$

Figure 65:
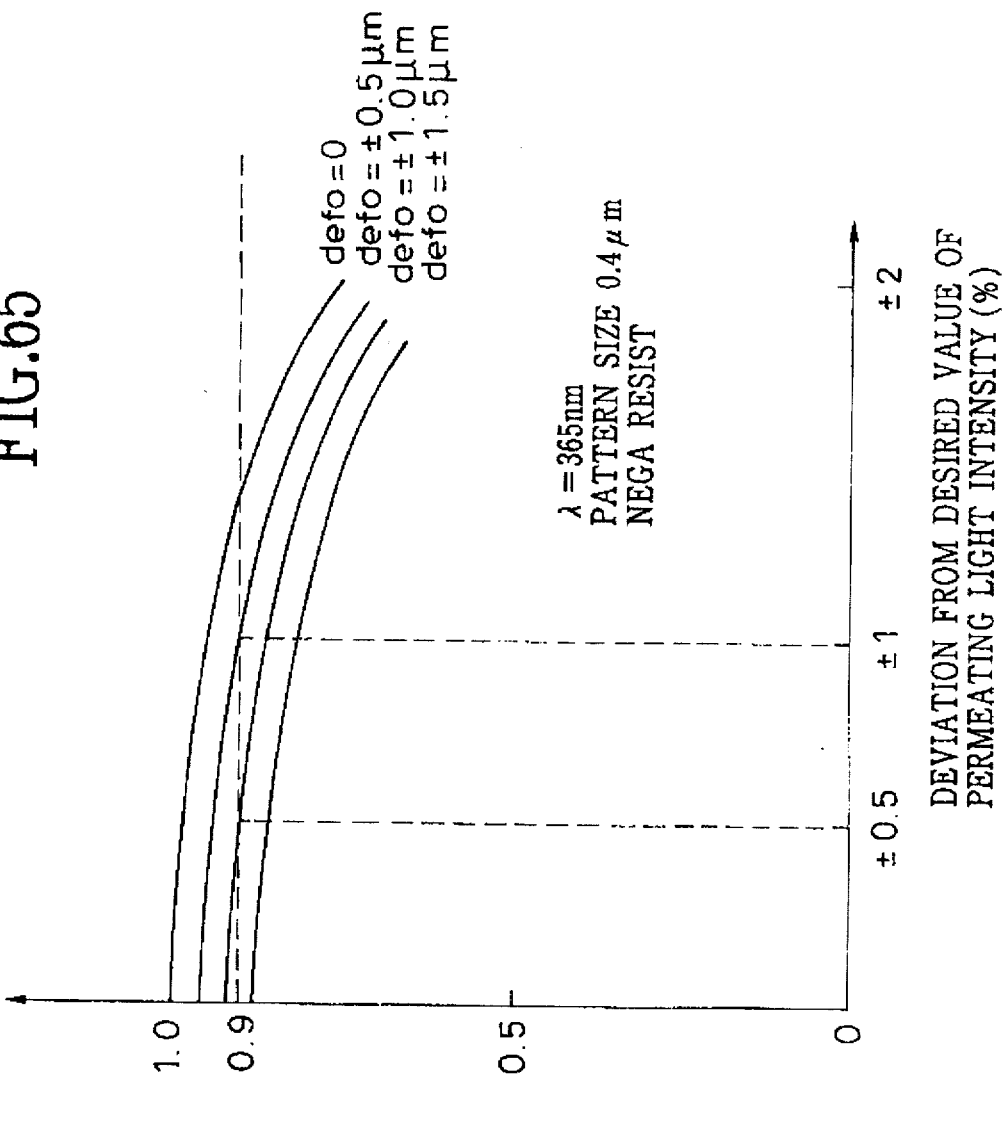
FIG. 65 is a graph showing deviation from desired value of transmitted light intensity.

FIG. 64 is a graph showing dependency of the dislocation from desired values of transmitted light intensity of the resist. Referring to FIG. 64, there is described as to the fact that the tolerance for the difference between the transmitted light intensity at the quartz opening portion and one at the phase shifter portion is within +1% of the light intensity at the quartz opening portion, further preferably, ±0.5%. FIG. 65 shows the dependency of the dislocated value of the resist from the desired transmitted light intensity. Referring to FIG. 65, in order to obtain depth of focus of more than ±0.5 μm which is required to produce a prototype device, the tolerance for the dislocated value of the transmitted light intensity from the desired value is ±1%. Referring still to FIG. 65, in order to obtain the depth of focus of more than ±1.0 μm, the tolerance therefor need be ±0.5%, which is required to realize a commercially available device.

FIG. 66 is a graph showing the relationship between various phase assignments in terms of defocus value and contrast, similar to FIG. 49.

Figure 67:
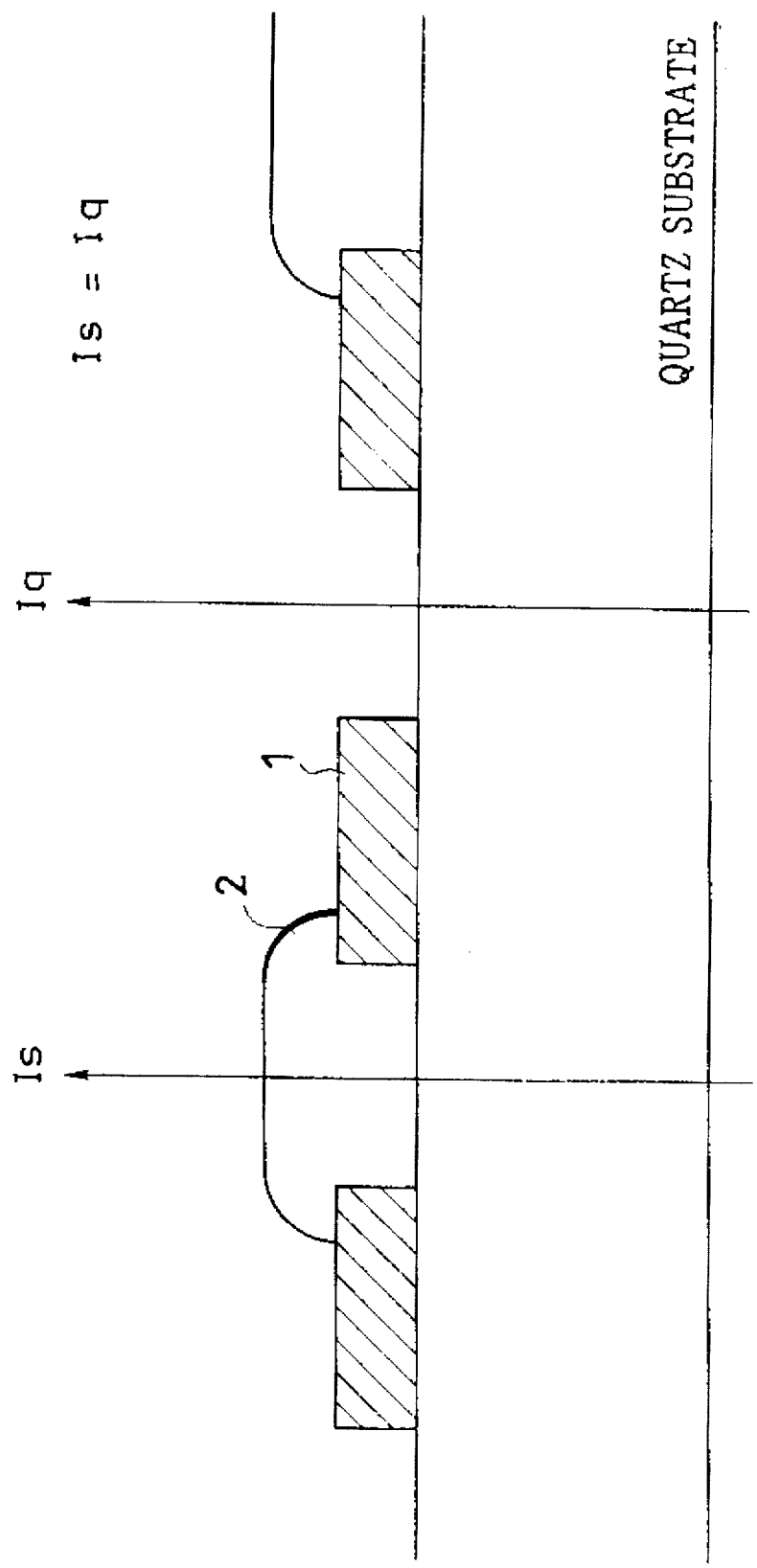
FIG. 67 illustrates $I_q$ is not equal to $I_s$, where $I_q$ represents light intensity of ray transmitted through the substrate opening portion and $I_s$ denotes light intensity of ray transmitted through the phase shifter.

FIG. 67 illustrates $I_q$ is not equal to $I_s$, where $I_q$ represents light intensity of ray transmitted through the substrate opening portion and $I_s$ denotes light intensity of ray transmitted through the phase shifter.

Figure 68:
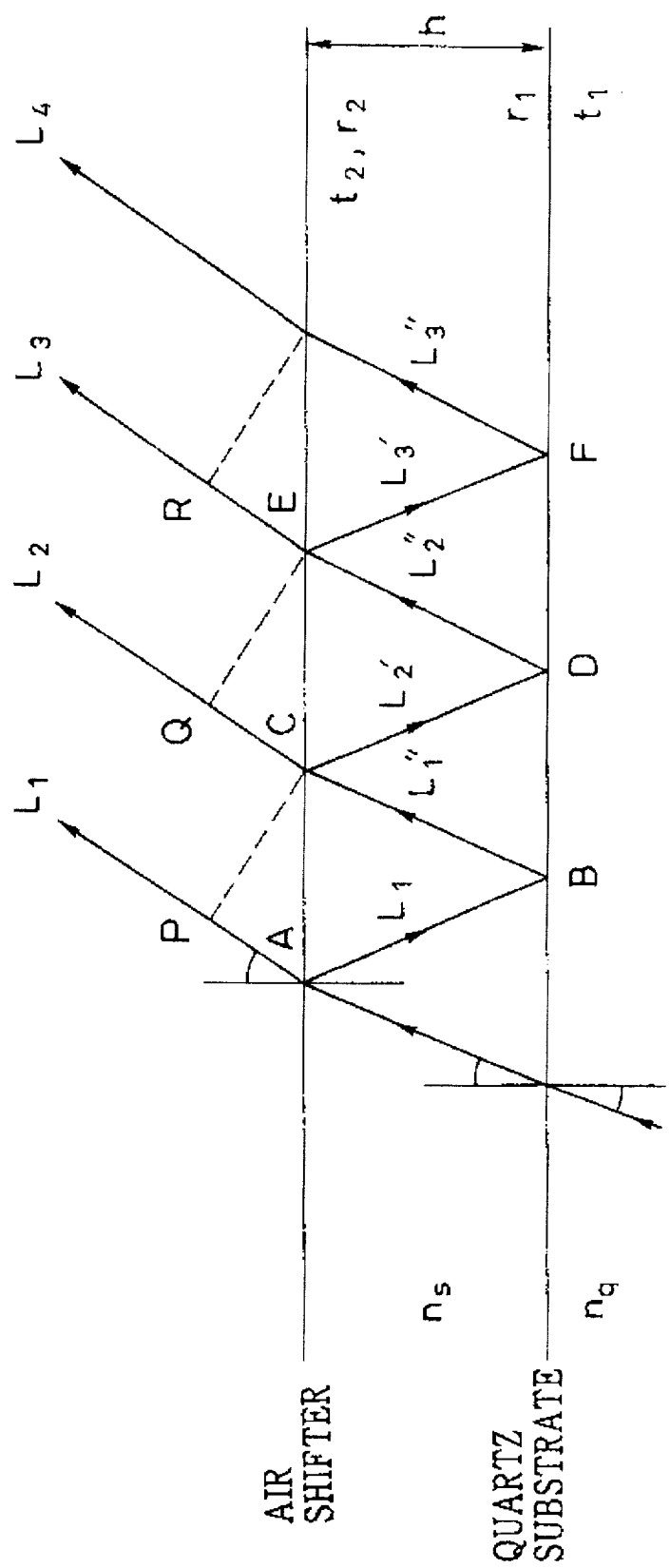
FIG. 68 illustrates a multiple reflection within the shifter in two-layer (clear substrate and shifter) structure.

FIG. 68 illustrates a multiple reflection within the shifter in two-layer (clear substrate and shifter) structure. When a film whose material is same with the phase shifter is formed over the entire surface where the thickness therefor satisfies equation $(\lambda/4n_s)\{m-(n_s/(n_s-i))\}$ (where $n_s$ is the index of refraction of the phase shifter at an exposure wavelength and m is a positive integer), a multiple reflection effect becomes same at the substrate opening portion and the phase shifter portion. As a result thereof, each transmitted light intensity becomes equal.

Accordingly, the embodiment will serve well in a case where the method is not used which the same sort of film as in the phase shifter is formed on both the clear substrate opening portion and the phase shifter portion. The index of refraction for the phase shifter material is selected so that the difference between both the transmitted light intensity at the phase shifter and the transmitted light intensity at the quartz opening portion is within the tolerance. Thereby, the desired pattern is produced without causing the nonuniformity in the resolution pattern produced by the phase shifter portion and the clear substrate opening portion.

In summary, according to a feature of the present invention, the shifters are assigned responsive to the shortest distance in the clear area, so that unnecessary shifter-arrangement can be avoided, thus significantly improving the circuit designability for the photomask.

According to another feature of the present invention, there are provided the automatic shifter-arranging function and the automatic verifying mechanism against the already-arranged masks. Thereby, there is presented information as to the location where the shifter-assigning is not possible and is also presented information on whether or not there exists an error in the shifter arrangement and on reference information in order to modify such an error.

According to still another feature of the present invention, when input is the layout data having the hierarchical structure, the automatic shifter arrangement and automatic verification therefor are performed while keeping the original hierarchical structure. As a result thereof, the possible increase in data caused by developing the hierarchical structure as well as the increase in data processing time thereby can be avoided.

According to still another feature of the present invention, when the phase-shifting arrangement is possible without causing a contradictory spot in the cell to be processed as a result of the automatic shifter arrangement or automatic verifying process, the recognition flag given to such a cell having no contradictory spot therein to the effect that the shifter is already assigned. Thereby, there is no more need to process the cell plural times unnecessarily, thus improving the efficiency in the automatic shifter arrangement as well as the automatic verification process therefor.

According to still another feature of the invention, the shifter is arranged reflecting upon a weighted geometric assignment of the shapes, so that there is obtained a highly reliable photomask. Moreover, the spot in which the modification is necessary for the layout is specified, so that the designing operation for the phase-shifting mask is utmost effective.

According to still another feature of the invention, the phase-shifting technique is easily applied to the opening portions where more than three masks are neighboring to one another, so that the resolution therefor is improved in the partial or entire region of the wafer including the above opening portions. Moreover, the phase difference is set to 180° for the inter-opening portions where the facing sides thereof are the longest among the neighboring patterns, while the phase difference is set to 360°/m (m=3, 4, 5, ...) for other inter-opening portions having shorter facing sides. As a result thereof, there can be obtained an exposure with a high resolution.

Moreover, in the layout pattern where more than three openings are neighboring to one another, the phase-shifting degrees of 360°/m (m=3, 4, 5, ...) besides 0° and 180° is used, so that phase for the opening portions neighboring at a distance less than the threshold is differentiated. Then, the phase shifter arrangement is facilitated that the length of sides among neighboring opening portions is maximum realizing 180° phase difference. Thus, realized is the designing technique for phase-shifting mask having significantly high resolution therefor and significantly great degree of freedom of designability therefor.

According to still another feature of the present invention, the phase shifters are arranged in combination of four phases of 0°, 90°, 180° and 270° so that the relative phase difference between light transmitted through the neighboring patterns is set to 90°. Thereby, there can be obtained a phase-shifting mask in which the designing restraints for the mask is minimized while the sufficient resolution in the phase-shifting technique maintained.

Moreover, according to still another feature of the invention, the buffer film made of the same material with the phase shifter is formed both on the transmission portion and the shifter portion. Thereby, by setting the thickness of the buffer film to an optimal value, the light intensity transmitted through the substrate opening portion and the light intensity transmitted through the phase shifter are made close to each other. As a result thereof, there can be obtained a phase-shifting mask in which the uniformity of the resolution pattern made in both the opening portion of the phase shifter portion and the opening portion of the clear substrate is significantly improved.

Besides those already mentioned above, many modifications and variations of the above embodiments may be made without departing from the novel and advantageous features of the present invention. Accordingly, all such modifications and variations are Intended to be included within the scope of the appended claims.

What is claimed is:

1. A method for designing a phase-shifting mask in a manner that a phase shifter of the phase-shifting mask is arranged so that a phase difference between light transmitted through clear areas with the phase shifter and light transmitted through clear areas without the phase shifter is set to 180°, clear areas and opaque areas existing on the phase-shifting mask, the method comprising the steps of:

defining a threshold, said threshold being equal to a minimum distance between two adjacent clear areas in a manner that the threshold falls within a range which is possible to resolve using the phase-shifting mask;

measuring a distance between neighboring clear areas;

storing an adjacent relationship, said adjacent relationship including data indicative of pairs of adjacent clear areas whose distance is less than the threshold; and automatically placing the phase shifter on one of the pairs of adjacent clear areas so that mutually neighboring clear areas within the threshold have an opposite phase to each other, wherein the automatically placing step includes the step of tracing the stored data.

2. The method of claim 1, further comprising the steps of:

attaching a sign to a cell, said cell including a group of the clear areas including at least one clear area such that the phase shifter therefor is assigned when a layout data having a hierarchical structure is input, the hierarchical structure including a plurality of upper cells and/or clear areas, each of the upper cells having lower sub-cells and/or clear areas, each of the lower sub-cells further having lower sub-cells which further include lower sub-cells and/or clear areas; and selecting a cell in the lowest level of the hierarchical structure, as the cell to be processed, among cells not having the sign attached thereto.

3. The method of claim 1, wherein the step of automatically placing the phase shifter includes the steps of:

inputting data of a cell, said cell including a group of the clear areas including at least one clear area which is selected from a hierarchical structure, the hierarchical structure including a plurality of upper cells and/or clear areas, each of the upper cells having lower sub-cells and/or clear areas, each of the lower sub-cells further having lower sub-cells which further include lower subcells and/or clear areas; and classifying the data into a set of groups in which a plurality of clear areas are adjacent at a distance less than the threshold;

determining phases for the clear areas in every group that does not have any lower level sub-cells; and where there exists a group having lower sub-cells therein, determining phases for clear areas which do not belong to the lower-level groups when there is a lower-level group defined in the lower level sub-cells, and thereafter determining relative phases between lower-level groups and between the lower-level group and the clear areas not belonging to the lower-level group;

giving the set of elements in the group information of cell identification, group recognizing sign and phase values, if the phase are given appropriately thereto; and presenting contradiction spots where an appropriate phase assignment can not be made.

4. The method of claim 1, wherein, when there is at least one clear area whose phase is already assigned, the step of automatically placing the phase shifter includes the steps of:

assigning phases to the clear areas, starting from a clear area having closer adjacent relationship with the clear area whose phase is already assigned.

5. The method of claim 1, further comprising the steps of:

obtaining the stored adjacent relationship;

expressing the obtained relationship in the form of a graph where each adjacent relationship is weighted, the graph being such that a node described therein represents a clear area in a layout and that the nodes are connected by line segments when the shapes are adjacent within the threshold;

assigning an identical phase for a pair of nodes which is contained in a closed loop with an odd number of nodes, starting from the relationship having a heaviest weight; and providing opposite phases for other pairs of nodes than where the identical phase is assigned.

6. A method for designing a phase-shifting mask from design data, the method comprising the steps of:

measuring a shortest distance between shapes of the clear areas, in the design data;

defining a pair of the shapes to be adjacent when the shortest distance therebetween is less than a predetermined threshold, and then storing the defined pairs of shapes;

classifying all shapes of the clear areas into groups based on the above adjacent relationship;

expressing the adjacent relationship in the form of a simplified line-segment-and-node graph and observing whether or not there exists an odd-numbered loop therein for each group; and, for the group whose expressing graph contains at lest one odd-numbered loop, arranging the phase shifters, by utilizing phases of 0°, 180° and an integral multiple of 360°/m (where m is a positive integer starting from three onward), in a manner to satisfy the following conditions:

a first condition where the phase differs in between any pair of given shapes neighboring at a distance less than the threshold, and a second condition where minimum becomes a total sum of length of shape sides facing at the distance less than the threshold and at a phase difference therebetween being other than 180°, wherein, for the group whose expressing graph contains no odd-numbered loop, the method comprises the step of: arranging the phase shifter on one of the adjacent shapes so that mutually neighboring clear areas within the threshold have an opposite phase to each other.

7. A method for designing a phase-shifting mask, the method comprising the steps of:

arranging a phase shifter so that a phase difference between neighboring clear areas is set to approximately 180°;

setting to approximately 180° a relative phase of opening areas enclosed by a pair of the clear areas defined in the above step, when the opening areas enclosed by the pair of clear areas is parallel to the pair of clear areas, and the number of opening areas enclosed by the pair of clear areas are even numbered in a cross sectional area vertical to the pair of clear areas;

setting to approximately 180° the relative phase between the pair of opening areas and the enclosed opening areas;

assigning approximately 180° for a relative phase of the enclosed opening areas when the number thereof is odd numbered; and setting to approximately 180° or approximately 90° the relative phase between the pair of clear areas and the enclosed opening areas after completing the previous steps.

8. The method of claim 7 where the number of enclosed opening area becomes both even and odd depending on cross sectional positions applied, comprising the steps of:

setting to approximately 180° the relative phase for the opening areas neighboring in an even-number area; and assigning either 90° or 180° to the relative phase for the opening areas neighboring in an odd-number area that is not included In the even-numbered area.

9. The method of claim 8, further comprising the steps of:

changing the relative phase where 0° is assigned, to 90°, when a phase between neighboring opening area is 0° in the odd-number area as a result of phase determination in the even-number area.

10. A method for designing a phase-shifting mask, the method comprising the steps of:

extracting a first pattern group of clear area where a decimal part lies between 0.44 and 0.55, the decimal part is of a quotient obtained from dividing an amour of phase difference by 180°;

supplying a first shape data expressed by all patterns included in the first pattern group;

extracting a second pattern group of clear area where the decimal part is less than 0.94, the decimal part is of a quotient obtained from dividing the amount of phase difference by 180°; and supplying a second shape data expressed by all patterns included in the second pattern group.

* * * * *